US011569448B2

(12) United States Patent
Shin et al.

(10) Patent No.: US 11,569,448 B2
(45) Date of Patent: Jan. 31, 2023

(54) CROSS-LINKABLE ARYLAMINE-BASED COMPOUND, POLYMER OBTAINED THEREFROM, LIGHT-EMITTING DEVICE INCLUDING THE POLYMER, AND ELECTRONIC APPARATUS INCLUDING THE LIGHT-EMITTING DEVICE

(71) Applicant: Samsung Display Co., Ltd., Yongin-si (KR)

(72) Inventors: Dongwoo Shin, Yongin-si (KR); Dukki Kim, Yongin-si (KR); Sehun Kim, Yongin-si (KR); Jaeyun Kim, Yongin-si (KR); Jongwon Park, Yongin-si (KR); Seungmook Lee, Yongin-si (KR); Jaekook Ha, Yongin-si (KR); Naoyuki Ito, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 834 days.

(21) Appl. No.: 16/277,758

(22) Filed: Feb. 15, 2019

(65) Prior Publication Data

US 2019/0259956 A1 Aug. 22, 2019

(30) Foreign Application Priority Data

Feb. 19, 2018 (KR) ........................ 10-2018-0019525
Feb. 19, 2018 (KR) ........................ 10-2018-0019526
Jan. 28, 2019 (KR) ........................ 10-2019-0010665

(51) Int. Cl.

| | |
|---|---|
| ***H01L 51/54*** | (2006.01) |
| ***H01L 51/00*** | (2006.01) |
| ***H01L 51/05*** | (2006.01) |
| ***H01L 51/50*** | (2006.01) |
| ***C08F 112/34*** | (2006.01) |

(52) U.S. Cl.

CPC ........ *H01L 51/0035* (2013.01); *C08F 112/34* (2013.01); *H01L 51/0059* (2013.01); *H01L 51/0094* (2013.01); *H01L 51/055* (2013.01); *H01L 51/5056* (2013.01)

(58) Field of Classification Search

None

See application file for complete search history.

(56) References Cited

U.S. PATENT DOCUMENTS

| | | | |
|---|---|---|---|
| 6,853,133 B2 | 2/2005 | Liao et al. | |
| 9,028,980 B2 | 5/2015 | Abe et al. | |
| 2002/0058155 A1* | 5/2002 | Guofang | H01L 51/0061 428/690 |
| 2007/0232782 A1 | 10/2007 | Radu et al. | |
| 2009/0009061 A1 | 1/2009 | Shinohara et al. | |
| 2013/0248848 A1 | 9/2013 | Radu et al. | |
| 2014/0326975 A1 | 11/2014 | Tsurutani et al. | |
| 2016/0013417 A1 | 1/2016 | Oyamada et al. | |
| 2017/0077462 A1 | 3/2017 | Oyamada et al. | |
| 2018/0030342 A1* | 2/2018 | Ishow | C09K 11/06 |

FOREIGN PATENT DOCUMENTS

| | | | | |
|---|---|---|---|---|
| CN | 103314463 | A | | 9/2013 |
| JP | 2007214364 | A | * | 8/2007 |
| JP | 2012-7021 | A | | 1/2012 |
| KR | 10-2004-0095743 | A | | 11/2004 |
| KR | 10-2007-0028592 | A | | 3/2007 |
| KR | 10-2012-0052063 | A | | 5/2012 |
| KR | 10-2012-0052765 | A | | 5/2012 |
| KR | 10-2012-0054938 | A | | 5/2012 |
| KR | 10-2012-0061503 | A | | 6/2012 |
| KR | 10-2012-0066149 | A | | 6/2012 |
| KR | 10-2014-0043049 | A | | 4/2014 |
| KR | 10-2015-0034379 | A | | 4/2015 |
| WO | 2012/002400 | A1 | | 1/2021 |

OTHER PUBLICATIONS

Machine translation of KR2012-0052063 (Year: 2012).*
Machine translation of JP2007-214364. (Year: 2007).*
Extended European Search Report for corresponding European Patent Application No. 18248288.5, dated Jul. 5, 2019, 9 pages.
Song, Yabin et al.; New semiconductors based on triphenylamine with macrocyclic architecture: synthesis, properties and applications in OFETs†, Journal of Materials Chemistry, vol. 17, No. 42, Jan. 1, 2007, 9 pages.
Xu, Min et al.; "Cyclic arylamines as hole transport materials with high thermal stability for efficient electroluminescence"; ScienceDirect; Thin Solid Films; vol. 516; 2008; pp. 7720-7726.
Office action issued in corresponding Application No. CN Patent Application No. 201910123026.8, dated Oct. 26, 2022, 13pp.

* cited by examiner

*Primary Examiner* — Andrew K Bohaty
(74) *Attorney, Agent, or Firm* — Lewis Roca Rothgerber Christie LLP

(57) ABSTRACT

Provided is a cross-linkable arylamine-based compound represented by Formula 1a or 1b, a polymer obtained therefrom, a light-emitting device including the polymer, and an electronic apparatus including the light-emitting device. The light-emitting device includes a first electrode; a second electrode facing the first electrode; and an intermediate layer between the first electrode and the second electrode and comprising an emission layer, wherein the intermediate layer includes at least one of the arylamine-based polymer formed by cross-linking a cross-linkable arylamine-based compound represented by Formula 1a or 1b.

27 Claims, 3 Drawing Sheets

CROSS-LINKABLE ARYLAMINE-BASED COMPOUND, POLYMER OBTAINED THEREFROM, LIGHT-EMITTING DEVICE INCLUDING THE POLYMER, AND ELECTRONIC APPARATUS INCLUDING THE LIGHT-EMITTING DEVICE

CROSS-REFERENCE TO RELATED APPLICATIONS

This application claims the benefits of Korean Patent Application Nos. 10-2018-0019525 and 10-2018-0019526, both filed on Feb. 19, 2018, in the Korean Intellectual Property Office, and Korean Patent Application No. 10-2019-0010665 filed on Jan. 28, 2019, in the Korean Intellectual Property Office, the entire contents of each of which are incorporated herein by reference.

BACKGROUND

1. Field

One or more embodiments of the present disclosure relate to a cross-linkable arylamine-based compound, a polymer obtained therefrom, a light-emitting device including the polymer, and an electronic apparatus including the light-emitting device.

2. Description of the Related Art

A light-emitting device is a device having a characteristic in which electric energy is converted into light energy. Examples of such a light-emitting device include an organic light-emitting device including an organic material in an emission layer, a quantum dot-light-emitting device including quantum dots in an emission layer, and the like.

The light-emitting device may include a first electrode on a substrate, and a hole transport region, an emission layer, an electron transport region, and a second electrode, which are sequentially on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. Then, the excitons are transitioned (e.g., the excitons transition or relax) from an excited state to a ground state, thereby generating light.

In one embodiment, an organic light-emitting device is a self-emission device that has wide viewing angles, high contrast ratios, short response times, and excellent characteristics in terms of brightness, driving voltage, and response speed, and produces full-color images.

In one or more embodiments, a quantum-dot light-emitting device has high color purity and high luminescence efficiency and produces full-color images.

SUMMARY

Aspects of embodiments of the present disclosure provide a cross-linkable arylamine-based compound, a polymer obtained therefrom, a light-emitting device including the polymer, and an electronic apparatus including the light-emitting device.

Additional aspects of embodiments will be set forth in part in the description which follows and, in part, will be apparent from the description, or may be learned by practice of the presented embodiments.

An aspect of an embodiment provides a cross-linkable arylamine-based compound represented by Formula 1a or 1b:

Formula 1a $$A_1—(B)_p—A_2$$

Formula 1-1

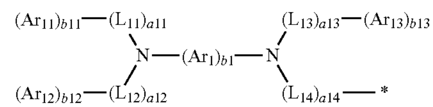

Formula 1b

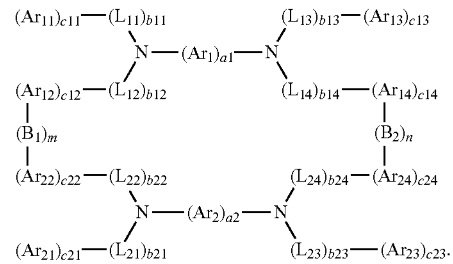

In Formula 1a, $A_1$ and $A_2$ may each be a group represented by Formula 1-1, $A_1$ and $A_2$ may be identical to or different from each other, in Formula 1a, B may be selected from a substituted or unsubstituted $C_5$-$C_{60}$ carbocyclic group, a substituted or unsubstituted $C_1$-$C_{60}$ heterocyclic group, and *'—Si($Q_{41}$)($Q_{42}$)-*", p may be an integer of 1 to 10, and in Formula 1-1, * indicates a binding site to $(B)_p$ in Formula 1a, in Formula 1-1, $Ar_1$ may be selected from a substituted or unsubstituted $C_5$-$C_{60}$ carbocyclic group and a substituted or unsubstituted $C_1$-$C_{60}$ heterocyclic group, in Formula 1-1, b1 may be an integer of four or more, and four or more $Ar_1$(s) may be identical to or different from each other, in Formula 1-1, $L_{11}$ to $L_{14}$ may each independently be a substituted or unsubstituted $C_5$-$C_{60}$ carbocyclic group or a substituted or unsubstituted $C_1$-$C_{60}$ heterocyclic group, in Formula 1-1, a11 to a14 may each independently be 0, 1, 2, 3, or 4, in Formula 1-1, when a11 is 0, *'-$(L_{11})_{a11}$-*" may be a single bond, when a12 is 0, *'-$(L_{12})_{a12}$-*" may be a single bond, when a13 is 0, *'-$(L_{13})_{a13}$-*" may be a single bond, when a14 is 0, *'-$(L_{14})_{a14}$-*" may be a single bond, when a11 is two or more, two or more $L_{11}$(s) may be identical to or different from each other, when a12 is two or more, two or more $L_{12}$(s) may be identical to or different from each other, when a13 is two or more, two or more $L_{13}$(s) may be identical to or different from each other, and when a14 is two or more, two or more $L_{14}$(s) may be identical to or different from each other, in Formula 1-1, $Ar_{11}$ to $Ar_{13}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $Ar_{11}$ to $Ar_{13}$ is substituted with a cross-linkable group, in Formula 1-1, b11 to b13 may each independently be 1, 2, 3, 4, or 5, wherein, when b11 is two or more, two or more $Ar_{11}$(s) may be identical to or different from each other, when b12 is two or more, two or more $Ar_{12}$(s) may be identical to or different from each other, and when b13 is two or more, two or more $Ar_{13}$(s) may be identical to or different from each other, in Formula 1b, $Ar_1$ and $Ar_2$ may each independently be a substituted or unsubstituted $C_5$-$C_{60}$ carbocyclic group or a substituted or unsubstituted $C_1$-$C_{60}$ heterocyclic group, wherein $Ar_1$ and $Ar_2$ may be identical to or different from each other, in Formula 1b, a1 and a2 may each independently be an integer of 1 to 5, wherein, when a1 is two or more, two or more $Ar_1$(s) may be identical to or different from each other, and when a2 is two or more, two or more $Ar_2$(s) may be identical to or different from each other, in Formula 1b, $L_{11}$ to $L_{14}$ and $L_{21}$ to $L_{24}$ may each independently be a substituted or unsubstituted $C_5$-$C_{60}$ carbocyclic group or a substituted or unsubstituted $C_1$-$C_{60}$ heterocyclic group, in Formula 1b, b11 to b14 and b21 to b24 may each independently be an integer of 0 to 3, wherein, when b11 is 0, $*\text{-}(L_{11})_{b11}\text{-}*'$ may be a single bond, when b12 is 0, $*\text{-}(L_{12})_{b12}\text{-}*'$ may be a single bond, when b13 is 0, $*\text{-}(L_{13})_{b13}\text{-}*'$ may be a single bond, when b14 is 0, $*\text{-}(L_{14})_{b14}\text{-}*'$ may be a single bond, when b21 is 0, $*\text{-}(L_{21})_{b21}\text{-}*'$ may be a single bond, when b22 is 0, $*\text{-}(L_{22})_{b22}\text{-}*'$ may be a single bond, when b23 is 0, $*\text{-}(L_{23})_{b23}\text{-}*'$ may be a single bond, when b24 is 0, $*\text{-}(L_{24})_{b24}\text{-}*'$ may be a single bond, when b11 is two or more, two or more $L_{11}$(s) may be identical to or different from each other, when b12 is two or more, two or more $L_{12}$(s) may be identical to or different from each other, when b13 is two or more, two or more $L_{13}$(s) may be identical to or different from each other, when b14 is two or more, two or more $L_{14}$(s) may be identical to or different from each other, when b21 is two or more, two or more $L_{21}$(s) may be identical to or different from each other, when b22 is two or more, two or more $L_{22}$(s) may be identical to or different from each other, when b23 is two or more, two or more $L_{23}$(s) may be identical to or different from each other, and when b24 is two or more, two or more $L_{24}$(s) may be identical to or different from each other, in Formula 1b, $B_1$ and $B_2$ may each independently be selected from a single bond, a substituted or unsubstituted $C_1$-$C_{20}$ alkylene group, a substituted or unsubstituted $C_2$-$C_{20}$ alkenylene group, and a substituted or unsubstituted $C_2$-$C_{20}$ alkynylene group, in Formula 1b, m and n may each independently be an integer of 1 to 3, wherein, when m is two or more, two or more $B_1$(s) may be identical to or different from each other, and when n is two or more, two or more $B_2$(s) may be identical to or different from each other, in Formula 1b, $Ar_{11}$, $Ar_{13}$, $Ar_{21}$, and $Ar_{23}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, in Formula 1b, $Ar_{12}$, $Ar_{14}$, $Ar_{22}$, and $Ar_{24}$ may each independently be selected from a single bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, in Formula 1b, c11 to c14 and c21 to c24 may each independently be an integer of 1 to 5, wherein, when c11 is two or more, two or more $Ar_{11}$(s) may be identical to or different from each other, when c12 is two or more, two or more $Ar_{12}$(s) may be identical to or different from each other, when c13 is two or more, two or more $Ar_{13}$(s) may be identical to or different from each other, when c14 is two or more, two or more $Ar_{14}$(s) may be identical to or different from each other, when c21 is two or more, two or more $Ar_{21}$(s) may be identical to or different from each other, when c22 is two or more, two or more $Ar_{22}$(s) may be identical to or different from each other, when c23 is two or more, two or more $Ar_{23}$(s) may be identical to or different from each other, and when c24 is two or more, two or more $Ar_{24}$(s) may be identical to or different from each other, in Formula 1b, at least one substituent in $Ar_1$, $Ar_2$, $Ar_{11}$ to $Ar_{14}$, and $Ar_{21}$ to $Ar_{24}$ may include a cross-linkable group,

*' and *" each indicate a binding site to a neighboring atom, $Q_{41}$ and $Q_{42}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

Another aspect of an embodiment provides an arylamine-based polymer including a repeating unit represented by Formula 11 or formed by cross-linking a cross-linkable arylamine-based compound represented by Formula 1b:

Formula 11

$$*'\text{—}\left[A_{11}\text{—}(B)_p\text{—}A_{12}\right]\text{—}*''$$

Formula 11-1

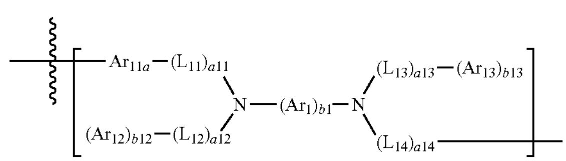

Formula 11-2

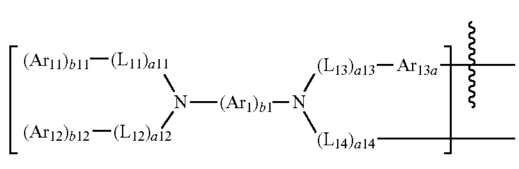

-continued

Formula 1b

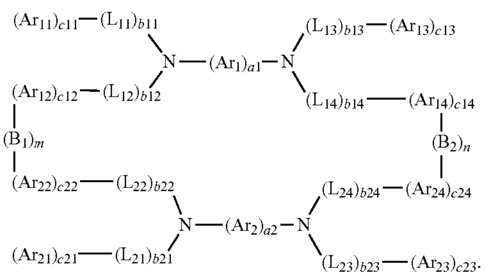

In Formula 11, $A_{11}$ and $A_{12}$ may each independently be selected from groups represented by Formulae 11-1 and 11-2, wherein $A_{11}$ and $A_{12}$ may be identical to or different from each other, in Formula 11-1, * indicates a binding site to $(B)_p$ in Formula 11, in Formulae 11, 11-1, and 11-2, *', *", and

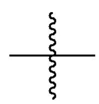

each indicate a binding site to a neighboring repeating unit, in Formulae 11-1 and 11-2, $Ar_{11a}$ and $Ar_{13a}$ may each be a residue after cross-linking, and the repeating units may be linked by a divalent cyclobutane group, in Formula 11, B may be selected from a substituted or unsubstituted $C_5$-$C_{60}$ carbocyclic group, a substituted or unsubstituted $C_1$-$C_{60}$ heterocyclic group, and *'—Si($Q_{41}$)($Q_{42}$)-*", p may be an integer of 1 to 10, in Formulae 11-1 and 11-2, $Ar_1$ may be selected from a substituted or unsubstituted $C_5$-$C_{60}$ carbocyclic group and a substituted or unsubstituted $C_1$-$C_{60}$ heterocyclic group, b1 may be an integer of four or more, and four or more $Ar_1$(s) may be identical to or different from each other, in Formulae 11-1 and 11-2, $L_{11}$ to $L_{14}$ may each independently be a substituted or unsubstituted $C_5$-$C_{60}$ carbocyclic group or a substituted or unsubstituted $C_1$-$C_{60}$ heterocyclic group, in Formulae 11-1 and 11-2, a11 to a14 may each independently be 0, 1, 2, 3, or 4, wherein, in Formula 1-1, when a11 is 0, *'-$(L_{11})_{a11}$-*" may be a single bond, when a12 is 0, *'-$(L_{12})_{a12}$-*" may be a single bond, when a13 is 0, *'-$(L_{13})_{a13}$-*" may be a single bond, when a14 is 0, *'-$(L_{14})_{a14}$-*" may be a single bond, when a11 is two or more, two or more $L_{11}$(s) may be identical to or different from each other, when a12 is two or more, two or more $L_{12}$(s) may be identical to or different from each other, when a13 is two or more, two or more $L_{13}$(s) may be identical to or different from each other, and when a14 is two or more, two or more $L_{14}$(s) may be identical to or different from each other, in Formulae 11-1 and 11-2, $Ar_{11}$ to $Ar_{13}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, in Formulae 11-1 and 11-2, b11 to b13 may be each independently be 1, 2, 3, 4, or 5, wherein, when b11 is two or more, two or more $Ar_{11}$(s) may be identical to or different from each other, when b12 is two or more, two or more $Ar_{12}$(s) may be identical to or different from each other, and when b13 is two or more, two or more $Ar_{13}$(s) may be identical to or different from each other, and in Formula 1b, $Ar_1$ and $Ar_2$ may each independently be a substituted or unsubstituted $C_5$-$C_{60}$ carbocyclic group or a substituted or unsubstituted $C_1$-$C_{60}$ heterocyclic group, wherein $Ar_1$ and $Ar_2$ may be identical to or different from each other, in Formula 1b, a1 and a2 may each independently be an integer of 1 to 5, wherein, when a1 is two or more, two or more $Ar_1$(s) may be identical to or different from each other, and when a2 is two or more, two or more $Ar_2$(s) may be identical to or different from each other, in Formula 1b, $L_{11}$ to $L_{14}$ and $L_{21}$ to $L_{24}$ may each independently be a substituted or unsubstituted $C_5$-$C_{60}$ carbocyclic group or a substituted or unsubstituted $C_1$-$C_{60}$ heterocyclic group, in Formula 1b, b11 to b14 and b21 to b24 may each independently be an integer of 0 to 3, wherein, when b11 is 0, *-$(L_{11})_{b11}$-*' may be a single bond, when b12 is 0, *-$(L_{12})_{b12}$-*' may be a single bond, when b13 is 0, *-$(L_{13})_{b13}$-*' may be a single bond, when b14 is 0, *-$(L_{14})_{b14}$-*' may be a single bond, when b21 is 0, *-$(L_{21})_{b21}$-*' may be a single bond, when b22 is 0, *-$(L_{22})_{b22}$-*' may be a single bond, when b23 is 0, *-$(L_{23})_{b23}$-*' may be a single bond, when b24 is 0, *-$(L_{24})_{b24}$-*' may be a single bond, when b11 is two or more, two or more $L_{11}$(s) may be identical to or different from each other, when b12 is two or more, two or more $L_{12}$(s) may be identical to or different from each other, when b13 is two or more, two or more $L_{13}$(s) may be identical to or different from each other, when b14 is two or more, two or more $L_{14}$(s) may be identical to or different from each other, when b21 is two or more, two or more $L_{21}$(s) may be identical to or different from each other, when b22 is two or more, two or more $L_{22}$(s) may be identical to or different from each other, when b23 is two or more, two or more $L_{23}$(s) may be identical to or different from each other, and when b24 is two or more, two or more $L_{24}$(s) may be identical to or different from each other, in Formula 1b, $B_1$ and $B_2$ may each independently be selected from a single bond, a substituted or unsubstituted $C_1$-$C_{20}$ alkylene group, a substituted or unsubstituted $C_2$-$C_{20}$ alkenylene group, and a substituted or unsubstituted $C_2$-$C_{20}$ alkynylene group, in Formula 1b, m and n may each independently be an integer of 1 to 3, wherein, when m is two or more, two or more $B_1$(s) may be identical to or different from each other, and when n is two or more, two or more $B_2$(s) may be identical to or different from each other, in Formula 1b, $Ar_{11}$, $Ar_{13}$, $Ar_{21}$, and $Ar_{23}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, in Formula 1b, $Ar_{12}$, $Ar_{14}$, $Ar_{22}$, and $Ar_{24}$ may each independently be selected from a single bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, in Formula 1b, c11 to c14 and c21 to c24 may each independently be an integer of 1 to 5, wherein, when c11 is two or more, two or more $Ar_{11}$(s) may be identical to or different from each other, when c12 is two or more, two or more $Ar_{12}$(s) may be identical to or different from each other, when c13 is two or more, two or more $Ar_{13}$(s) may be identical to or different from each other, when c14 is two or more, two or more $Ar_{14}$(s) may be identical to or different from each other, when c21 is two or more, two or more $Ar_{21}$(s) may be identical to or different from each other, when c22 is two or more, two or more $Ar_{22}$(s) may be identical to or different from each other, when c23 is two or more, two or more $Ar_{23}$(s) may be identical to or different from each other, and when c24 is two or more, two or more $Ar_{24}$(s) may be identical to or different from each other, in Formula 1b, at least one substituent in $Ar_1$, $Ar_2$, $Ar_{11}$ to $Ar_{14}$, and $Ar_{21}$ to $Ar_{24}$ may include a cross-linkable group.

Another aspect of an embodiment provides a light-emitting device including: a first electrode; a second electrode facing the first electrode; and an intermediate layer between the first electrode and the second electrode and including an emission layer, wherein the intermediate layer further includes at least one of the arylamine-based polymer.

Another aspect of an embodiment provides an electronic apparatus including a thin film transistor and the light-emitting device, wherein the thin film transistor includes a source electrode, a drain electrode, an active layer, and a gate electrode, and the first electrode of the light-emitting device is electrically coupled to one selected from the source electrode and the drain electrode of the thin film transistor.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
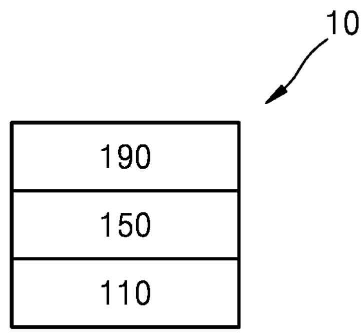
FIG. 1 is a schematic view of a light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described herein below, by referring to the figures, to explain aspects of embodiments of the present description. As used herein, the term "and/or" includes any and all combinations of one or more of the associated listed items. Expressions such as "at least one of," when preceding a list of elements, modify the entire list of elements and do not modify the individual elements of the list.

A cross-linkable arylamine-based compound according to an embodiment may be represented by Formula 1a or 1b:

Formula 1a $$A_1—(B)_p—A_2$$

Formula 1-1

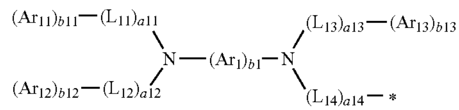

Formula 1b

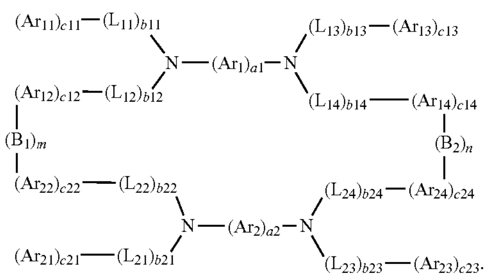

Formulae 1a, 1-1, and 1b will be described herein below in more detail.

In Formula 1a, $A_1$ and $A_2$ may each be a group represented by Formula 1-1, and $A_1$ and $A_2$ may be identical to or different from each other.

For example, in Formula 1a, $A_1$ and $A_2$ may be identical to each other.

In Formula 1a, B may be selected from a substituted or unsubstituted $C_5$-$C_{60}$ carbocyclic group, a substituted or unsubstituted $C_1$-$C_{60}$ heterocyclic group, and *'—Si($Q_{41}$)($Q_{42}$)-*".

In one embodiment, in Formula 1a, *—$(B)_p$—*' (where * is a connection to $A_1$ and *' is a connection to $A_2$) may be selected from groups represented by Formulae 3-1 to 3-19, but embodiments of the present disclosure are not limited thereto:

3-1

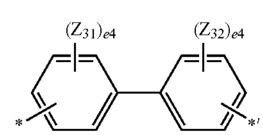

3-2

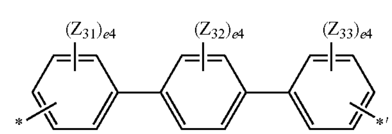

-continued
3-3
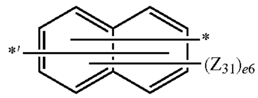
3-4
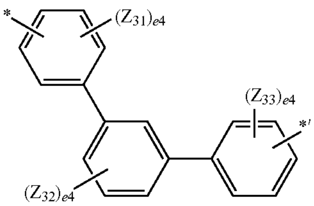
3-5
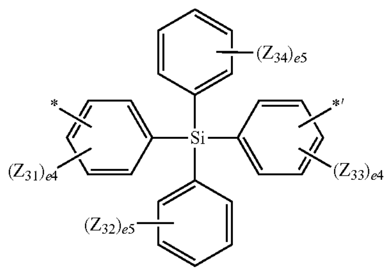
3-6
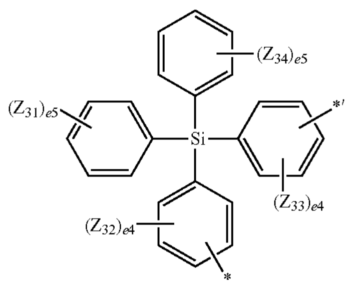
3-7
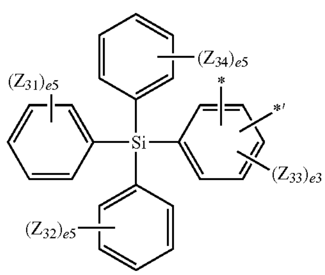
3-8
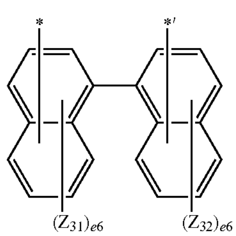
3-9
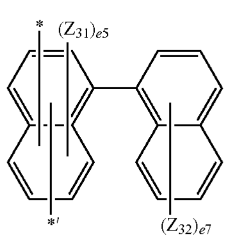
-continued
3-10
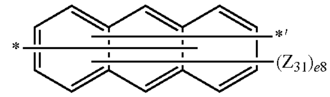
3-11
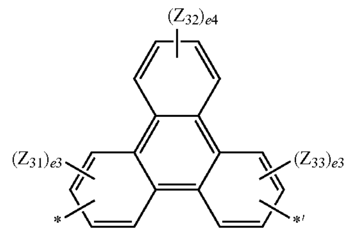
3-12
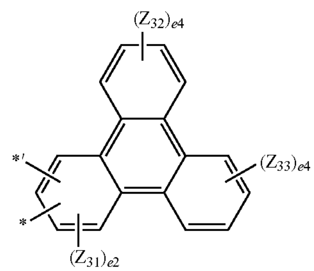
3-13
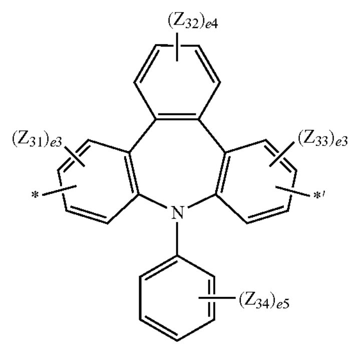
3-14
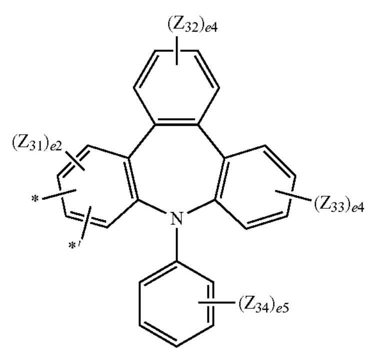

-continued 3-15

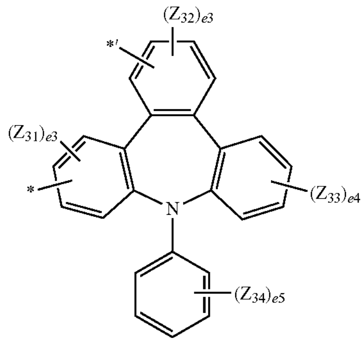

3-16

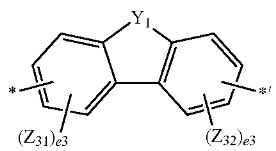

3-17

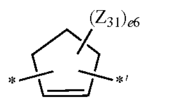

3-18

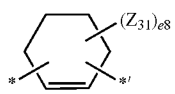

3-19

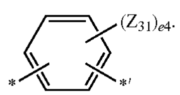

In Formulae 3-1 to 3-19, $Y_1$ may be O, S, $C(Z_{35})(Z_{36})$, $N(Z_{35})$, or $Si(Z_{35})(Z_{36})$, $Z_{31}$ to $Z_{36}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopropenyl group, a cyclobutenyl group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, an benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a carbazolyl group, a dibenzofuranyl group, a dibenzothiophenyl group, a dibenzosilolyl group, a benzocarbazolyl group, a naphtho benzofuranyl group, a naphtho benzothiophenyl group, a naphthobenzosilolyl group, a dibenzocarbazolyl group, a dinaphthofuranyl group, a dinaphtho thiophenyl group, a dinaphtho silolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indeno pyrrolyl group, an indolopyrrolyl group, an indeno carbazolyl group, an indolocarbazolyl group, $—Si(Q_{31})(Q_{32})(Q_{33})$, and $—N(Q_{31})(Q_{32})$, and $Q_{31}$ to $Q_{33}$ may each independently be selected from:

a $C_1$-$C_{10}$ alkyl group, a $C_1$-$C_{10}$ alkoxy group, a phenyl group, a biphenyl group, a terphenyl group, and a naphthyl group; and a phenyl group, a biphenyl group, a terphenyl group, and a naphthyl group, each substituted with at least one selected from a $C_1$-$C_{10}$ alkyl group, a $C_1$-$C_{10}$ alkoxy group, and a phenyl group.

e2 may be an integer of 0 to 2, e3 may be an integer of 0 to 3, e4 may be an integer of 0 to 4, e5 may be an integer of 0 to 5, e6 may be an integer of 0 to 6, e7 may be an integer of 0 to 7, e8 may be an integer of 0 to 8, and

* and *' each indicate a binding site to a neighboring atom.

In Formula 1a, p may be an integer of 1 to 10.

In Formula 1-1, * indicates a binding site to $(B)_p$ in Formula 1a.

The cross-linkable arylamine-based compound represented by Formula 1a may be symmetrical with respect to $*'—(B)_p—*''$, but embodiments of the present disclosure are not limited thereto.

The cross-linkable arylamine-based compound represented by Formula 1b may be symmetrical with respect to an axis passing through $Ar_1$ and $Ar_2$ in Formula 1b.

$Ar_1$ in Formula 1-1 and $Ar_1$ and $Ar_2$ in Formula 1b may each independently be selected from a substituted or unsubstituted $C_5$-$C_{60}$ carbocyclic group and a substituted or unsubstituted $C_1$-$C_{60}$ heterocyclic group.

In one embodiment, in Formula 1-1, $Ar_1$ may be selected from a benzene group, a pyridine group, a pyrimidine group, a pyrazine group, a triazine group, a furan group, a thiophene group, an imidazole group, a thiazole group, an isoxazole group, and an oxazole group, and in Formula 1b, $Ar_1$ and $Ar_2$ may each independently be selected from:

a $C_6$-$C_{60}$ arylene group and a $C_1$-$C_{60}$ heteroarylene group; and a $C_6$-$C_{60}$ arylene group and a $C_1$-$C_{60}$ heteroarylene group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_1$-$C_{60}$ alkoxy group, $—N(Q_{31})(Q_{32})$, and a cross-linkable group, but embodiments of the present disclosure are not limited thereto.

For example, in Formula 1-1, $Ar_1$ may be selected from a benzene group, a pyridine group, a furan group, and a thiophene group.

For example, $Ar_1$ in Formula 1-1 may be a benzene group, and $Ar_1$ and $Ar_2$ in Formula 1b may each independently be selected from:

a phenylene group and a naphthylene group; and a phenylene group and a naphthylene group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_1$-$C_{60}$ alkoxy group, —N($Q_{31}$)($Q_{32}$), and a cross-linkable group.

In Formula 1-1, b1 may be an integer of four or more, four or more $Ar_1$(s) may be identical to or different from each other, and a1 and a2 in Formula 1b may each independently be an integer of 1 to 5, wherein, when a1 is two or more, two or more $Ar_1$(s) may be identical to or different from each other, and when a2 is two or more, two or more $Ar_2$(s) may be identical to or different from each other.

In one embodiment, in Formula 1-1, four or more $Ar_1$(s) may be identical to each other. In one or more embodiments, in Formula 1-1, four or more $Ar_1$(s) may be different from each other.

In one embodiment, in Formula 1b, $Ar_1$ and $Ar_2$ may be identical to or different from each other. In one or more embodiments, in Formula 1b, $Ar_1$ and $Ar_2$ may be identical to each other.

In one embodiment, in Formula 1-1, four or more $Ar_1$(s) may be identical to each other, and in Formula 1b, when a1 is two or more, two or more $Ar_1$(s) may be identical to each other, and when a2 is two or more, two or more $Ar_2$(s) may be identical to each other.

In one embodiment, in Formula 1b, $*—(Ar_1)_{a1}—*'$ and $*—(Ar_2)_{a2}—*'$ may be identical to each other.

In Formula 1-1, b1 may be an integer of 4 to 6. For example, in Formula 1-1, b1 may be 4 or 5.

In one embodiment, in Formula 1-1, $Ar_1$ may be a benzene, and b1 may be 4 or 5.

$L_{11}$ to $L_{14}$ in Formula 1-1 and $L_{11}$ to $L_{14}$ and $L_{21}$ to $L_{24}$ in Formula 1b may each independently be a substituted or unsubstituted $C_5$-$C_{60}$ carbocyclic group or a substituted or unsubstituted $C_1$-$C_{60}$ heterocyclic group.

In one embodiment, $L_{11}$ to $L_{14}$ in Formula 1-1 and $L_{11}$ to $L_{14}$ and $L_{21}$ to $L_{24}$ in Formula 1b may each independently be selected from groups represented by Formulae 2-1 to 2-37, but embodiments of the present disclosure are not limited thereto:

2-1

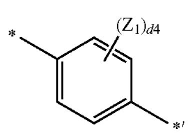

2-2

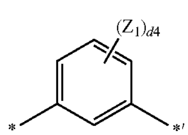

2-3

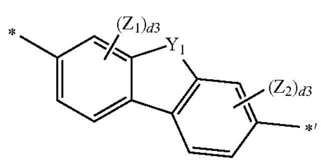

-continued 2-4

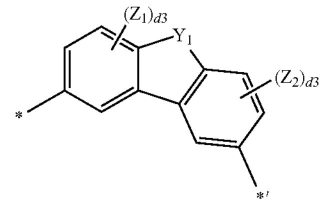

2-5

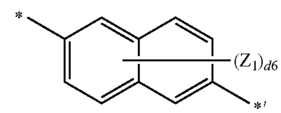

2-6

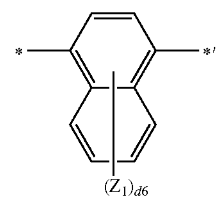

2-7

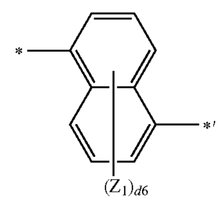

2-8

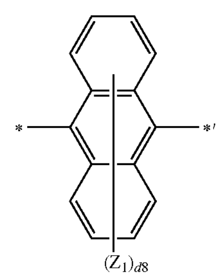

2-9

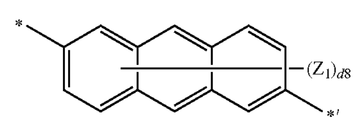

2-10

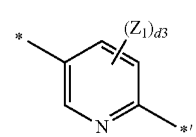

2-11

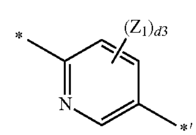

2-12

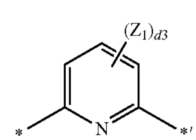

-continued
2-13
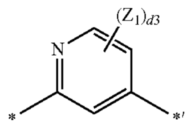
2-14
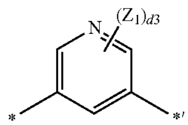
2-15
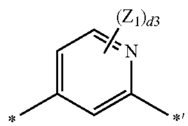
2-16
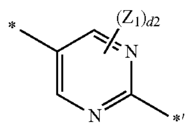
2-17
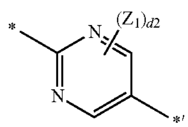
2-18
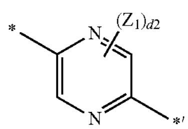
2-19
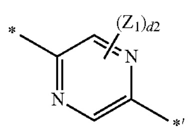
2-20
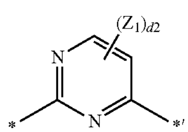
2-21
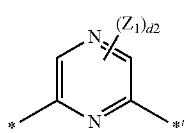
2-22
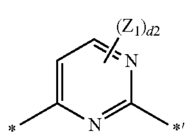
2-23
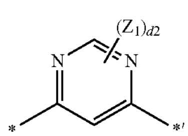
-continued
2-24
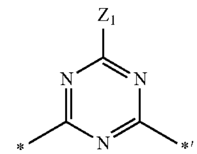
2-25
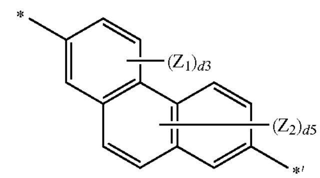
2-26
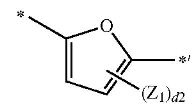
2-27
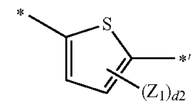
2-28
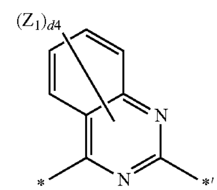
2-29
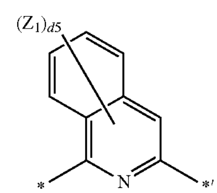
2-30
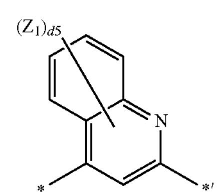
2-31
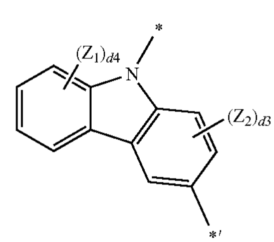

-continued 2-32

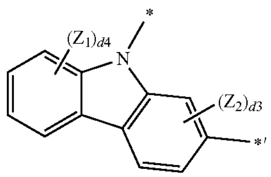

2-33

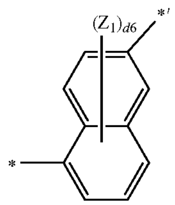

2-34

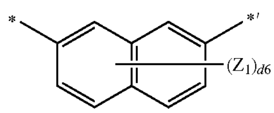

2-35

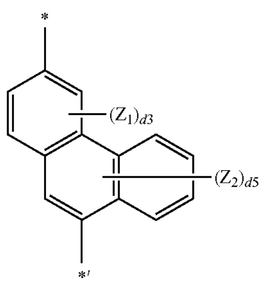

2-36

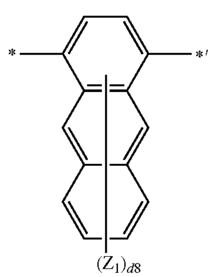

2-37

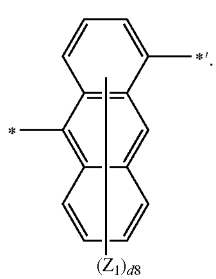

In Formulae 2-1 to 2-37, $Y_1$ may be O, S, $C(Z_3)(Z_4)$, $N(Z_5)$, or $Si(Z_6)(Z_7)$, $Z_1$ to $Z_7$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, d2 may be an integer of 0 to 2, d3 may be an integer of 0 to 3, d4 may be an integer of 0 to 4, d5 may be an integer of 0 to 5, d6 may be an integer of 0 to 6, d8 may be an integer of 0 to 8, and

* and *' each indicate a binding site to a neighboring atom.

In Formula 1-1, a11 to a14 may each independently be 0, 1, 2, 3, or 4, wherein, when a11 is 0, $*'-(L_{11})_{a11}-*''$ may be a single bond, when a12 is 0, $*'-(L_{12})_{a12}-*''$ may be a single bond, when a13 is 0, $*'-(L_{13})_{a13}-*''$ may be a single bond, and when a14 is 0, $*'-(L_{14})_{a14}-*''$ may be a single bond.

In Formula 1-1, when a11 is two or more, two or more $L_{11}$(s) may be identical to or different from each other, when a12 is two or more, two or more $L_{12}$(s) may be identical to or different from each other, when a13 is two or more, two or more $L_{13}$(s) may be identical to or different from each other, and when a14 is two or more, two or more $L_{14}$(s) may be identical to or different from each other.

In Formula 1b, b11 to b14 and b21 to b24 may each independently be an integer of 0 to 3, wherein, when b11 is 0, $*-(L_{11})_{b11}-*'$ may be a single bond, when b12 is 0, $*-(L_{12})_{b12}-*'$ may be a single bond, when b13 is 0, $*-(L_{13})_{b13}-*'$ may be a single bond, when b14 is 0, $*-(L_{14})_{b14}-*'$ may be a single bond, when b21 is 0, $*-(L_{21})_{b21}-*'$ may be a single bond, when b22 is 0, $*-(L_{22})_{b22}-*'$ may be a single bond, when b23 is 0, $*-(L_{23})_{b23}-*'$ may be a single bond, and when b24 is 0, $*-(L_{24})_{b24}-*'$ may be a single bond.

In Formula 1b, when b11 is two or more, two or more $L_{11}$(s) may be identical to or different from each other, when b12 is two or more, two or more $L_{12}$(s) may be identical to or different from each other, when b13 is two or more, two or more $L_{13}$(s) may be identical to or different from each other, when b14 is two or more, two or more $L_{14}$(s) may be identical to or different from each other, when b21 is two or more, two or more $L_{21}$(s) may be identical to or different from each other, when b22 is two or more, two or more $L_{22}$(s) may be identical to or different from each other, when b23 is two or more, two or more $L_{23}$(s) may be identical to or different from each other, and when b24 is two or more, two or more $L_{24}$(s) may be identical to or different from each other.

In Formula 1b, b11 to b14 and b21 to b24 may each independently be an integer of 0 to 2.

In Formula 1b, $B_1$ and $B_2$ may each independently be selected from a single bond, a substituted or unsubstituted $C_1$-$C_{20}$ alkylene group, a substituted or unsubstituted $C_2$-$C_{20}$ alkenylene group, and a substituted or unsubstituted $C_2$-$C_{20}$ alkynylene group.

In one embodiment, in Formula 1b, $B_1$ and $B_2$ may each independently be selected from:

a single bond;

a methylene group, an ethylene group, a propylene group, an isopropylene group, a butylene group, an isobutylene group, an ethenylene group, a prophenylene group, a butenylene group, an ethynylene group, a propynylene group, and a butynylene group; and a methylene group, an ethylene group, a propylene group, an isopropylene group, a butylene group, an isobutylene group, an ethenylene group, a prophenylene group, a butenylene group, an ethynylene group, a propynylene group, and a butynylene group, each substituted with at least one selected from deuterium, —F, —Cl, —Br, —I, a hydroxyl group, a cyano group, a nitro group, an amidino group, a hydrazino group, a hydrazono group, a methyl group, an ethyl group, a propyl group, an isopropyl group, a butyl group, and an isobutyl group, but embodiments of the present disclosure are not limited thereto.

For example, in Formula 1b, $B_1$ and $B_2$ may each independently be selected from:

a single bond;

a methylene group, ethylene group, an ethenylene group, and an ethynylene group; and a methylene group, an ethylene group, an ethenylene group, and an ethynylene group, each substituted with at least one selected from deuterium, —F, —Cl, —Br, —I, a hydroxyl group, a cyano group, a nitro group, an amidino group, a hydrazino group, a hydrazono group, a methyl group, and an ethyl group.

In Formula 1b, m and n may each independently be an integer of 1 to 3, wherein, when m is two or more, two or more $B_1$(s) may be identical to or different from each other, and when n is two or more, two or more $B_2$(s) may be identical to or different from each other.

$Ar_{11}$ to $Ar_{13}$ in Formula 1-1 and $Ar_{11}$, $Ar_{13}$, $Ar_{21}$, and $Ar_{23}$ in Formula 1b may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one embodiment, $Ar_{11}$ to $Ar_{13}$ in Formula 1-1 and $Ar_{11}$, $Ar_{13}$, $Ar_{21}$, and $Ar_{23}$ in Formula 1b may each independently be selected from a substituted or unsubstituted $C_6$-$C_{60}$ aryl group and a substituted or unsubstituted $C_1$-$C_{60}$ heteroaryl group, but embodiments of the present disclosure are not limited thereto.

In one embodiment, $Ar_{11}$ to $Ar_{13}$ in Formula 1-1 and $Ar_{11}$, $Ar_{13}$, $Ar_{21}$, and $Ar_{23}$ in Formula 1b may each independently be a substituted or unsubstituted $C_6$-$C_{60}$ aryl group.

For example, in Formula 1-1, $A_{11}$ to $Ar_{13}$ may each independently be selected from:

a $C_6$-$C_{60}$ aryl group; and a $C_6$-$C_{60}$ aryl group substituted with at least one selected from deuterium, —F, —Cl, —Br, —I, a hydroxyl group, a cyano group, a nitro group, an amidino group, a hydrazino group, a hydrazono group, a $C_2$-$C_{60}$ alkenyl group, a $C_2$-$C_{60}$ alkynyl group, and a $C_1$-$C_{60}$ alkoxy group, and in Formula 1b, $Ar_{11}$, $Ar_{13}$, $Ar_{21}$, and $Ar_{23}$ may each independently be selected from:

a phenyl group, a biphenyl group, a terphenyl group, and a naphthyl group; and a phenyl group, a biphenyl group, a terphenyl group, and a naphthyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cross-linkable group, and —$N(Q_{31})(Q_{32})$, but embodiments of the present disclosure are not limited thereto.

For example, in Formula 1b, $Ar_{11}$, $Ar_{13}$, $Ar_{21}$, and $Ar_{23}$ may each independently be selected from:

a phenyl group and a naphthyl group; and a phenyl group and a naphthyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cross-linkable group, and —$N(Q_{31})(Q_{32})$.

In Formula 1b, $Ar_{12}$, $Ar_{14}$, $Ar_{22}$, and $Ar_{24}$ may each independently be selected from a single bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In one embodiment, in Formula 1b, $Ar_{12}$, $Ar_{14}$, $Ar_{22}$, and $Ar_{24}$ may each independently be selected from:

a single bond;

a phenylene group and a naphthylene group; and a phenylene group and a naphthylene group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_1$-$C_{60}$ alkoxy group, —$N(Q_{31})(Q_{32})$, and a cross-linkable group, but embodiments of the present disclosure are not limited thereto.

In Formula 1b, $Ar_{11}$, $Ar_{13}$, $Ar_{21}$, and $Ar_{23}$ may be identical to or different from each other, and $Ar_{12}$, $Ar_{14}$, $Ar_{22}$, and $Ar_{24}$ may be identical to or different from each other.

In one embodiment, in Formula 1b, $Ar_{11}$ and $Ar_{13}$ may be identical to each other, $Ar_{21}$ and $Ar_{23}$ may be identical to each other, $Ar_{12}$ and $Ar_{14}$ may be identical to each other, and $Ar_{22}$ and $Ar_{24}$ may be identical to each other.

In one or more embodiments, in Formula 1b, $Ar_{11}$ and $Ar_{21}$ may be identical to each other, $Ar_{13}$ and $Ar_{23}$ may be identical to each other, $Ar_{12}$ and $Ar_{22}$ may be identical to each other, and $Ar_{14}$ and $Ar_{24}$ may be identical to each other.

In one or more embodiments, in Formula 1b, $Ar_{11}$, $Ar_{13}$, $Ar_{21}$, and $Ar_{23}$ may be identical to each other, and $Ar_{12}$, $Ar_{14}$, $Ar_{22}$, and $Ar_{24}$ may be identical to each other.

In Formula 1-1, b11 to b13 may each independently be 1, 2, 3, 4, or 5, wherein, when b11 is two or more, two or more $Ar_{11}$(s) may be identical to or different from each other, when b12 is two or more, two or more $Ar_{12}$(s) may be identical to or different from each other, and when b13 is two or more, two or more $Ar_{13}$(s) may be identical to or different from each other.

In Formula 1b, c11 to c14 and c21 to c24 may each independently be an integer of 1 to 5, wherein, when c11 is two or more, two or more $Ar_{11}$(s) may be identical to or different from each other, when c12 is two or more, two or more $Ar_{12}$(s) may be identical to or different from each other, when c13 is two or more, two or more $Ar_{13}$(s) may be identical to or different from each other, when c14 is two or more, two or more $Ar_{14}$(s) may be identical to or different from each other, when c21 is two or more, two or more $Ar_{21}$(s) may be identical to or different from each other, when c22 is two or more, two or more $Ar_{22}$(s) may be identical to or different from each other, when c23 is two or more, two or more $Ar_{23}$(s) may be identical to or different from each other, and when c24 is two or more, two or more $Ar_{24}$(s) may be identical to or different from each other.

At least one selected from $Ar_{11}$ to $Ar_{13}$ in Formula 1-1 and at least one selected from $Ar_1$, $Ar_2$, $Ar_{11}$ to $Ar_{14}$, and $Ar_{21}$ to $Ar_{24}$ in Formula 1b may be substituted with a cross-linkable group.

In one embodiment, in Formula 1-1, one selected from $Ar_{11}$ and $Ar_{13}$ may be substituted with a cross-linkable group. For example, in Formula 1-1, $Ar_{11}$ may be substituted with a cross-linkable group. For example, in Formula 1-1, $Ar_{13}$ may be substituted with a cross-linkable group.

In one embodiment, in Formula 1b, at least two groups of $Ar_{11}$, $Ar_{13}$, $Ar_{21}$, and $Ar_{23}$ may be substituted with a cross-linkable group.

In one or more embodiments, in Formula 1b, at least two groups of $Ar_1$, $Ar_2$, $Ar_{12}$, $Ar_{14}$, $Ar_{22}$, and $Ar_{24}$ may be substituted with a cross-linkable group, and $B_1$ and $B_2$ may each be a single bond, but embodiments of the present disclosure are not limited thereto.

In one embodiment, the cross-linkable group may include at least one selected from a vinylene moiety, a styrene moiety, a cyclobutane moiety, and an epoxy moiety, but embodiments of the present disclosure are not limited thereto.

For example, the cross-linkable group may be selected from groups represented by Formulae 4-1 to 4-14:

4-1

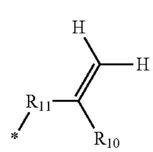

4-2

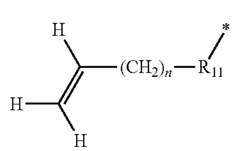

4-3

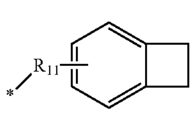

-continued 4-4

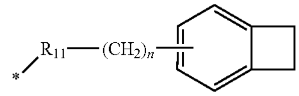

4-5

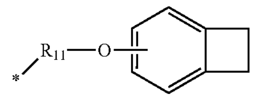

4-6

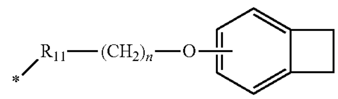

4-7

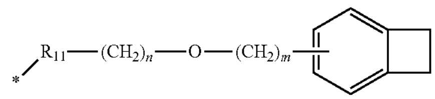

4-8

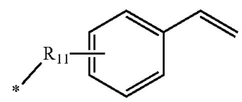

4-9

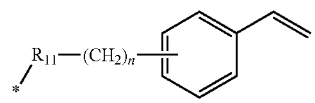

4-10

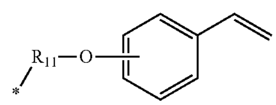

4-11

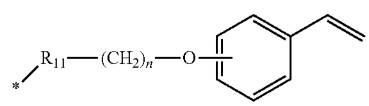

4-12

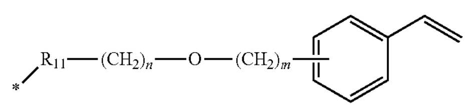

4-13

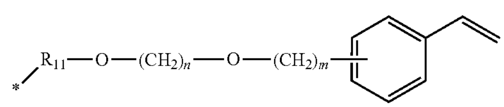

4-14

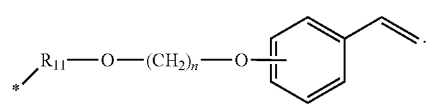

In Formulae 4-1 to 4-14, $R_{10}$ may be a hydrogen atom or a substituted or unsubstituted $C_1$-$C_{20}$ alkyl group, $R_{11}$ may be selected from a single bond, a substituted or unsubstituted $C_1$-$C_{20}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, m and n may each independently be an integer of 1 to 10, and

* indicates a binding site to a neighboring atom.

In Formulae 4-1 to 4-14, $R_{11}$ may be a single bond, a substituted or unsubstituted $C_1$-$C_{20}$ alkylene group, a substituted or unsubstituted $C_6$-$C_{60}$ arylene group, or a substituted or unsubstituted $C_1$-$C_{60}$ heteroarylene group, but embodiments of the present disclosure are not limited thereto.

For example, in Formulae 4-1 to 4-14, $R_{11}$ may be a single bond, a substituted or unsubstituted $C_1$-$C_{20}$ alkylene group, or a substituted or unsubstituted $C_6$-$C_{60}$ arylene group.

For example, in Formulae 4-1 to 4-14, $R_{11}$ may be a single bond, a methylene group, or a phenylene group.

For example, in Formulae 4-1 to 4-14, $R_{11}$ may be a single bond or a methylene group.

For example, in Formulae 4-1 to 4-14, $R_{11}$ may be a methylene group.

In one embodiment, termini of the cross-linkable group may be linked to form a cyclobutane group.

The cross-linkable arylamine-based compound may be selected from Compounds 1 to 40:

1

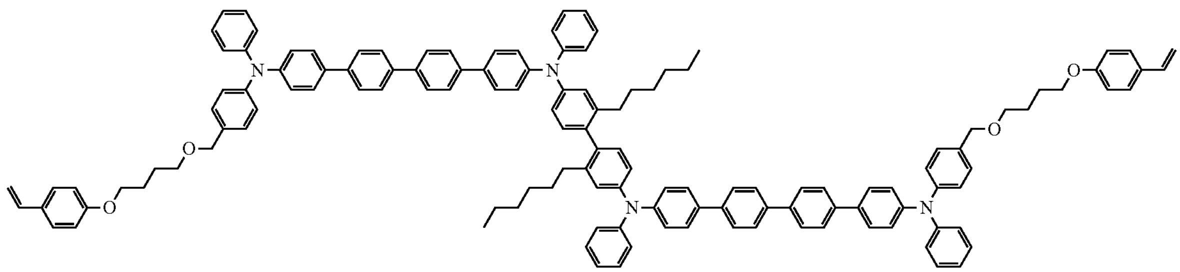

2

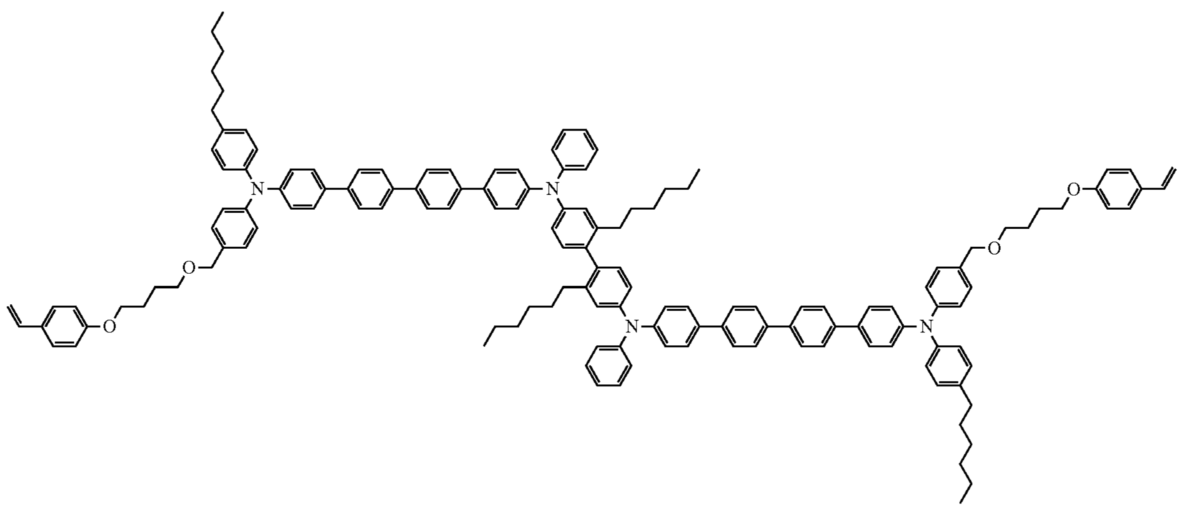

3

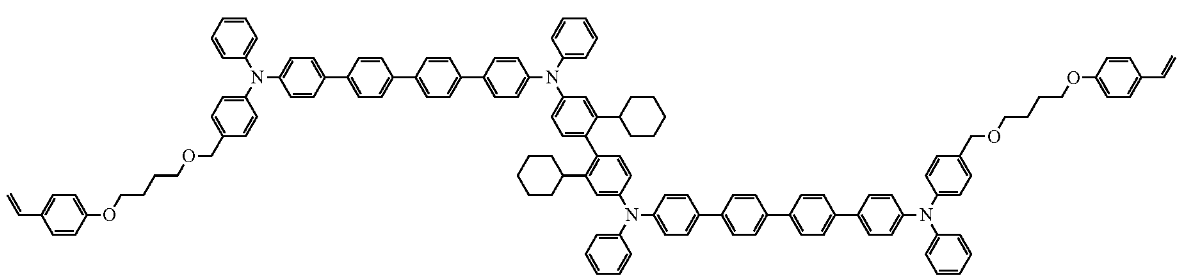

4

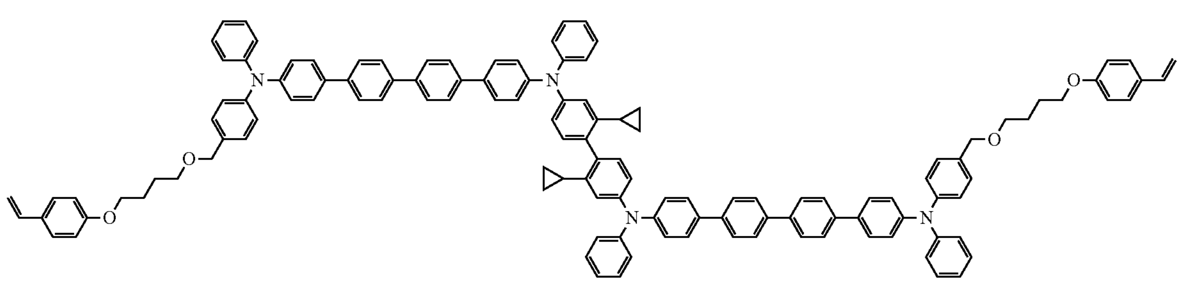

-continued
5
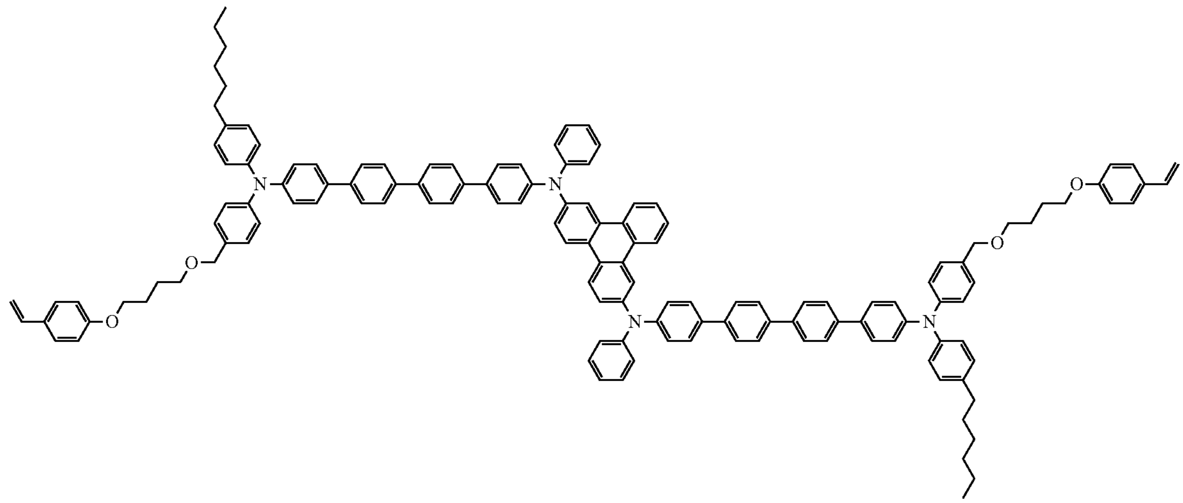
6
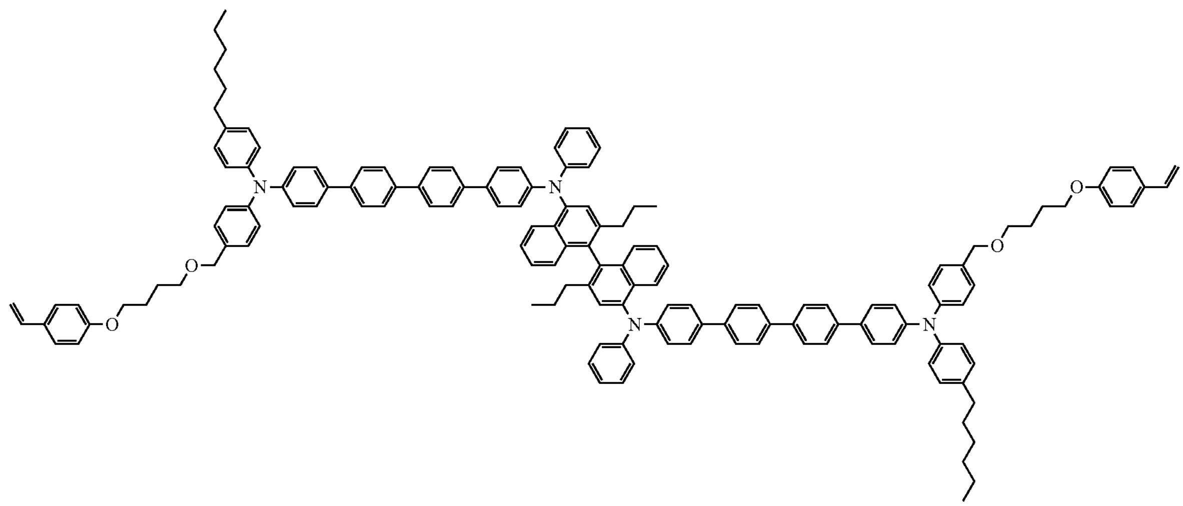
7
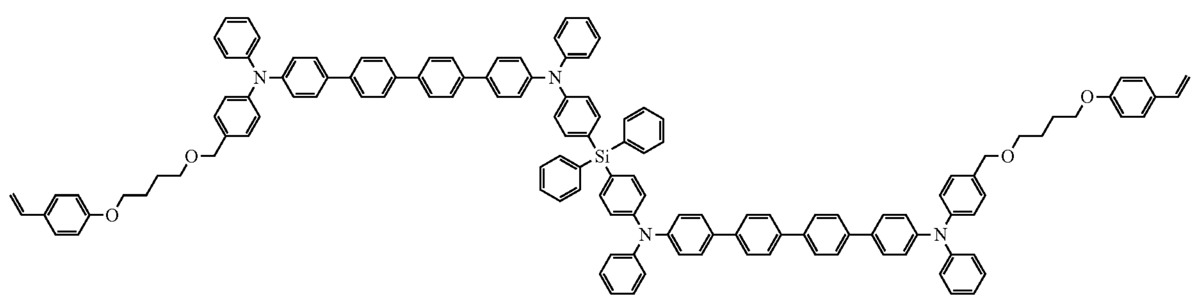
8
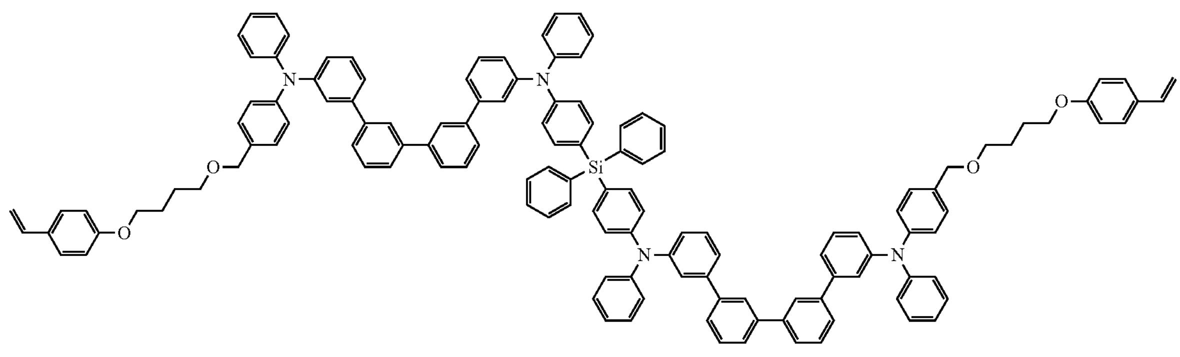

-continued
9
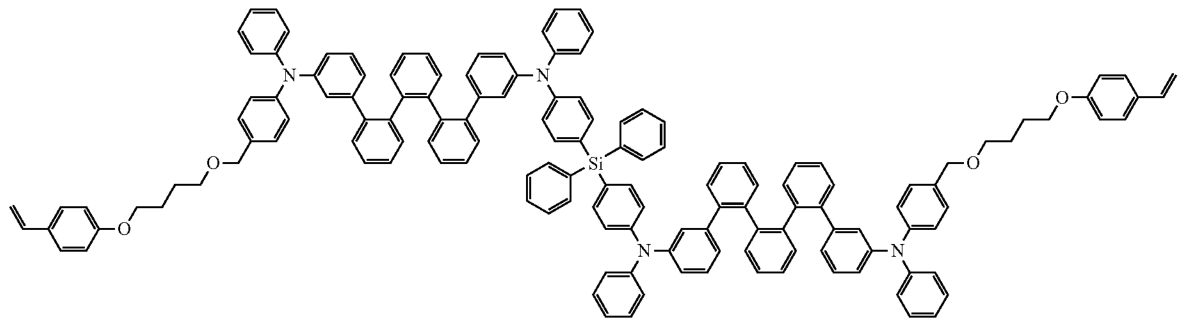
10
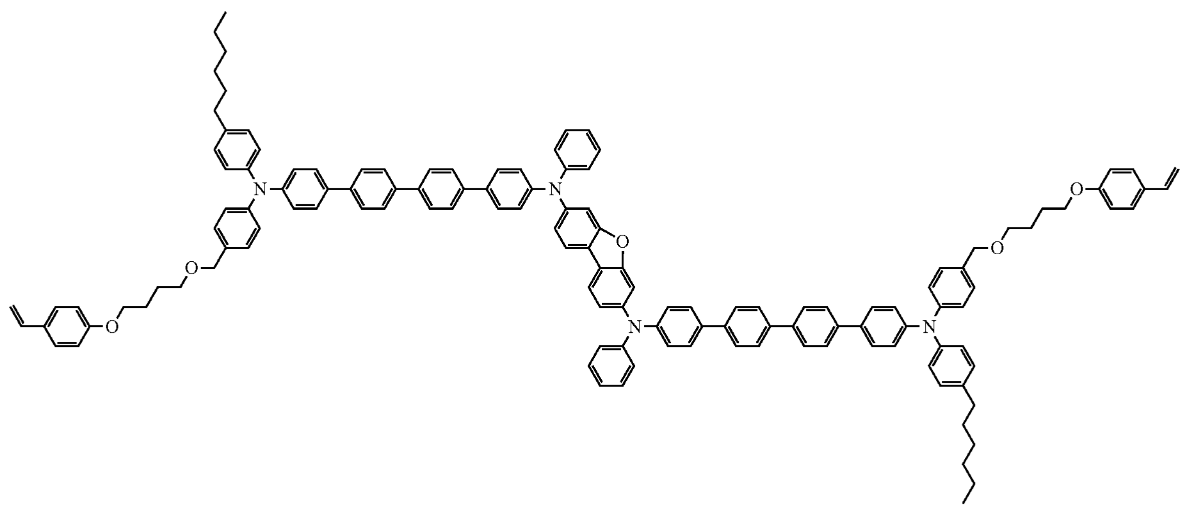
11
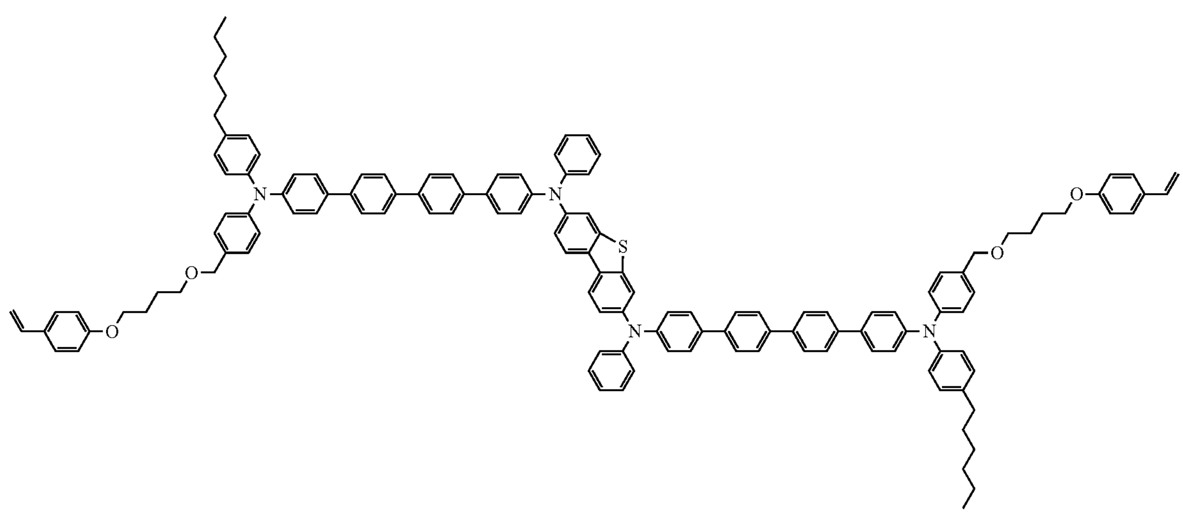

-continued
12
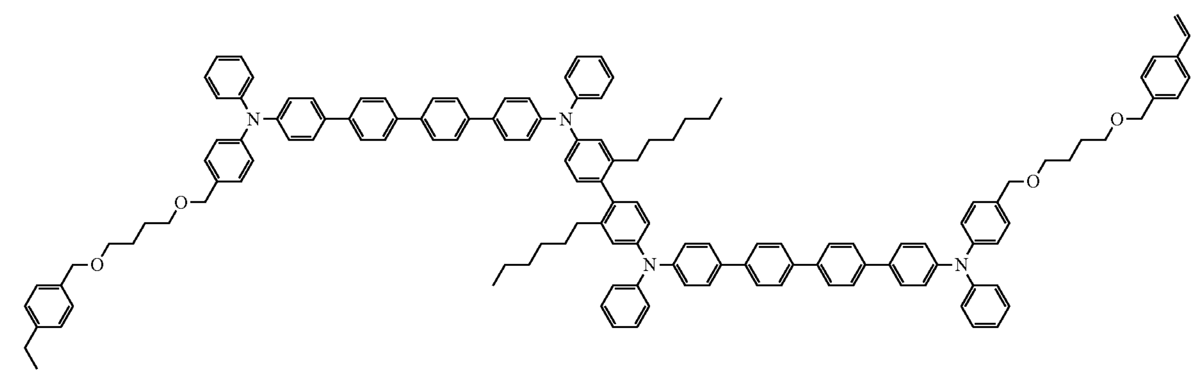
13
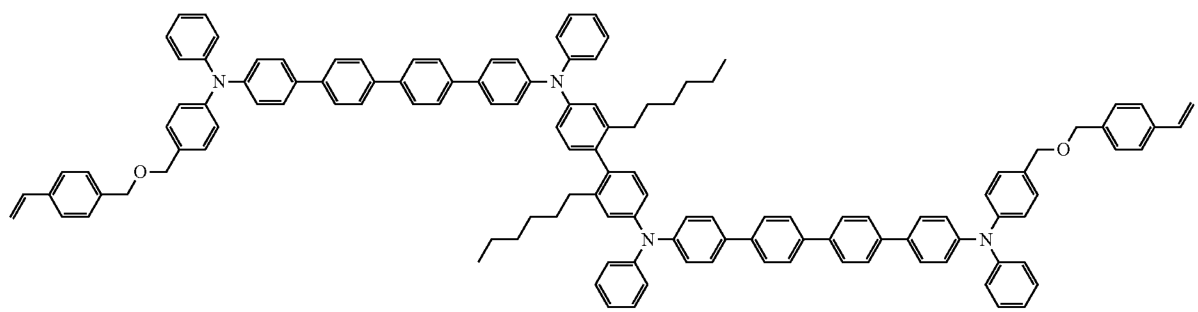
14
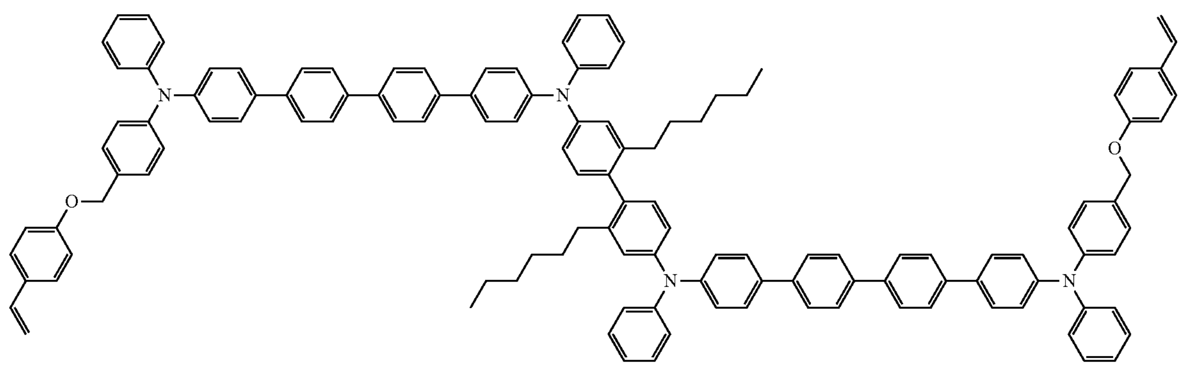
15
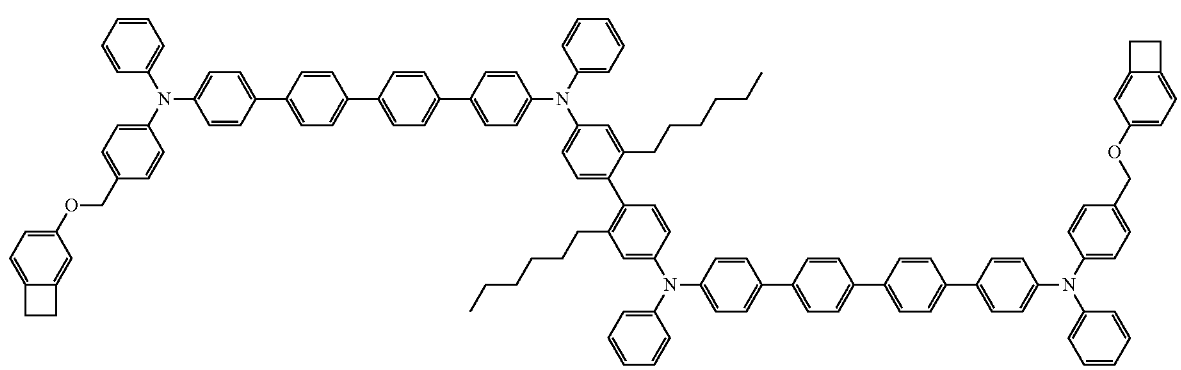

-continued
16
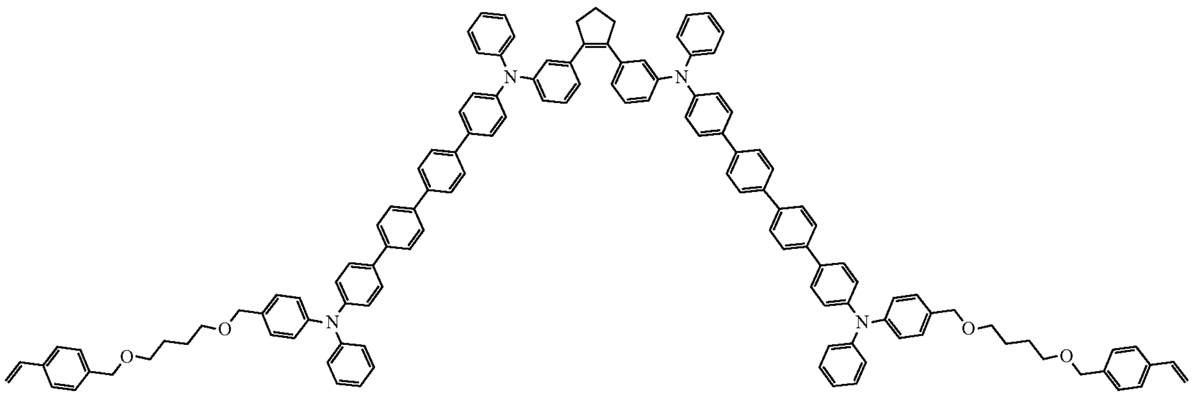
17
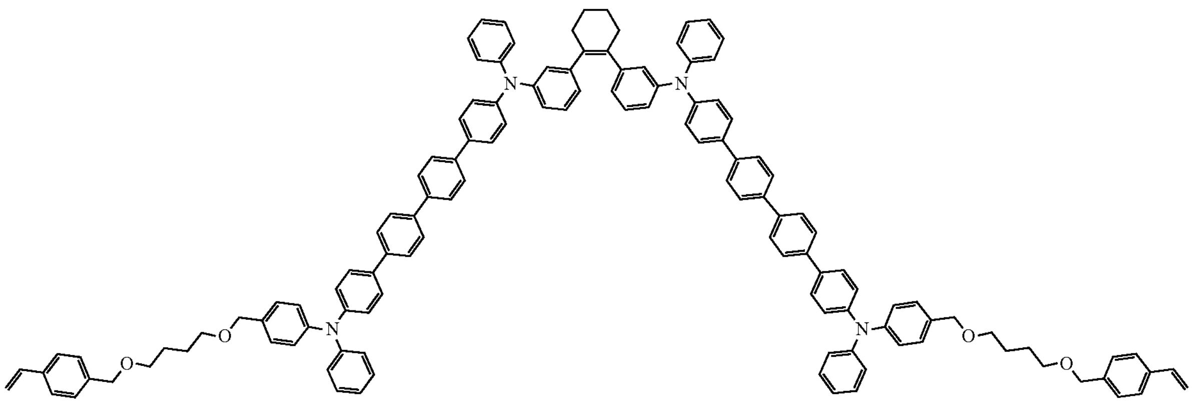
18
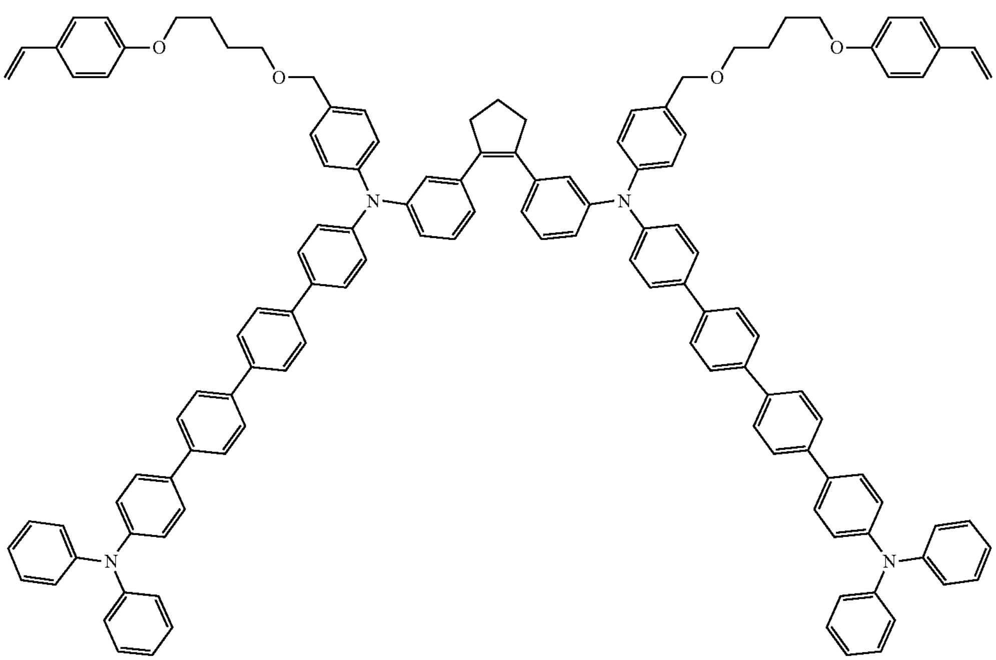

-continued
19
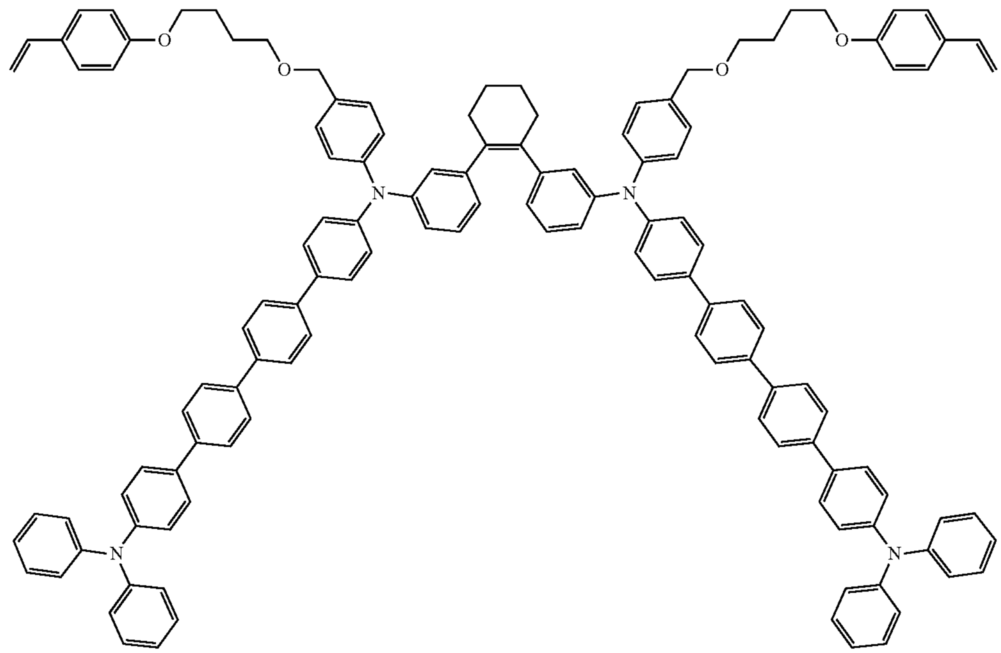
20
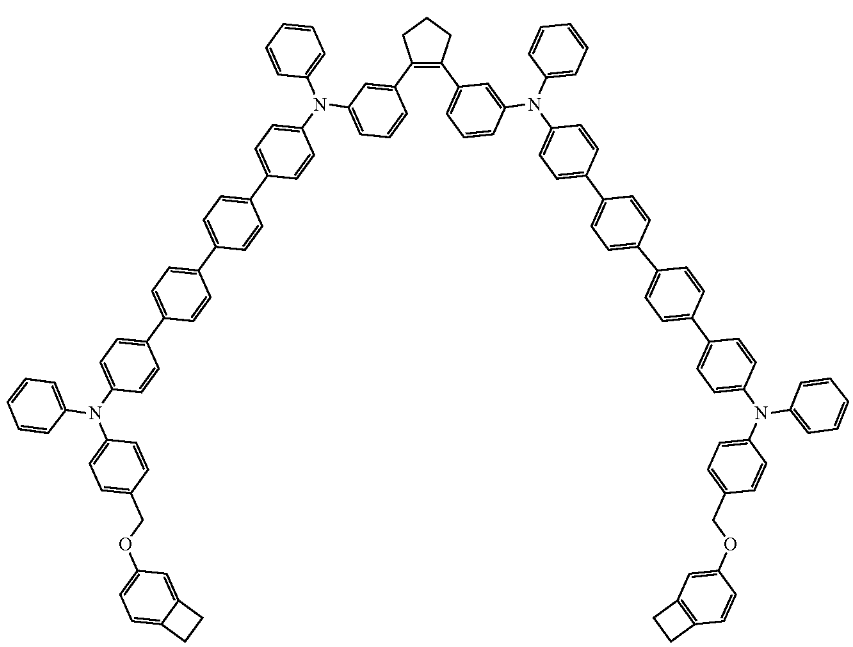

-continued
21
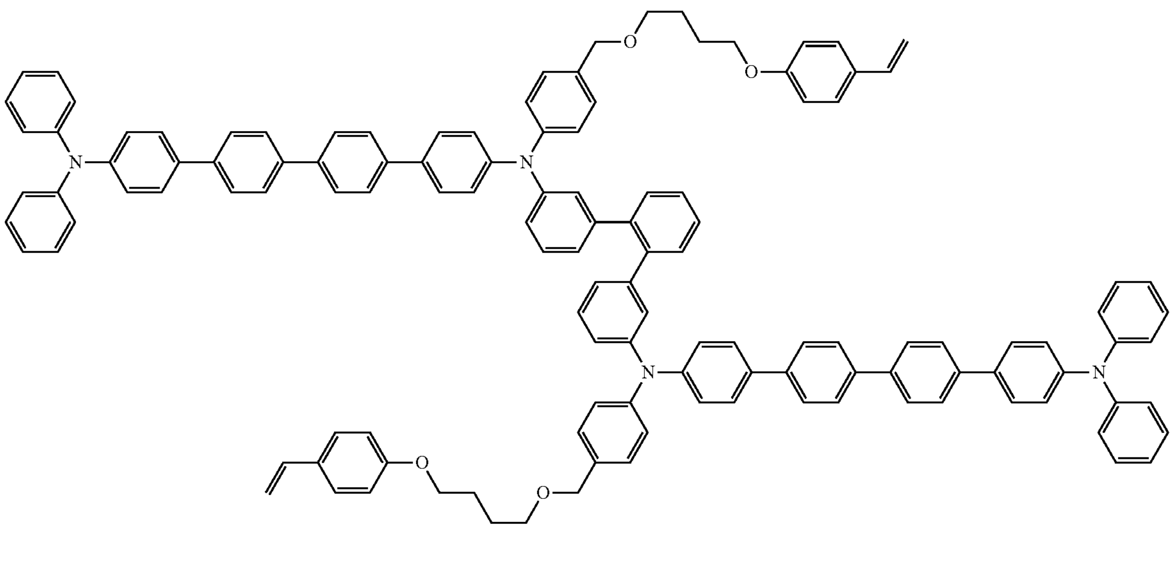
22
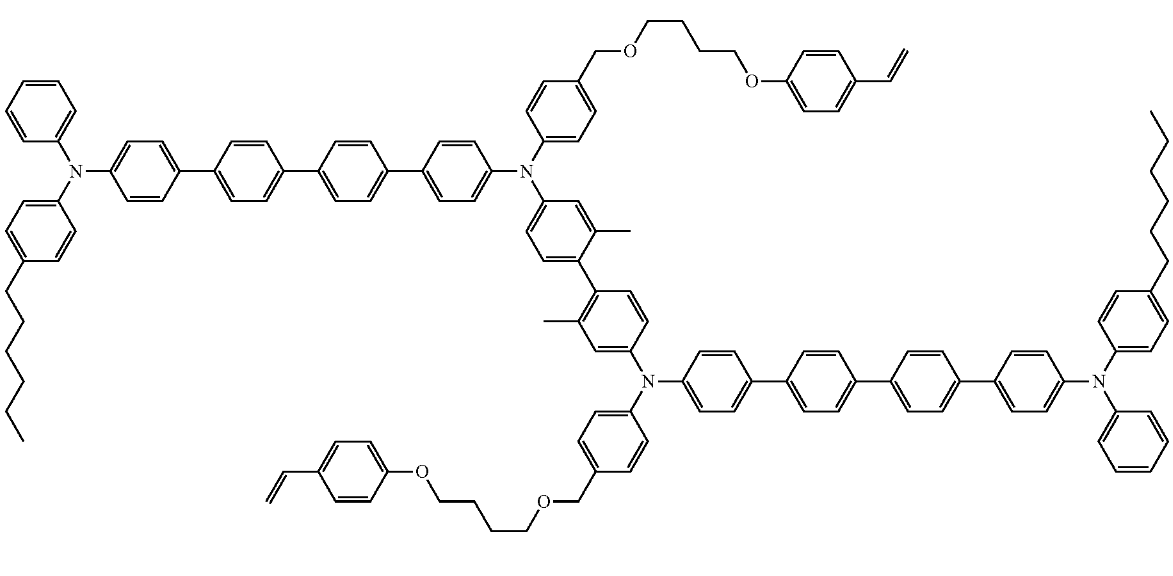

-continued
23
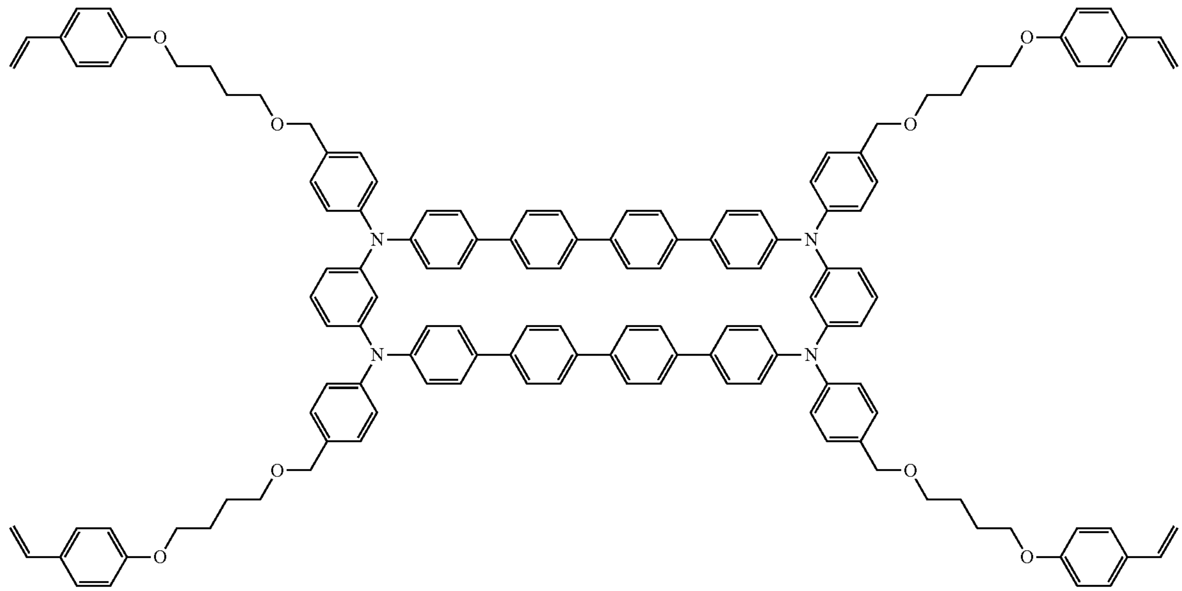
24
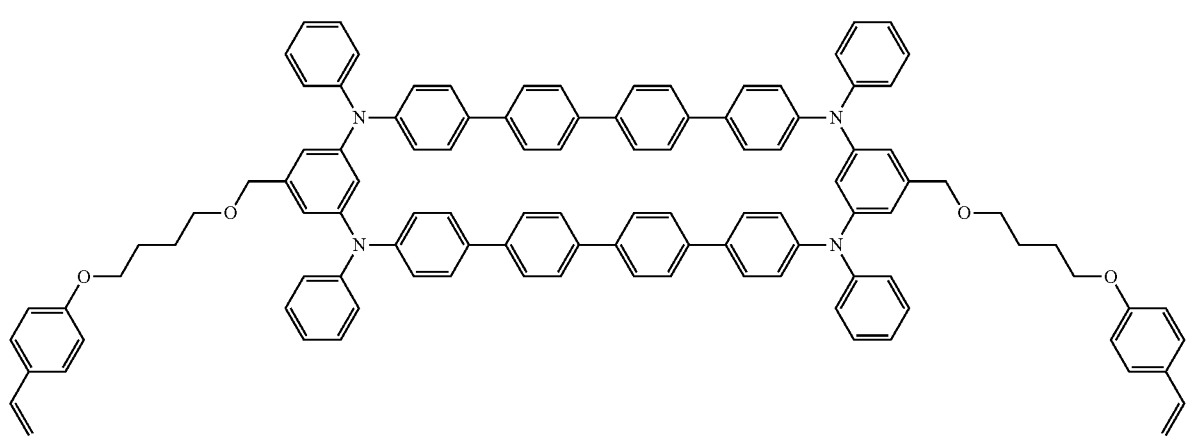

-continued
25
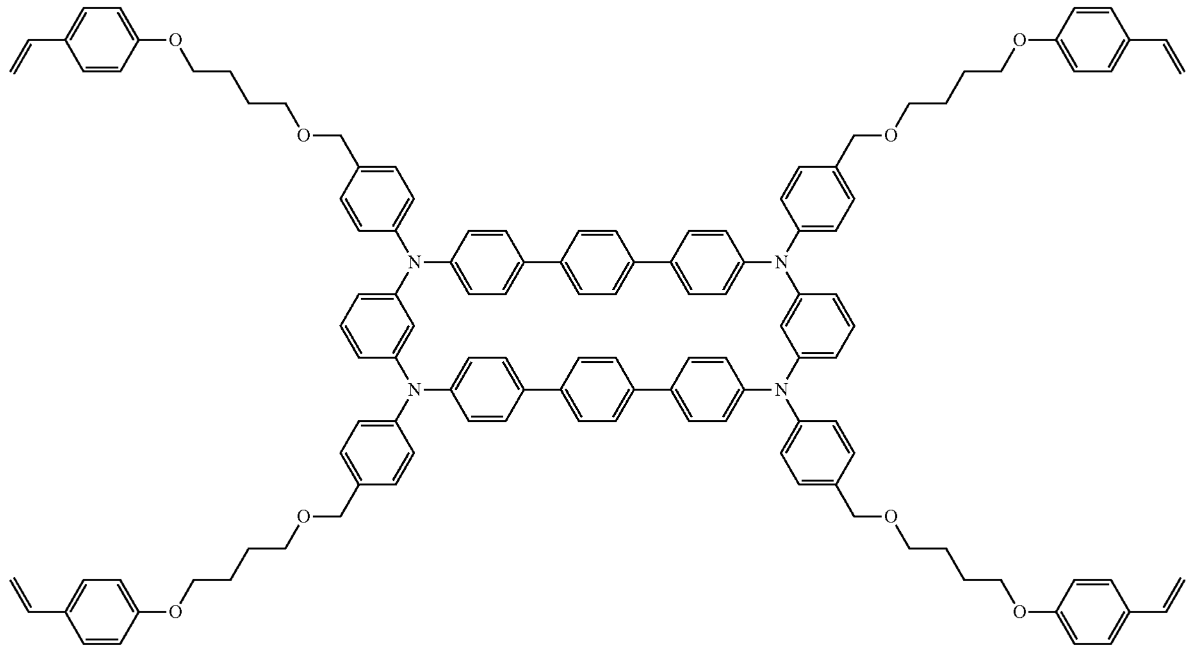
26
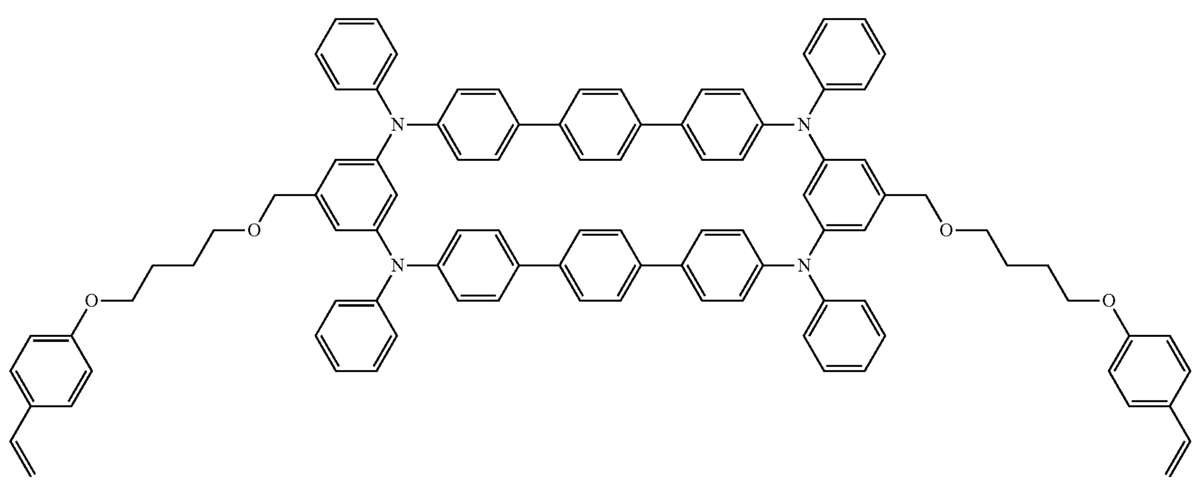

-continued
27
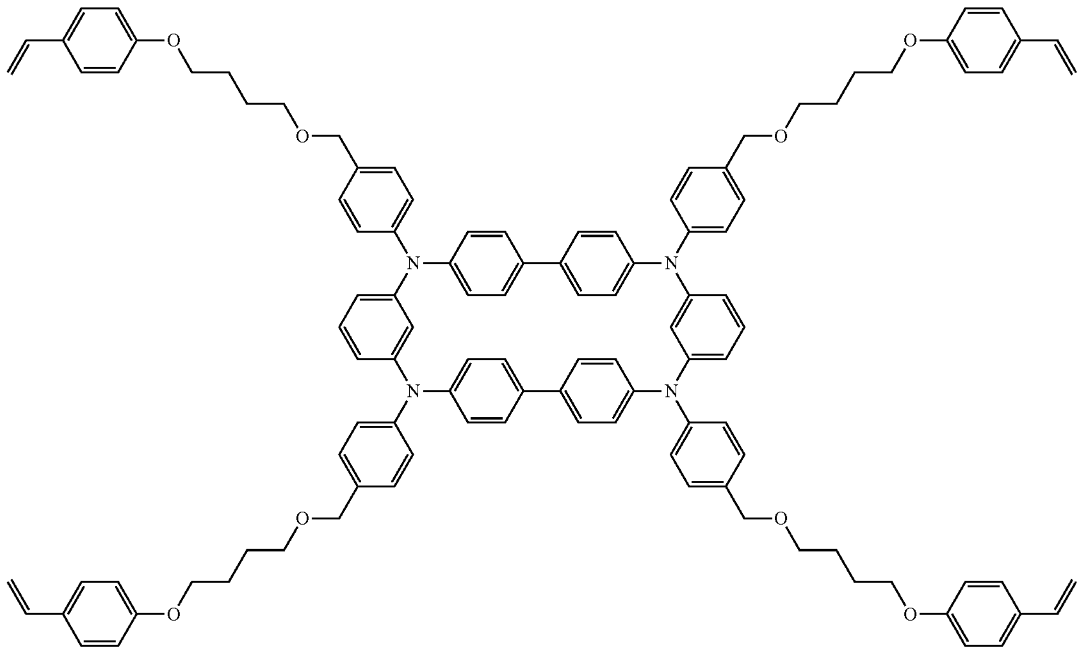
28
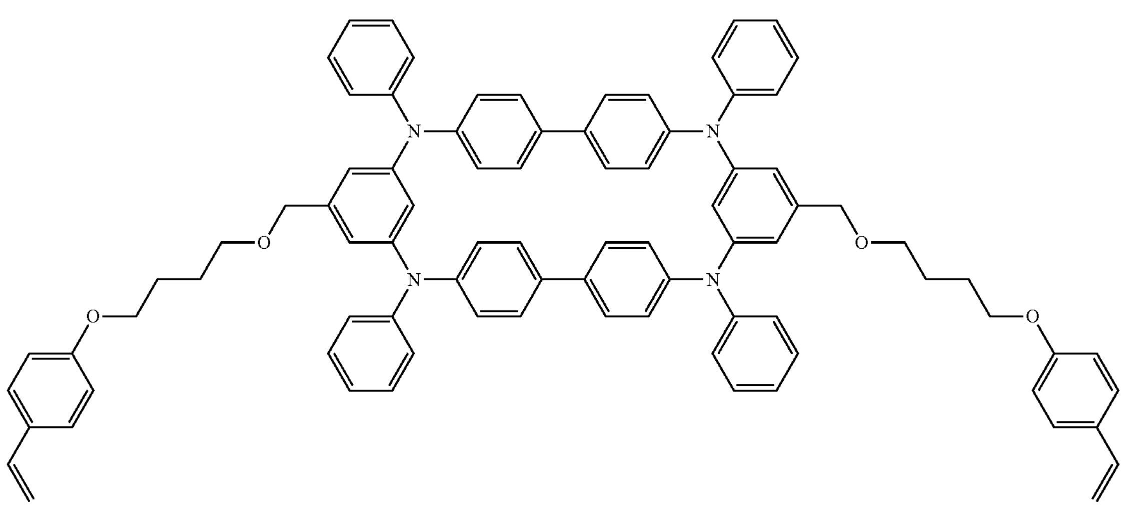

-continued
29
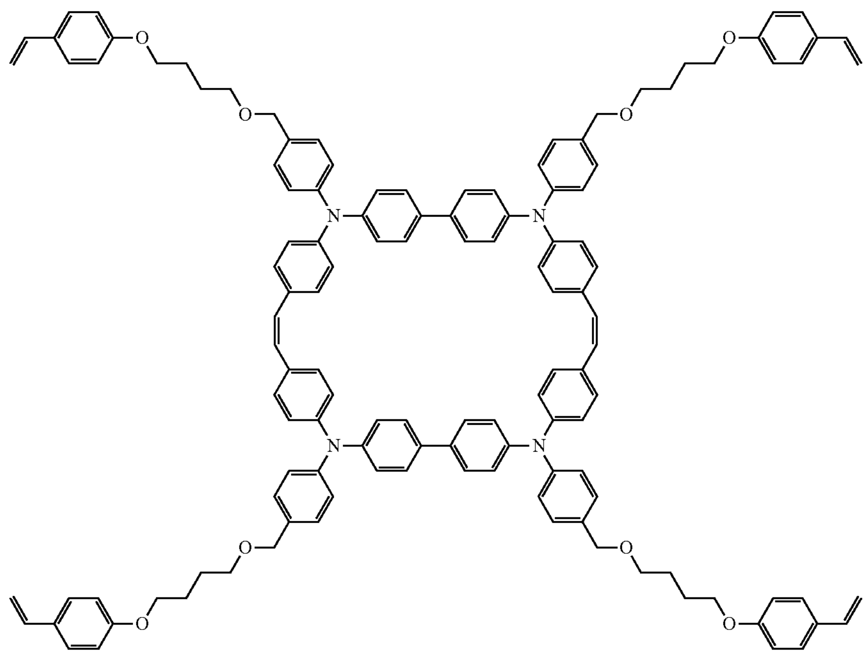
30
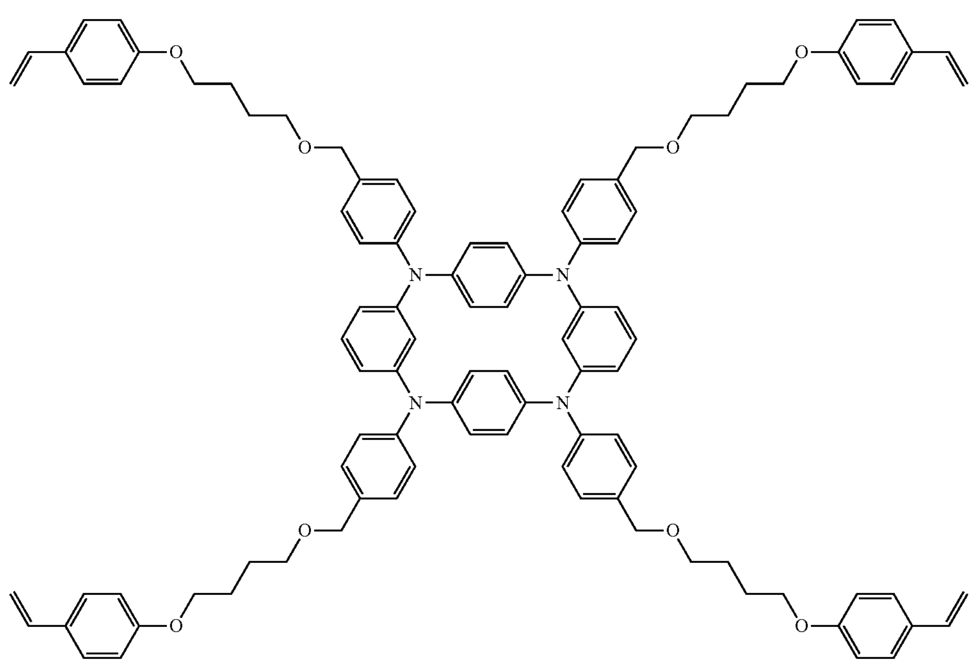

-continued
31
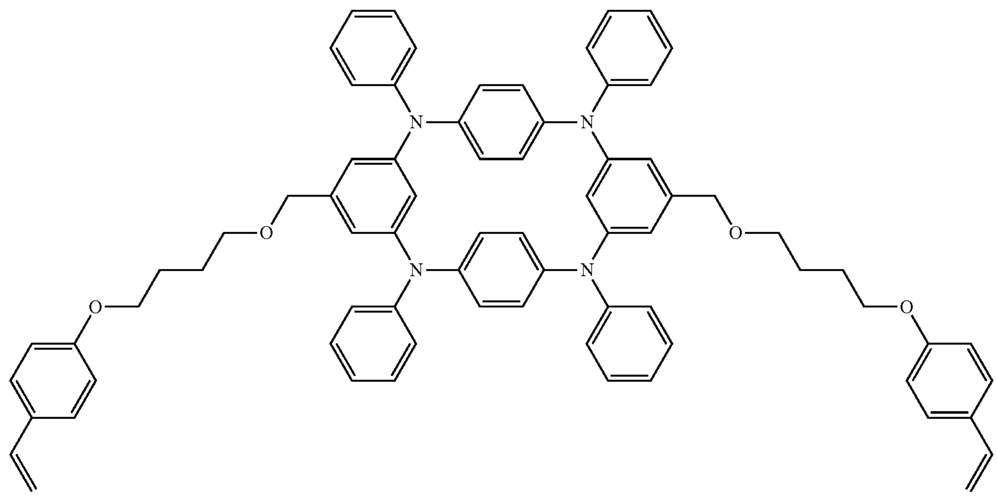
32
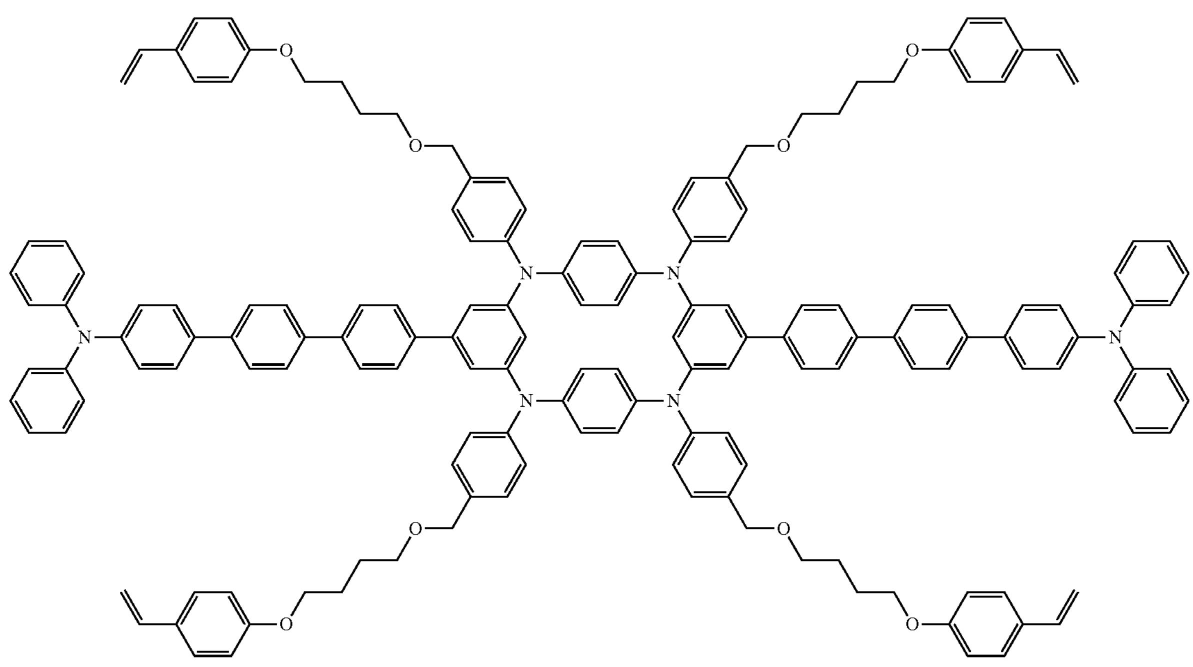

-continued
33
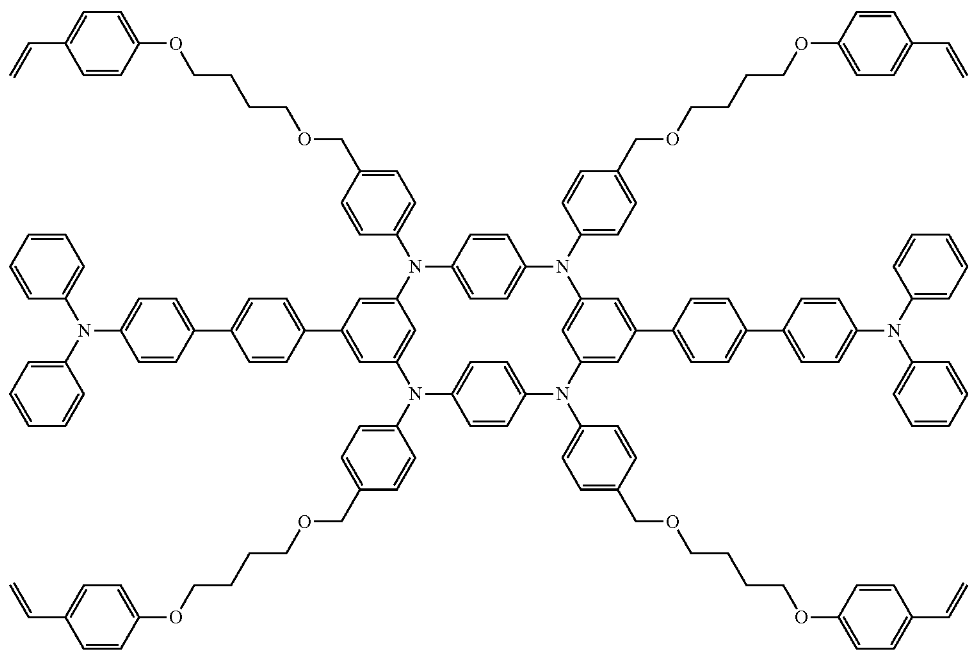
34
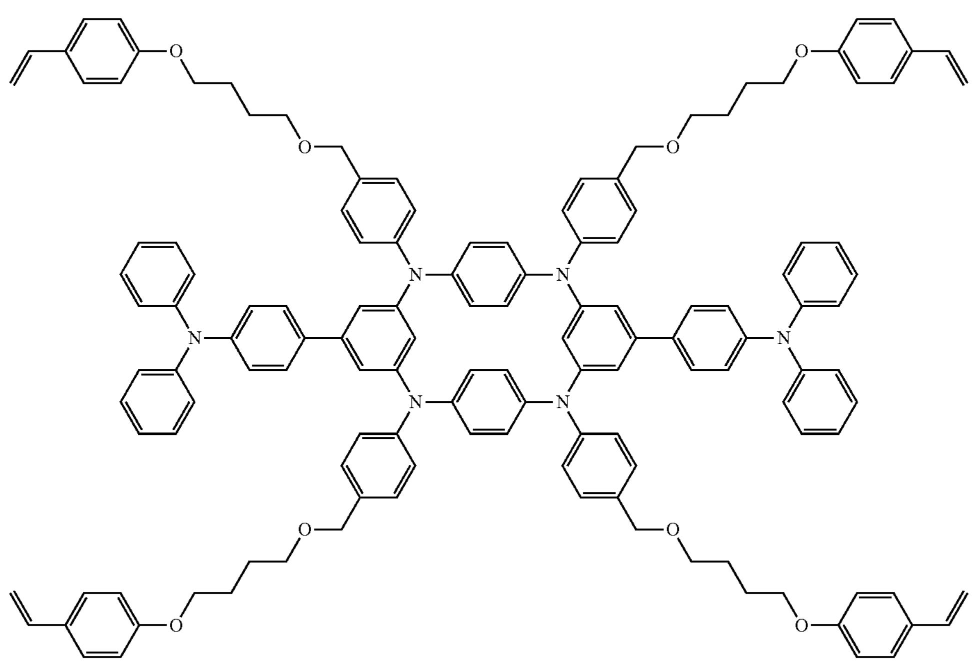

-continued
35
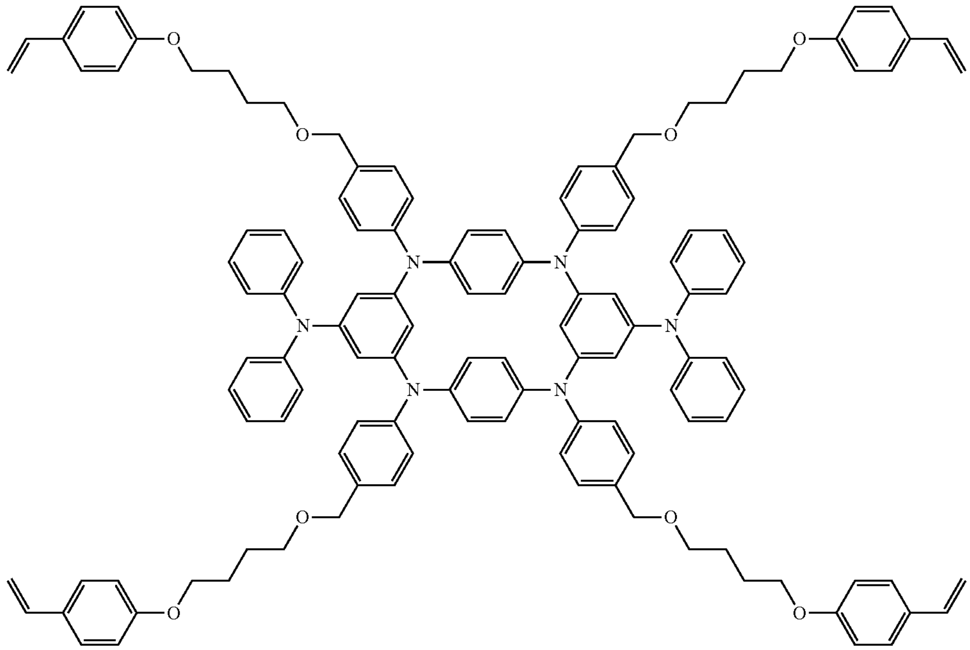
36
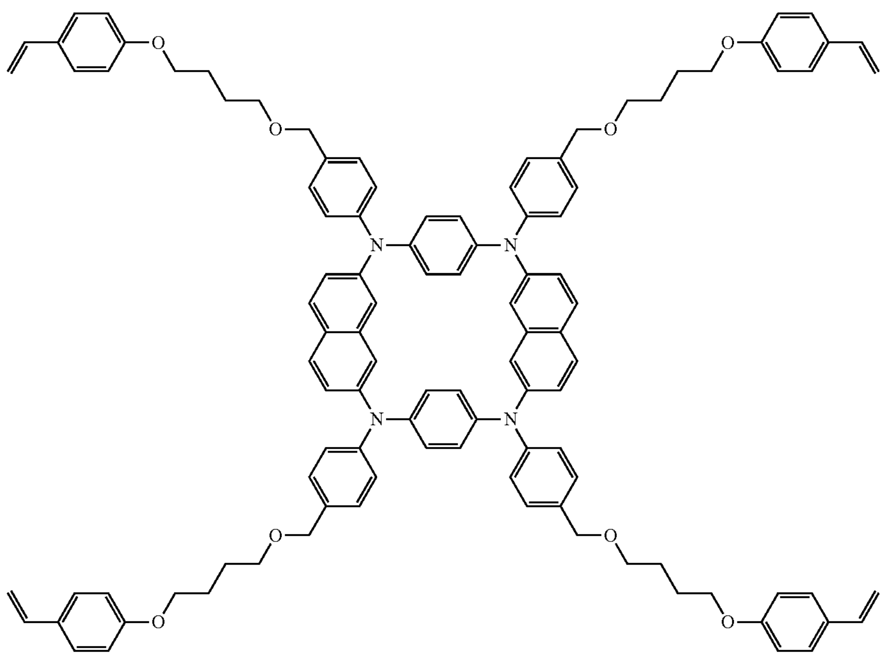
37
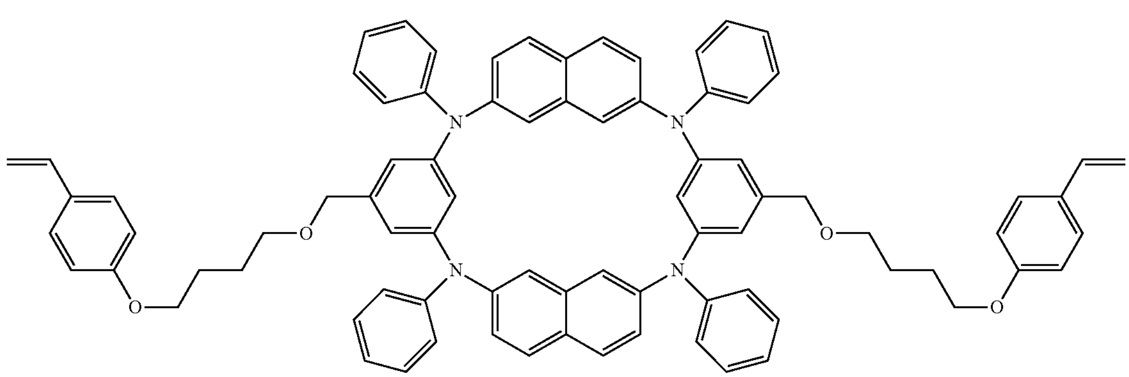

-continued

38

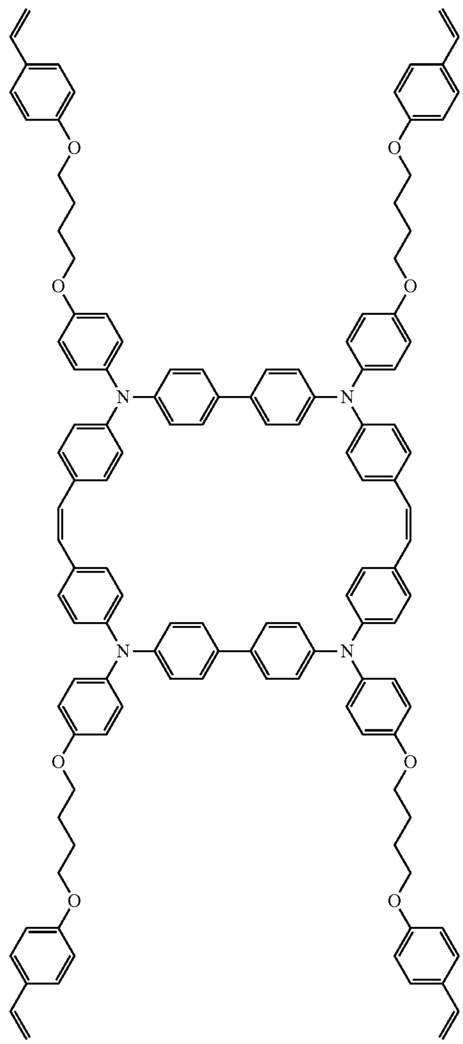

39

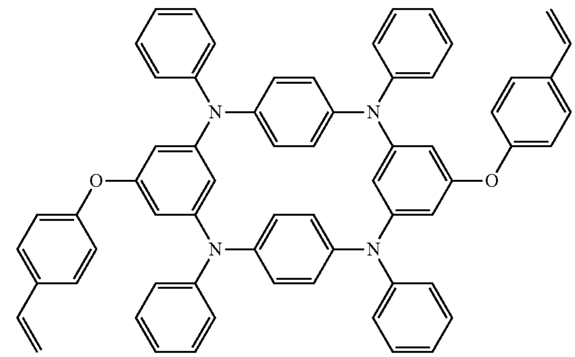

40

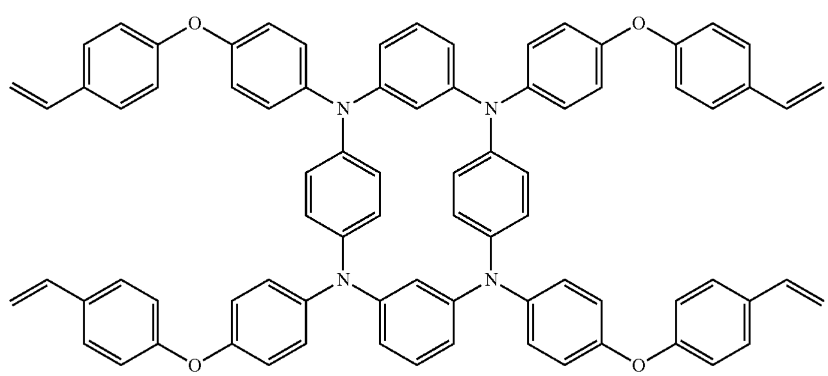

In the cross-linkable arylamine-based compound represented by Formula 1a, two diamine groups are linked via a linker "$(B)_p$" such as a carbocyclic group, a heterocyclic group, or a silane group, thereby allowing the formation of a structurally amorphous thin film (e.g., the cross-linkable arylamine-based compound may be reacted (or cross-linked) to form a thin film that is amorphous (or substantially amorphous)).

In addition, because the cross-linkable arylamine-based compound represented by Formula 1a includes four or more aromatic rings between two arylamine groups, charge mobility may be improved and a driving voltage may be reduced, thereby facilitating the manufacture of an OLED having a low driving voltage.

In addition, the cross-linkable arylamine-based compound represented by Formula 1b has a ring shape. When a hole transport layer is formed by using this feature, a charge mobility may be improved and a driving voltage may be reduced, thereby facilitating the manufacture of an OLED having a low driving voltage.

In one embodiment, the cross-linkable arylamine-based compound may be cross-linked to form an arylamine-based polymer.

In one embodiment, the arylamine-based polymer may have a weight average molecular weight of about 3,000 g/mol or more. The polymer may include an oligomer condensed with two cross-linkable arylamine-based compounds or a polymer condensed with two or more cross-linkable arylamine-based compounds.

The arylamine-based polymer may include a repeating unit represented by Formula 11, or may be formed by cross-linking the cross-linkable arylamine-based compound represented by Formula 1b:

Formula 11

$$*'—A_{11}—(B)_p—A_{12}—*''$$

Formula 11-1

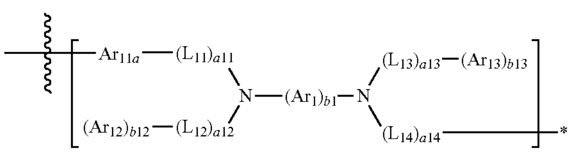

Formula 11-2

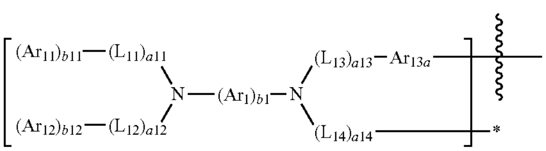

Formula 1b

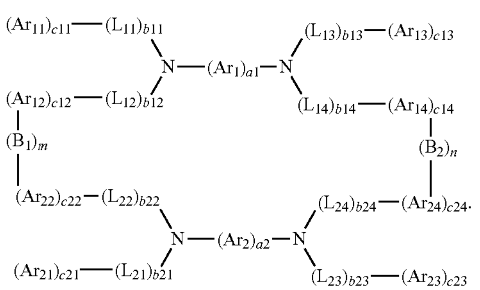

In Formula 11, $A_{11}$ and $A_{12}$ may each independently be selected from groups represented by Formulae 11-1 and 11-2, and $A_{11}$ and $A_{12}$ may be identical to or different from each other, in Formula 11-1, * indicates a binding site to $(B)_p$, in Formulae 11, 11-1, and 11-2, *', *", and

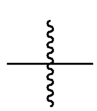

each indicate a binding site to a neighboring repeating unit, in Formulae 11-1 and 11-2, $Ar_{11a}$ and $Ar_{13a}$ may each be a residue after cross-linking, and the repeating units may be linked by a divalent cyclobutene group, in Formula 11, B and p may each independently be the same as described herein above, in Formulae 11-1 and 11-2, $Ar_{11a}$ and $Ar_{13a}$ may each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and in Formulae 11-1 and 11-2, $L_{11}$ to $L_{14}$, a11 to a14, b11 to b13, $Ar_1$, and b1 may each independently be the same as described herein above.

The term "residue after cross-linking," as used herein, refers to a residue after a cross-linkable group included in one repeating unit is linked to a cross-linkable group included in another repeating unit.

In one embodiment, the arylamine-based polymer may be formed by linking at least two types (or kinds) of repeating units, and the termini (for example, an ethylene group) of the cross-linking group in the repeating unit reacts with each other to form a ring-type linker, for example, a cyclobutane group. For example, the repeating units may be linked by a divalent cyclobutane group.

In one or more embodiments, the arylamine-based polymer may be formed through cross-linking of the cross-linkable arylamine-based compounds. The arylamine-based polymer may be a polymer in which the cross-linkable arylamine-based compound is radially or linearly cross-linked. At this time, the termini (for example, an ethylene group) of the cross-linking group in the cross-linkable arylamine-based compounds may react with each other to form a ring-type linker, for example, a cyclobutane group. For example, in some embodiments a terminal group (e.g., an ethylenyl group) of one cross-linkable arylamine-based compound reacts with a terminal group (e.g., an ethylenyl group) of another cross-linkable arylamine-based compound to form the ring-type linker (e.g., a cyclobutyl group) to cross-link the cross-linkable arylamine-based compounds and form the arylamine-based polymer.

In Formulae 11-1 and 11-2, $Ar_{11a}$ and $Ar_{13a}$ may each independently be selected from groups represented by Formulae 5-1 to 5-8, but embodiments of the present disclosure are not limited thereto:

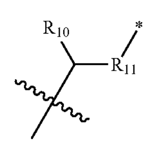

5-1

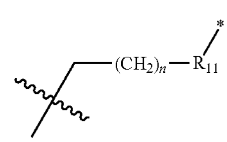

5-2

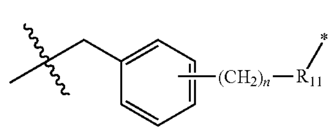

5-3

-continued 5-4

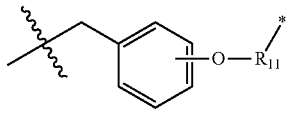

5-5

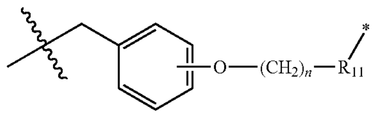

5-6

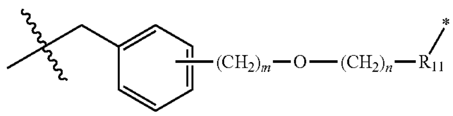

5-7

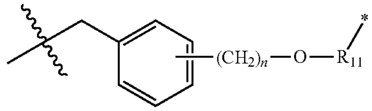

5-8

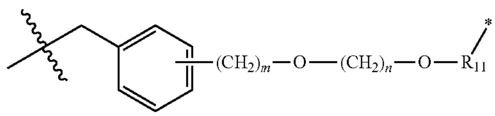

In Formulae 5-1 to 5-8, $R_{10}$ may be a hydrogen atom or a substituted or unsubstituted $C_1$-$C_{20}$ alkyl group, $R_{11}$ may be selected from a single bond, a substituted or unsubstituted $C_1$-$C_{20}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, m and n may each independently be an integer of 1 to 10,

* indicates a binding site to a neighboring atom, and

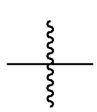

indicates a binding site to a neighboring repeating unit.

In one embodiment, in Formulae 5-1 to 5-8, $R_{11}$ may be a single bond, a substituted or unsubstituted $C_1$-$C_{20}$ alkylene group, a substituted or unsubstituted $C_6$-$C_{60}$ arylene group, or a substituted or unsubstituted $C_1$-$C_{60}$ heteroarylene group, but embodiments of the present disclosure are not limited thereto.

For example, in Formulae 5-1 to 5-8, $R_{11}$ may be a single bond, a substituted or unsubstituted $C_1$-$C_{20}$ alkylene group, or a substituted or unsubstituted $C_6$-$C_{60}$ arylene group.

For example, in Formulae 5-1 to 5-8, $R_{11}$ may be a single bond, a methylene group, or a phenylene group.

For example, in Formulae 5-1 to 5-8, $R_{11}$ may be a single bond or a methylene group.

For example, in Formulae 5-1 to 5-8, $R_{11}$ may be a methylene group.

In Formulae 11-1 and 11-2, $Ar_1$ may be a benzene group, and b1 may be 4 or 5.

The synthesis method of the arylamine-based polymer obtained from the cross-linkable arylamine-based compounds represented by Formulae 1a and 1b and the arylamine-based polymer represented by Formula 11 through the cross-linking reaction may be readily recognized by those having ordinary skill in the art by referring to Examples provided herein below.

Another aspect of an embodiment provides a light-emitting device including: a first electrode; a second electrode facing the first electrode; and an intermediate layer between the first electrode and the second electrode and including an emission layer, wherein the intermediate layer includes at least one of the arylamine-based polymer.

The expression "(an intermediate layer) includes at least one arylamine-based polymer," as used herein, may include a case in which "(an intermediate layer) includes one identical arylamine-based polymer represented by Formula 11" and a case in which "(an intermediate layer) includes two or more different arylamine-based polymers represented by Formula 11."

For example, the intermediate layer may be formed by cross-linking Compound 1. At this time, Compound 1 may be cross-linked to the emission layer of the light-emitting device (or cross-linked to form the emission layer of the light-emitting device). In one embodiment, the intermediate layer may include Compound 1 and Compound 2 cross-linked to each other. At this time, Compound 1 and Compound 2 may be cross-linked to the same layer (for example, both Compound 1 and Compound 2 may be cross-linked to the emission layer, or may be cross-linked to form the emission layer), or may be cross-linked to different layers (for example, Compound 1 may be cross-linked to the emission layer (or cross-linked to form the emission layer) and Compound 2 may be cross-linked to the electron transport region (or cross-linked to form the electron transport region).

For example, in the intermediate layer, Compound 23 may be radially or linearly cross-linked. In some embodiments, Compound 23 may be cross-linked to the emission layer of the light-emitting device. In one embodiment, the intermediate layer may include Compound 23 and Compound 24 cross-linked to each other, or may include Compound 23 cross-linked to Compound 23 and Compound 24 cross-linked to Compound 24 concurrently (e.g., at the same or substantially the same time). Compound 23 and Compound 24 may be cross-linked to the same layer (for example, Compound 23 and Compound 24 may be cross-linked to each other, or may be cross-linked to the emission layer), or may be cross-linked to different layers (for example, Compound 23 may be cross-linked to the emission layer and Compound 24 may be cross-linked to the electron transport region).

In one embodiment, the first electrode of the light-emitting device may be an anode, the second electrode of the light-emitting device may be a cathode, and the intermediate layer may include i) a hole transport region between the first electrode and the emission layer and including a hole injection layer, a hole transport layer, a buffer layer, an electron blocking layer, or any combination thereof and ii) an electron transport region between the emission layer and the second electrode and including a hole blocking layer, an electron transport layer, an electron injection layer, or any combination thereof.

In one embodiment, the hole transport region may include at least one of the arylamine-based polymer.

For example, the hole transport region may include a hole injection layer and a hole transport layer, and the hole transport layer may include at least one of the arylamine-based polymer.

The term "intermediate layer," as used herein, refers to a single layer and/or a plurality of layers between the first electrode and the second electrode of the light-emitting device. A material included in the "intermediate layer" may be an organic material and/or an inorganic material.

Description of FIG. 1

FIG. 1 is a schematic view of a light-emitting device 10 according to an embodiment. The organic light-emitting device 10 includes a first electrode 110, an intermediate layer 150, and a second electrode 190.

Hereinafter, the structure of the light-emitting device 10 according to an embodiment and a method of manufacturing the organic light-emitting device 10 will be described in connection with FIG. 1.

First Electrode 110

In FIG. 1, a substrate may be additionally under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering a material for forming the first electrode 110 on the substrate. When the first electrode 110 is an anode, the material for a first electrode may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflectable electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Intermediate Layer 150

The intermediate layer 150 is on the first electrode 110. The intermediate layer 150 may include an emission layer.

The intermediate layer 150 may further include a hole transport region between the first electrode 110 and the emission layer, and an electron transport region between the emission layer and the second electrode 190.

Hole Transport Region in Intermediate Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in this stated order, but the structure of the hole transport region is not limited thereto.

The hole transport region may include the compound represented by Formula 1a or 1b, the arylamine-based polymer represented by Formula 11, which is a cross-linked product of the compound represented by Formula 1a or 1b, and/or a cross-linked product of the compound represented by Formula 1b.

A thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, and for example, about 100 Å to about 1,000 Å, and the thickness of the hole transport layer may be in a range of about 50 Å to about 2,000 Å, and for example, about 100 Å to about 1500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described herein above.

[p-Dopant]

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) energy level of less than −3.5 eV.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,12-hexaazatriphenylene-hexacarbonitrile (HAT-CN); and a compound represented by Formula 221 below:

but embodiments of the present disclosure are not limited thereto:

Formula 221

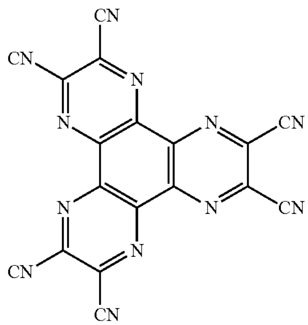

HAT-CN

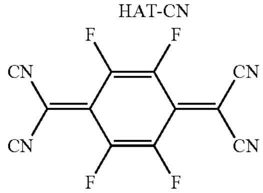

F4-TCNQ

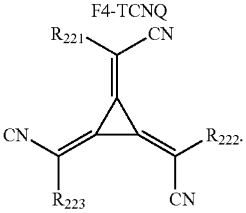

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that at least one selected from $R_{221}$ to $R_{223}$ has at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Intermediate Layer 150

When the light-emitting device 10 is a full-color light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include at least one selected from an organic compound and a semiconductor compound, but embodiments of the present disclosure are not limited thereto. For example, when the emission layer includes an organic compound, the light-emitting device may be referred to as an organic light-emitting device.

In more detail, the organic compound may include a host and a dopant.

In more detail, the semiconductor compound may be a quantum dot, and in this regard, the light-emitting device may be referred to as a quantum-dot light-emitting device.

In one embodiment, the semiconductor compound may be an organic and/or inorganic perovskite.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Organic Light-Emitting Device

The emission layer in the organic light-emitting device may include a host and a dopant. The dopant may include at least one selected from a phosphorescent dopant and a fluorescent dopant.

In the emission layer, an amount of the dopant material may be in a range of about 0.01 parts by weight to about 15 parts by weight based on 100 parts by weight of the host material, but embodiments of the present disclosure are not limited thereto.

Quantum-Dot Light-Emitting Device

The quantum-dot light-emitting device may include a quantum dot. For example, the quantum-dot light-emitting device may include a quantum-dot emission layer. The quantum-dot emission layer may include a plurality of quantum dots (inorganic nanoparticles) arranged in a single layer or multiple layers.

Host in Emission Layer

In one or more embodiments, the host may include a compound represented by Formula 301 below:

$$[Ar_{301}]_{xb11}\text{-}[(L_{301})_{xb1}\text{-}R_{301}]_{xb21}. \quad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), and —P(═O)($Q_{301}$)($Q_{302}$), xb21 may be an integer from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In Formula 301, when xb11 is two or more, two or more of $Ar_{301}$(s) may be linked via a single bond.

In one or more embodiments, the compound represented by Formula 301 may be represented by Formula 301-1 or 301-2 below:

Formula 301-1

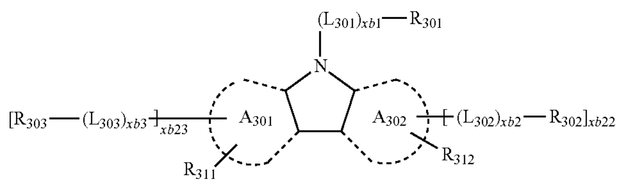

Formula 301-2

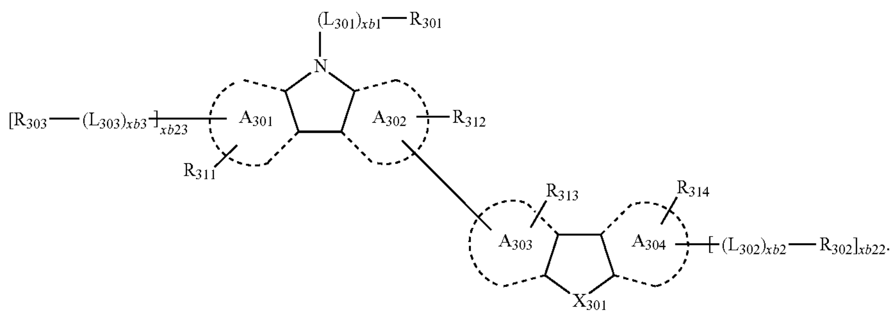

In Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), xb22 and xb23 may each independently be 0, 1, or 2, $L_{301}$, xb1, $R_{301}$, and $Q_{31}$ to $Q_{33}$ may each independently be the same as described herein above, $L_{302}$ to $L_{304}$ may each independently be the same as described in connection with $L_{301}$, xb2 to xb4 may each independently be the same as described in connection with xb1, and $R_{302}$ to $R_{304}$ may each independently be the same as described in connection with $R_{301}$.

For example, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ and $Q_{33}$ may each independently be the same as described herein above.

In one embodiment, in Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ and $Q_{33}$ may each independently be the same as described herein above.

In one or more embodiments, the host may include an alkaline earth metal complex. For example, the host may be selected from a Be complex (for example, Compound H55), a Mg complex, and a Zn complex.

The host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but embodiments of the present disclosure are not limited thereto:

H1

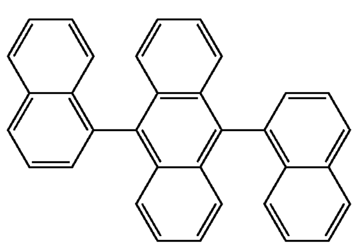

-continued

H2

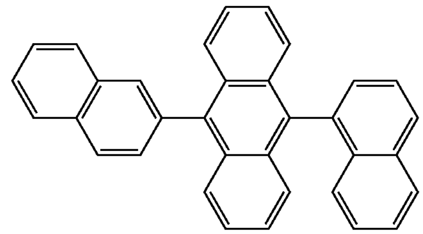

H3

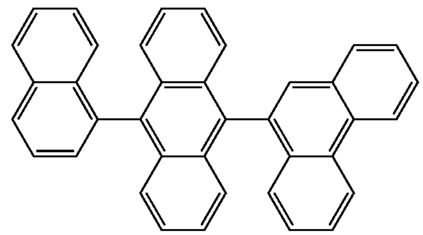

H4

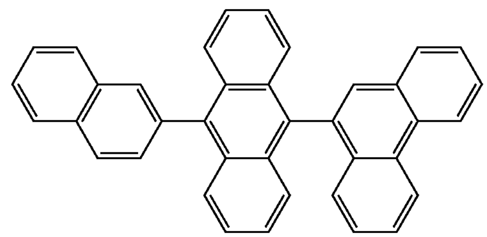

H5

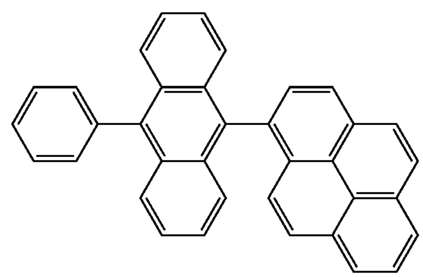

H6

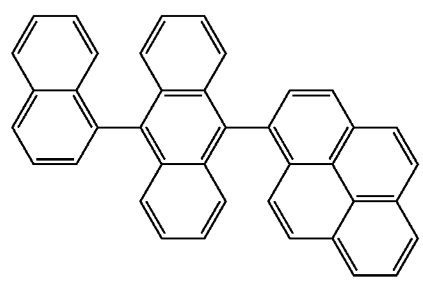

H7

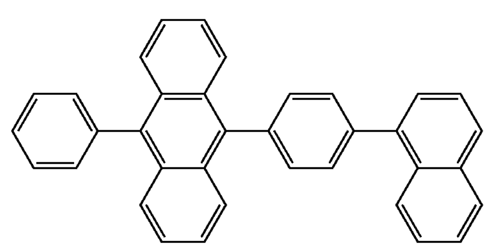

-continued
H8
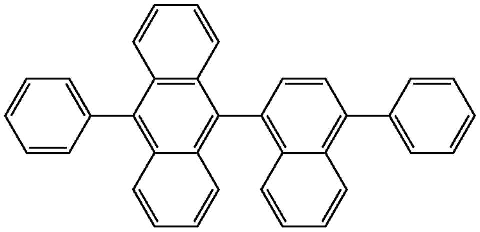
H9
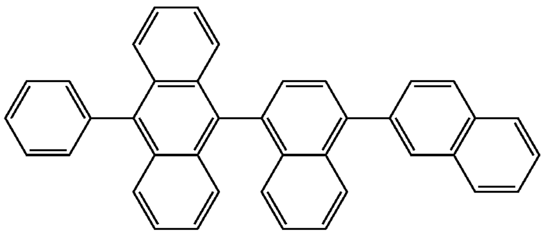
H10
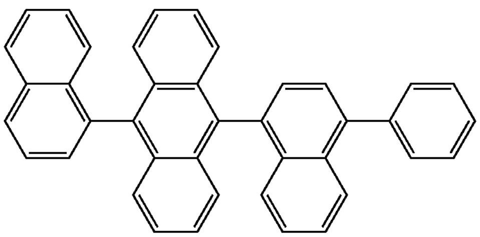
H11
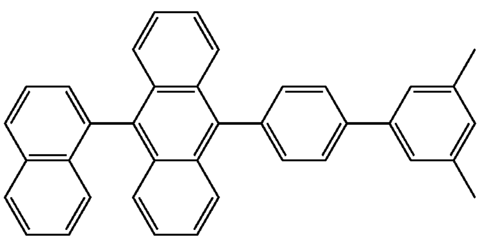
H12
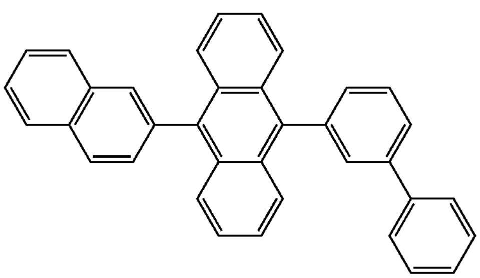
H13
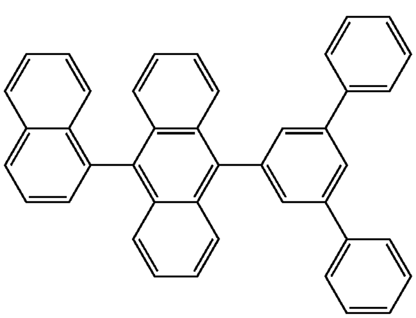
-continued
H14
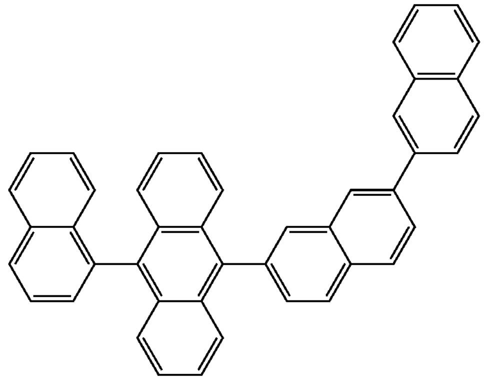
H15
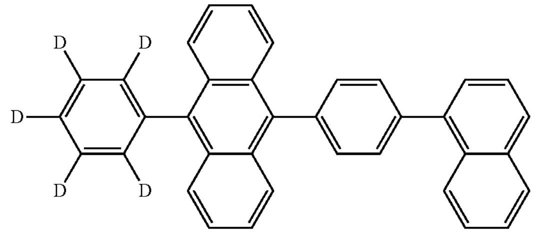
H16
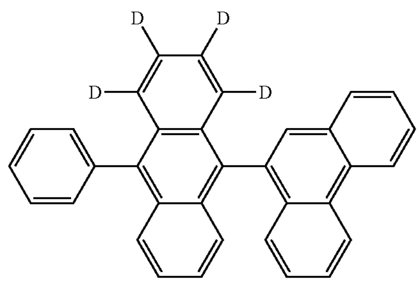
H17
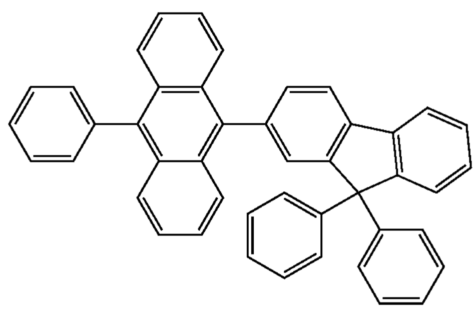
H18
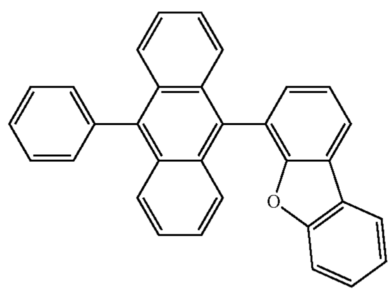

-continued
H19
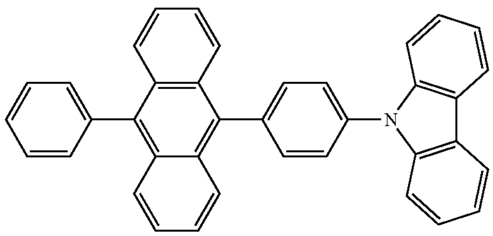
H20
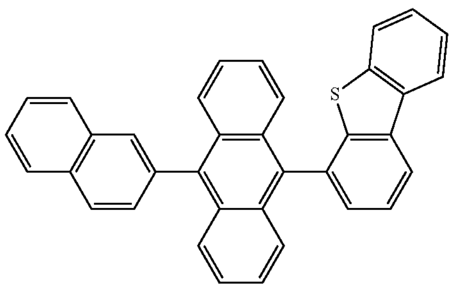
H21
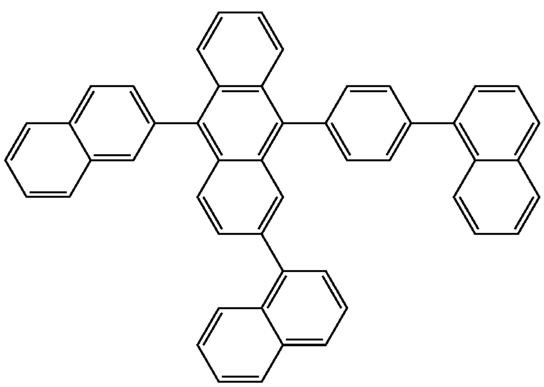
H22
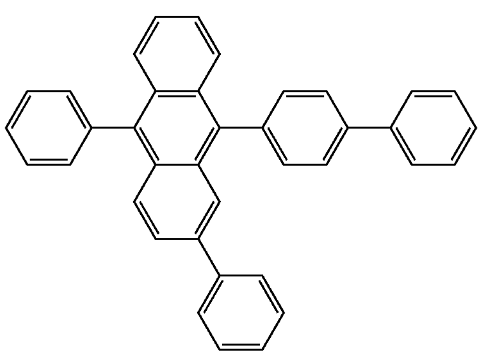
-continued
H23
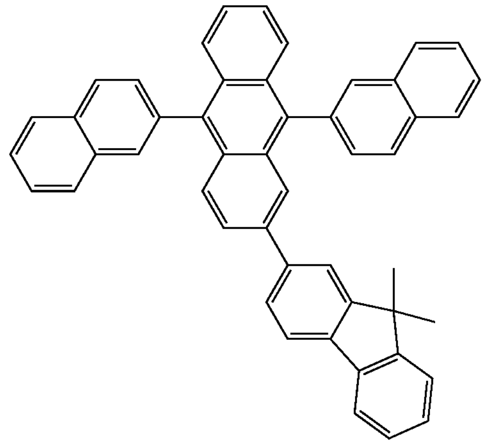
H24
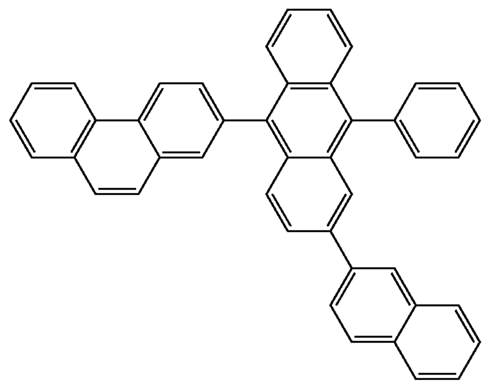
H25
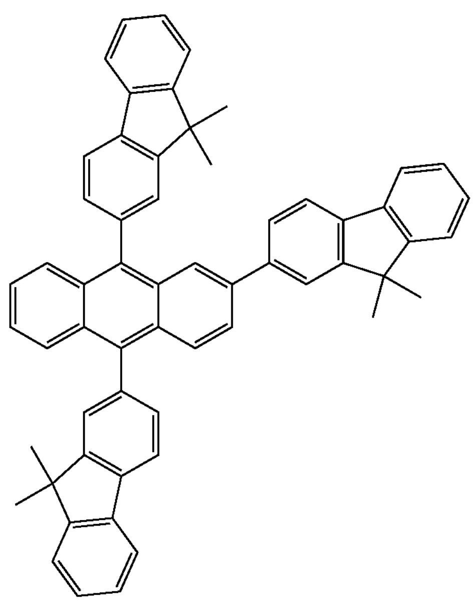

-continued
H26
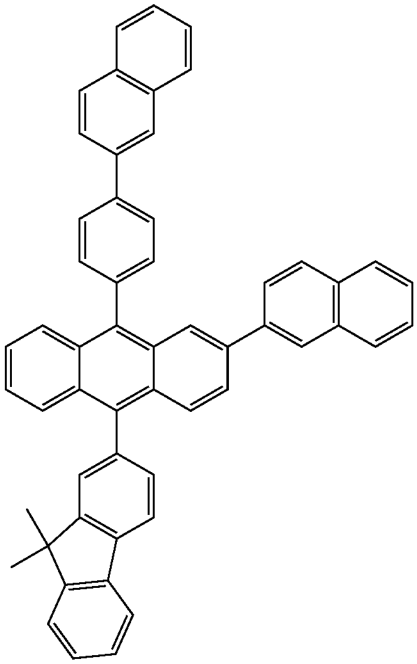
H27
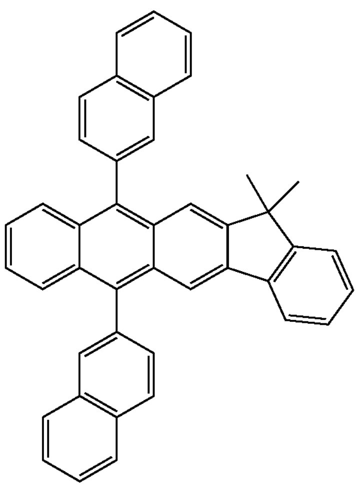
H28
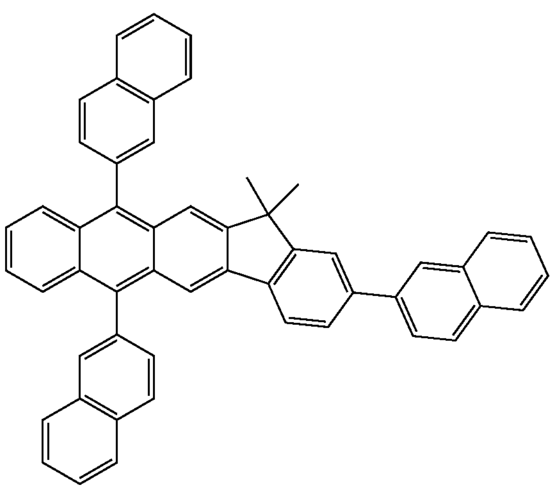
-continued
H29
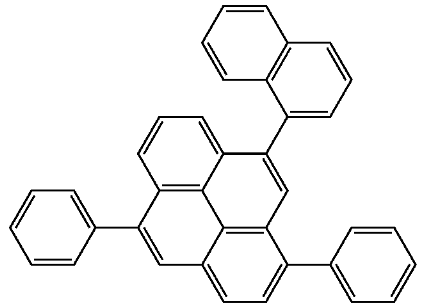
H30
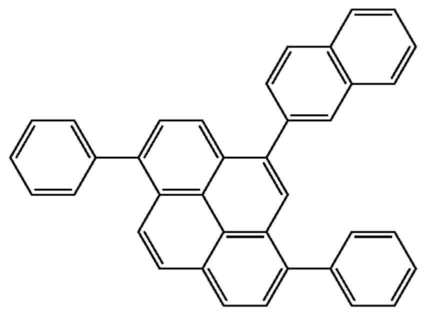
H31
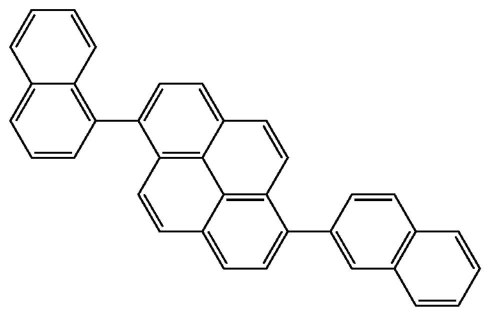
H32
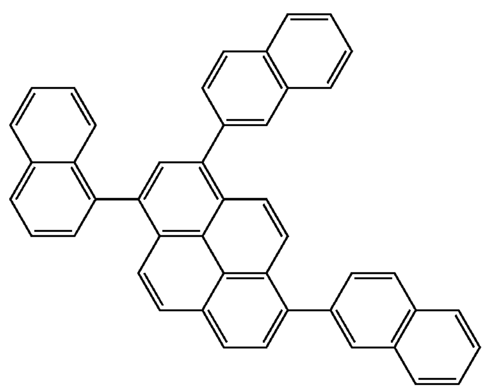
H33
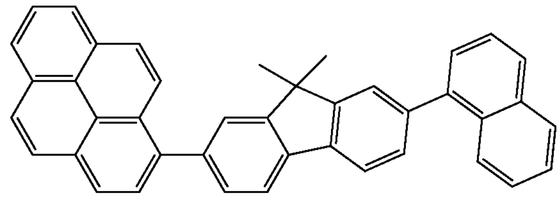

-continued
H34
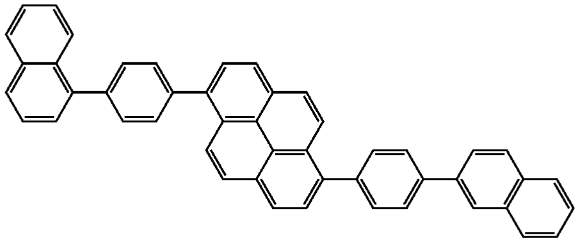
H35
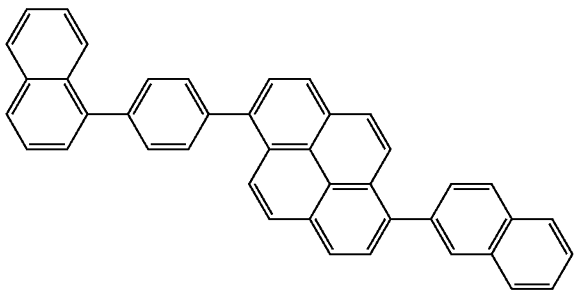
H36
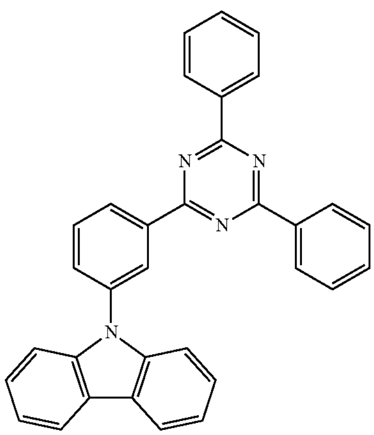
H37
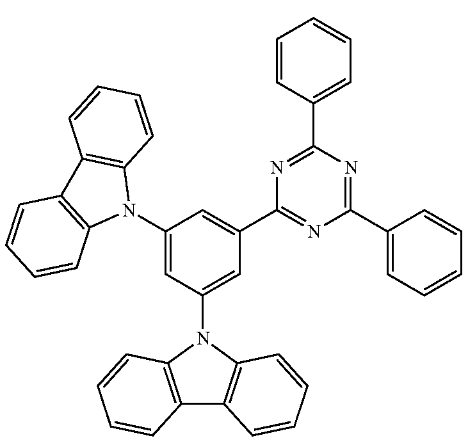
-continued
H38
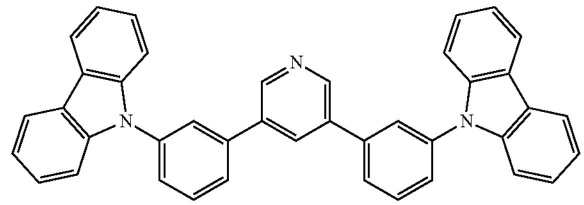
H39
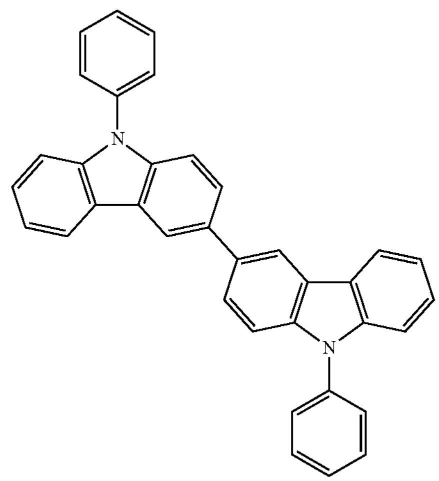
H40
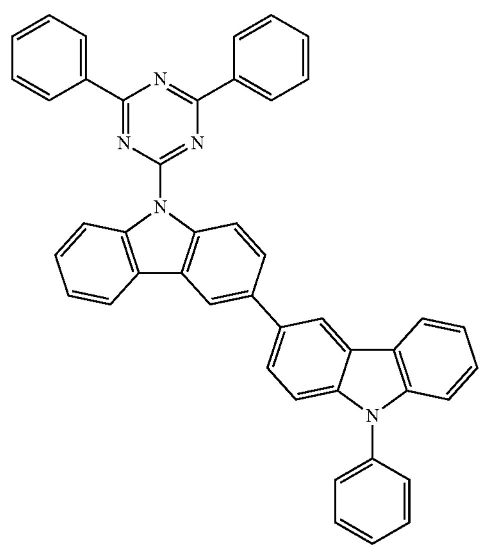

H41
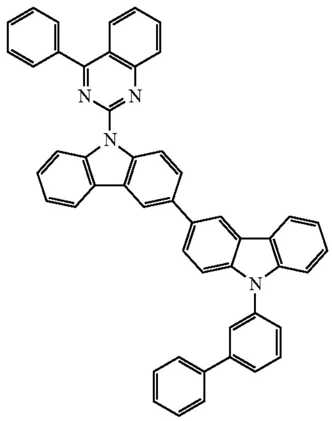
H42
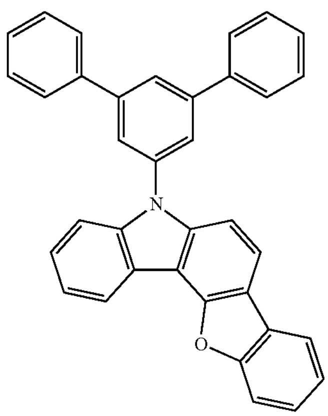
H43
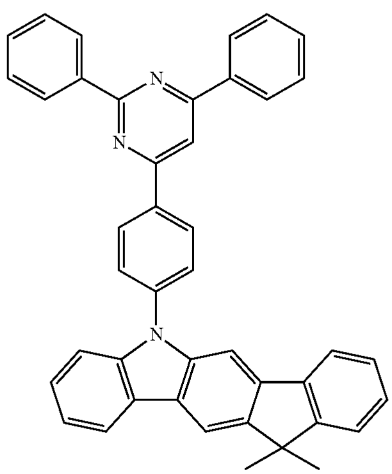
H44
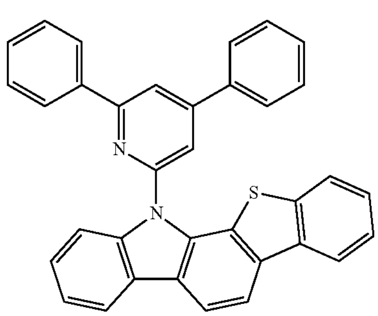
H45
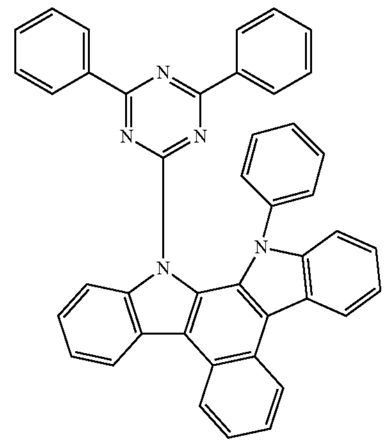
H46
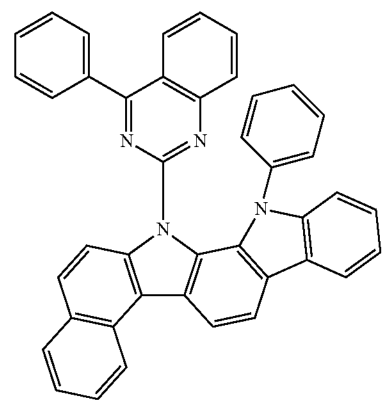
H47
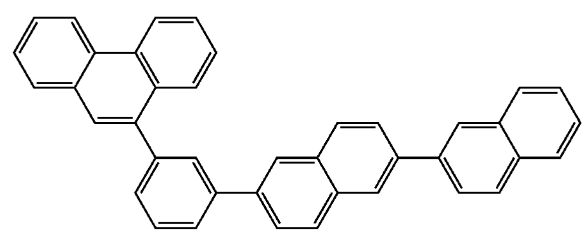
H48
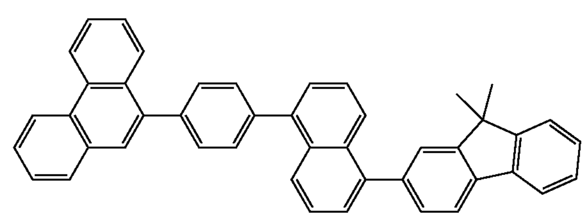
H49
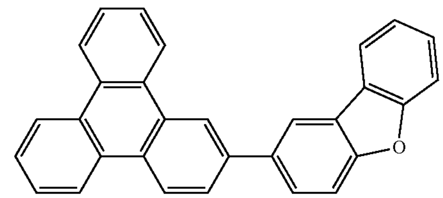

-continued

H50

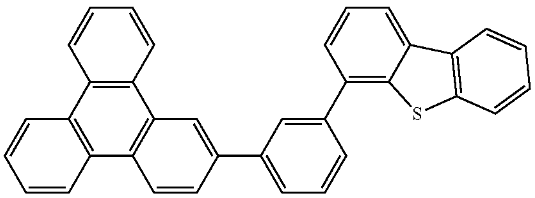

H51

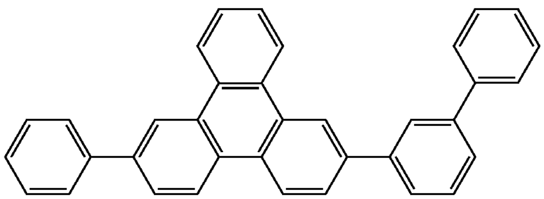

H52

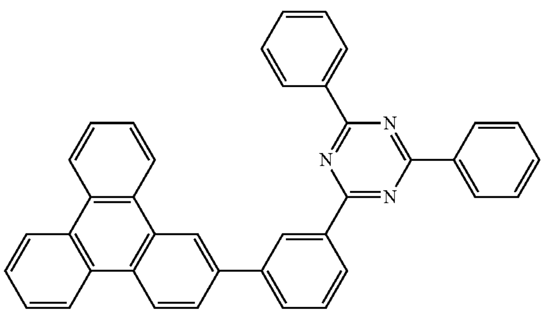

H53

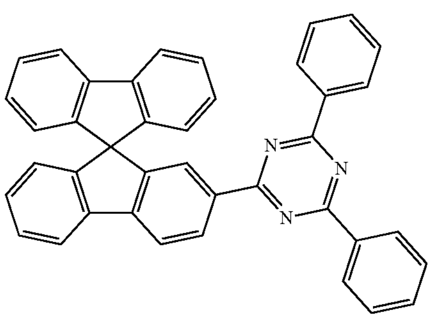

H54

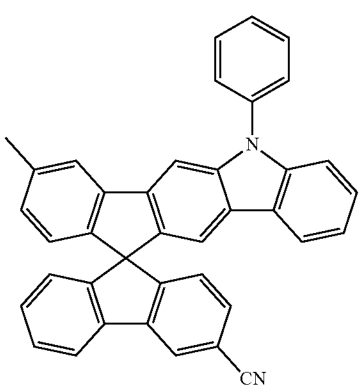

-continued

H55

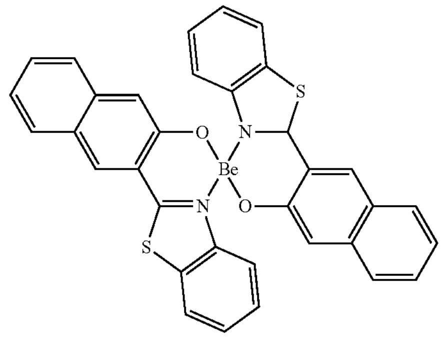

In one embodiment, the host may include at least one selected from a silicon-containing compound (for example, BCPDS used in the following examples or the like) and a phosphine oxide-containing compound (for example, POP-CPA used in the following examples or the like).

However, embodiments of the present disclosure are not limited thereto. In one embodiment, the host may include only one compound, or two or more different compounds (for example, a host used in the following examples includes BCPDS and POPCPA).

Phosphorescent Dopant Included in Emission Layer

The phosphorescent dopant may include an organometallic complex represented by Formula 401 below:

Formula 401

$$M(L_{401})_{xc1}(L_{402})_{xc2}$$

Formula 402

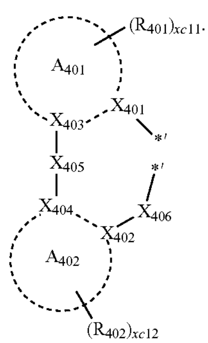

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is two or more, two or more $L_{401}$(s) may be identical to or different from each other, $L_{402}$ may be an organic ligand, and xc2 may be an integer from 0 to 4, wherein, when xc2 is two or more, two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be selected from a $C_5$-$C_{60}$ carbocyclic group or a $C_1$-$C_{60}$ heterocyclic group, $X_{405}$ may be a single bond, *—O—*', *—S—*', *—C(═O)—*', *—N($Q_{411}$)-*', *—C($Q_{411}$)($Q_{412}$)-*', *—C($Q_{411}$)═C($Q_{412}$)-*', *—C($Q_{411}$)═*', or *═C═*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 each indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may each be nitrogen at the same time.

In one or more embodiments, $R_{401}$ and $R_{402}$ in Formula 401 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but are not limited thereto.

In one or more embodiments, when xc1 in Formula 401 is two or more, two $A_{401}$(s) in two or more $L_{401}$(s) may optionally be linked via $X_{407}$, which is a linking group, or two $A_{402}$(s) in two or more $L_{401}$(s) may optionally be linked via $X_{408}$, which is a linking group (see Compounds PD1 to PD4 and PD7). $X_{407}$ and $X_{408}$ may each independently be a single bond, *—O—*', *—S—*', *—C(═O)—*', *—N($Q_{413}$)-*', *—C($Q_{413}$)($Q_{414}$)-*', or *—C($Q_{413}$)═C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(═O), isonitrile, —CN, and a phosphorus-containing material (for example, phosphine or phosphite), but embodiments of the present disclosure are not limited thereto.

In one or more embodiments, the phosphorescent dopant may be selected from, for example, Compounds PD1 to PD25, but embodiments of the present disclosure are not limited thereto:

-continued
PD1
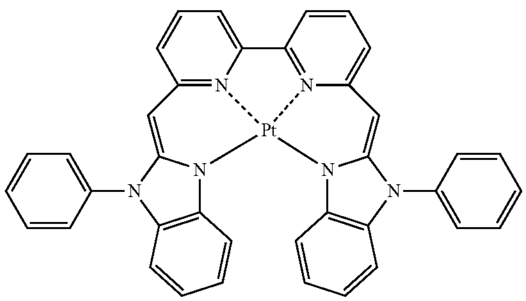
PD2
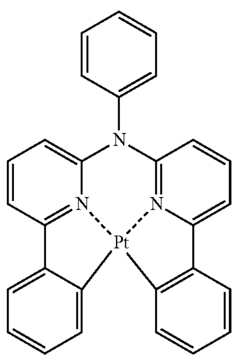
PD3
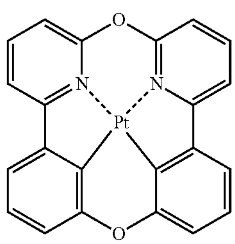
PD4
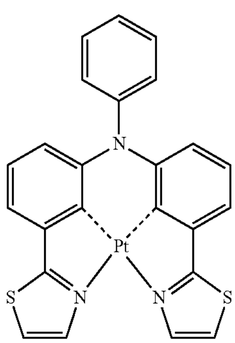
PD5
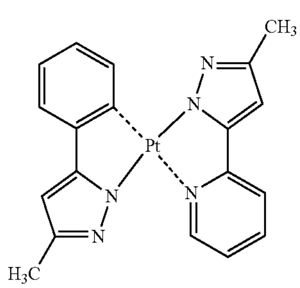
PD6
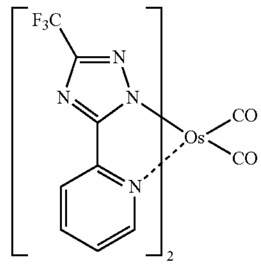
PD7
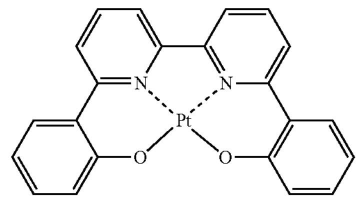
PD8
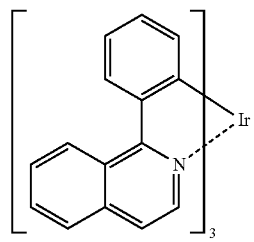
PD9
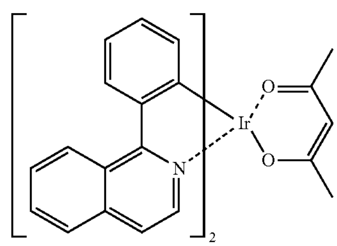
PD10
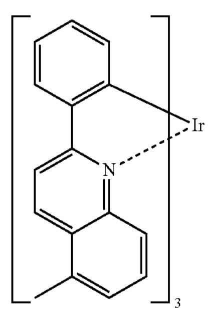
PD11
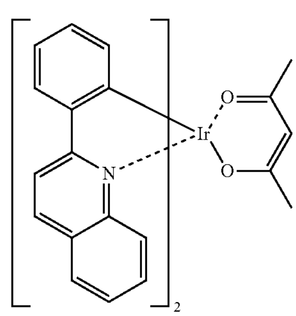

-continued
PD12
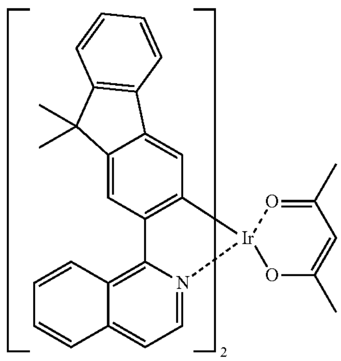
PD13
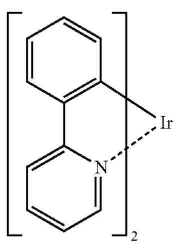
PD14
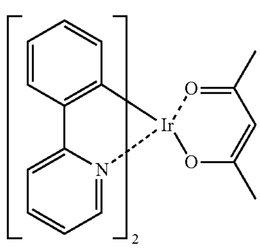
PD15
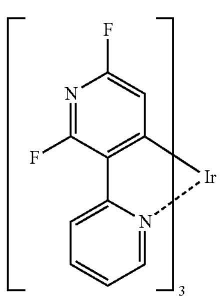
PD16
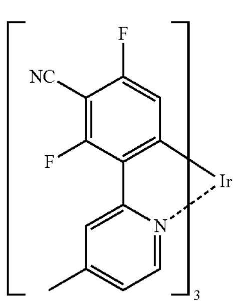
-continued
PD17
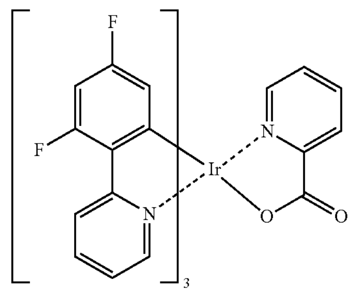
PD18
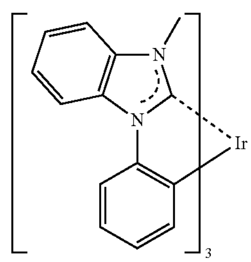
PD19
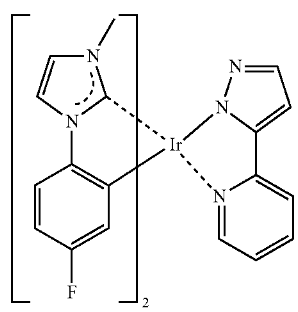
PD20
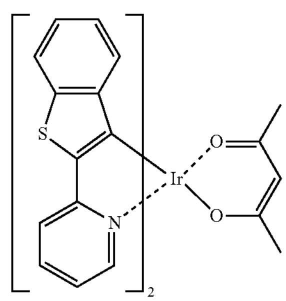
PD21
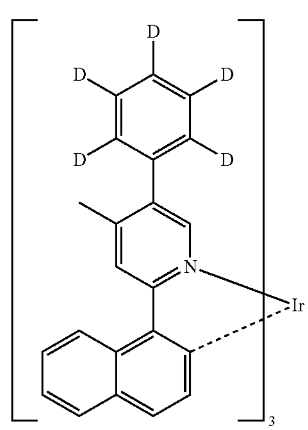

-continued

PD22

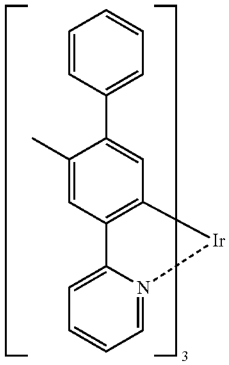

PD23

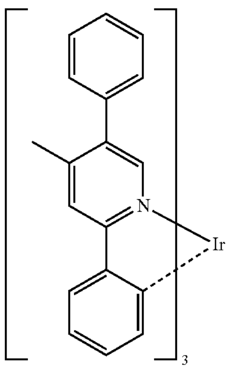

PD24

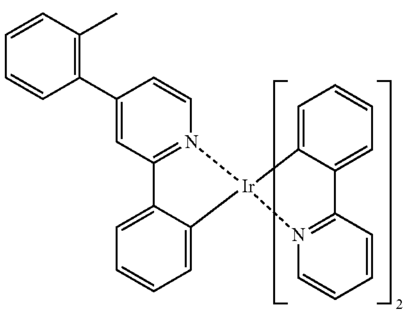

PD25

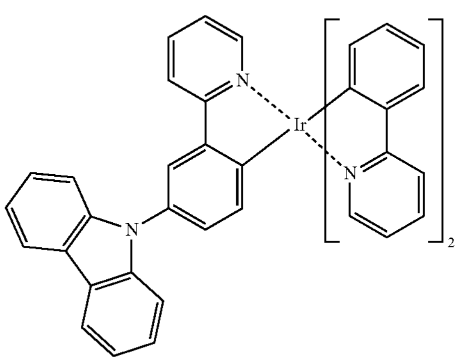

Fluorescent Dopant in Emission Layer

The fluorescent dopant may include an arylamine compound or a styrylamine compound.

The fluorescent dopant may include a compound represented by Formula 501 below:

Formula 501

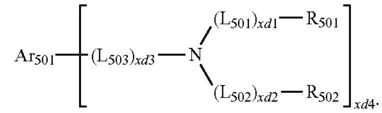

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer of 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer of 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD22:

FD1

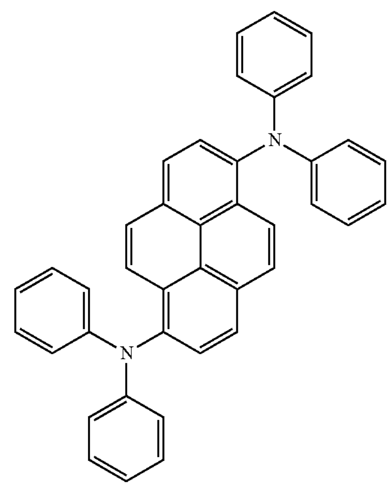

FD2

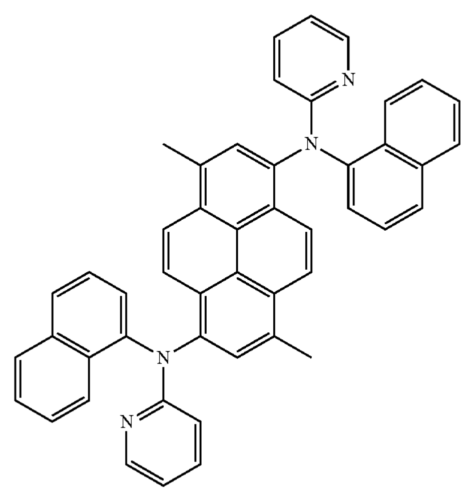

FD3
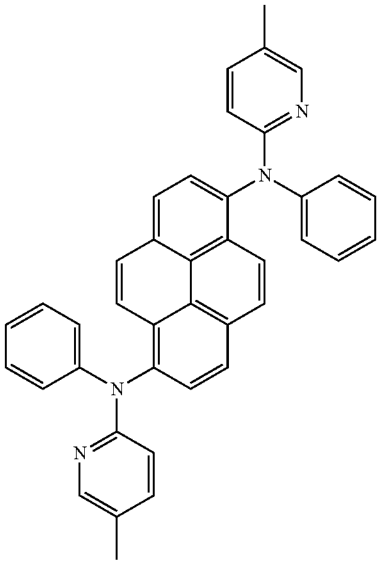
FD4
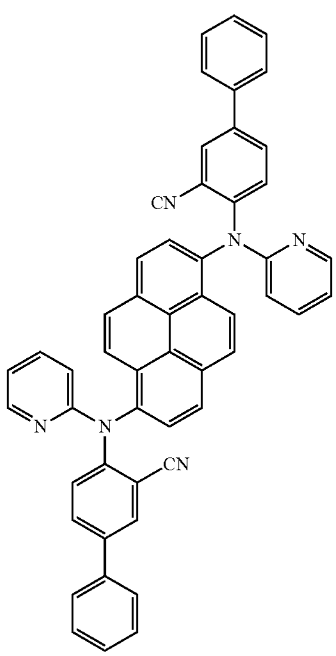
FD5
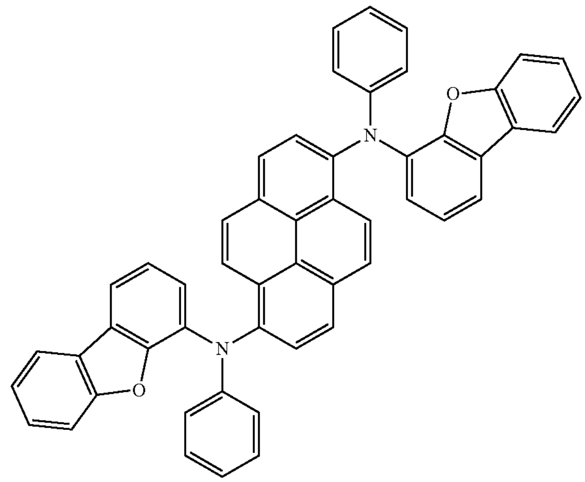
FD6
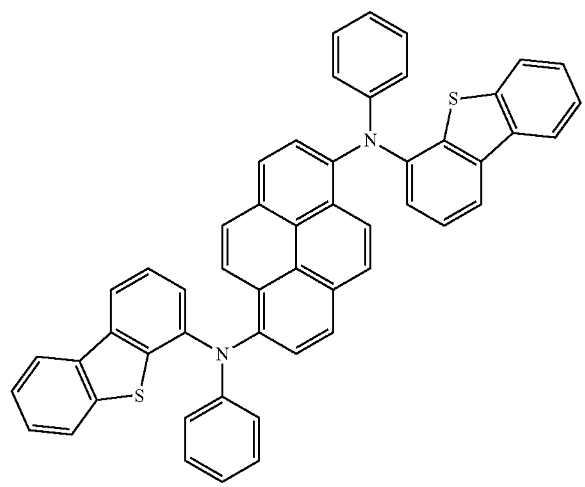
FD7
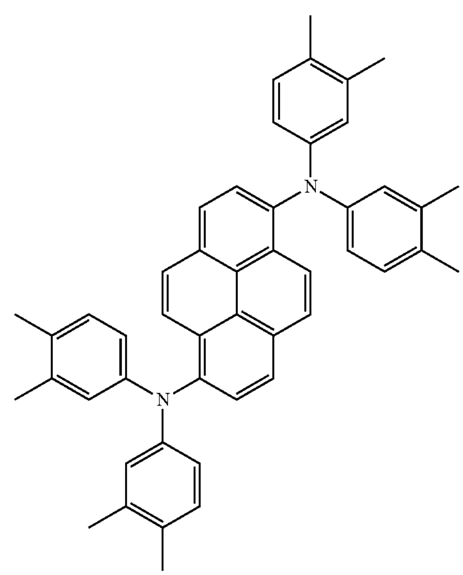

-continued
FD8
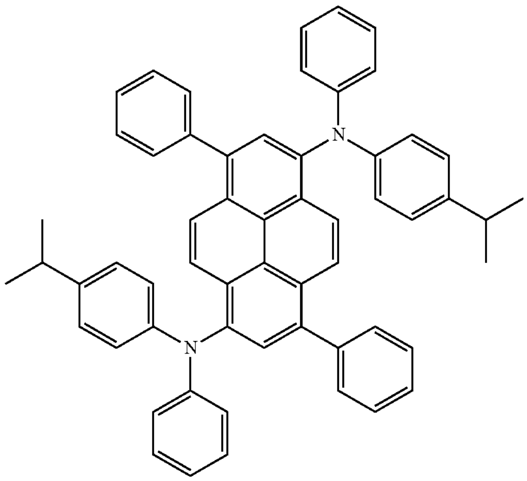
FD9
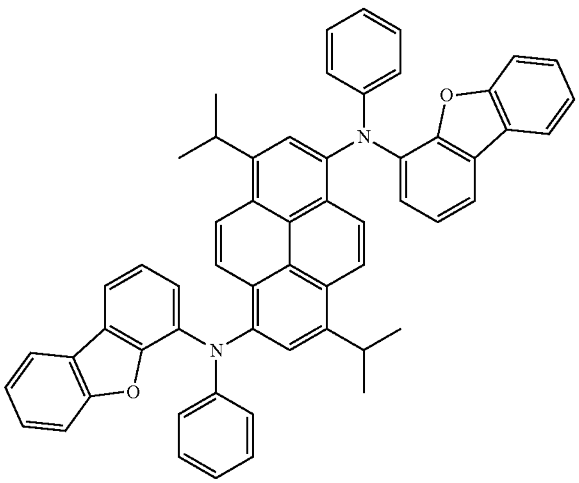
FD10
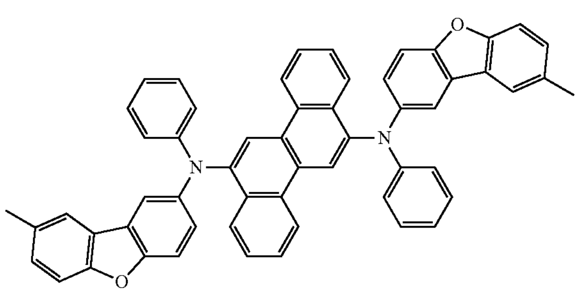
FD11
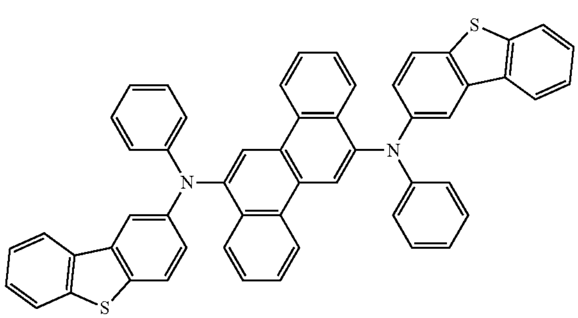
-continued
FD12
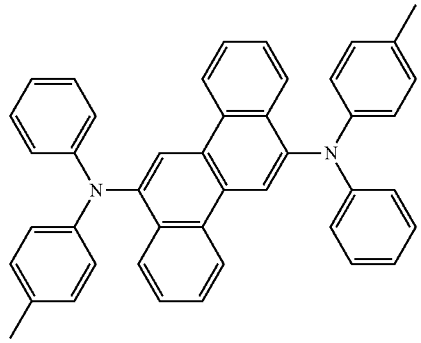
FD13
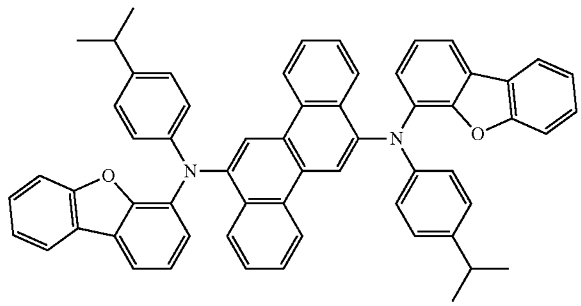
FD14
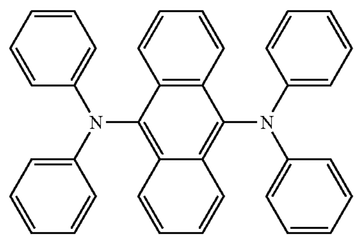
FD15
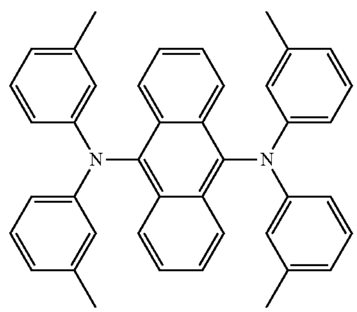
FD16
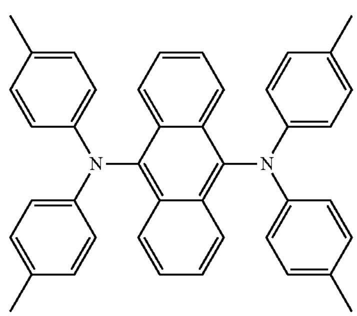

-continued
FD17
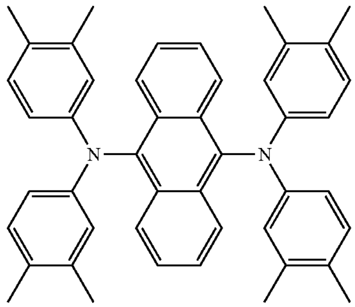
FD18
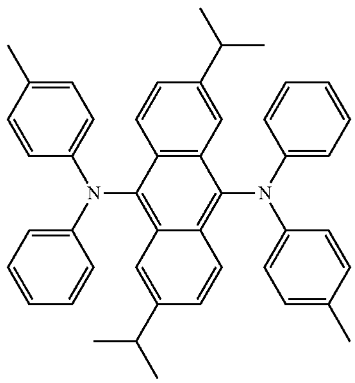
FD19
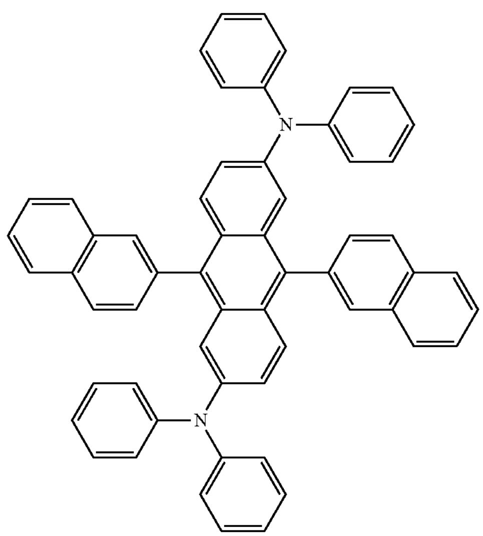
-continued
FD20
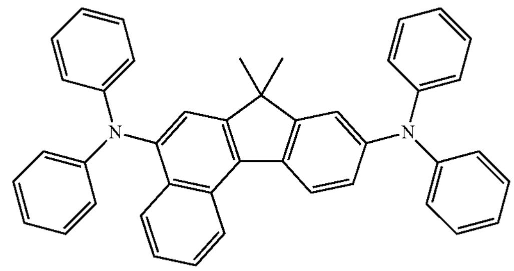
FD21
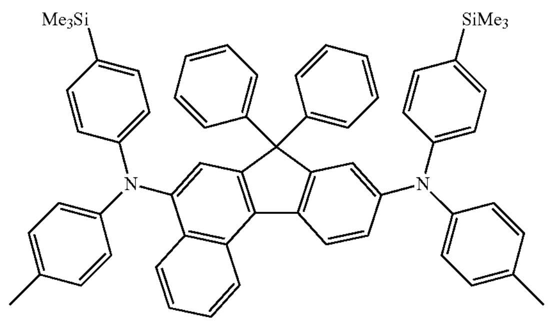
FD22
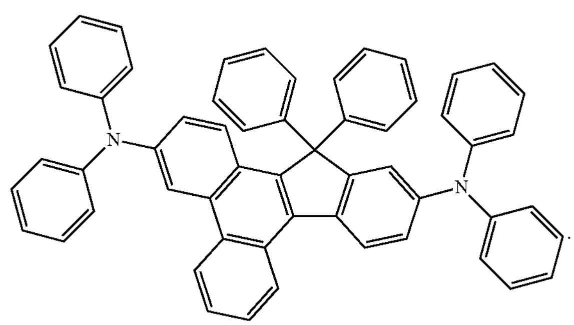
In one or more embodiments, the fluorescent dopant may be selected from the following compounds, but embodiments of the present disclosure are not limited thereto:
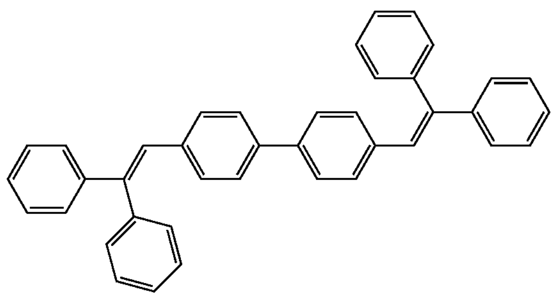
DPVBi -continued

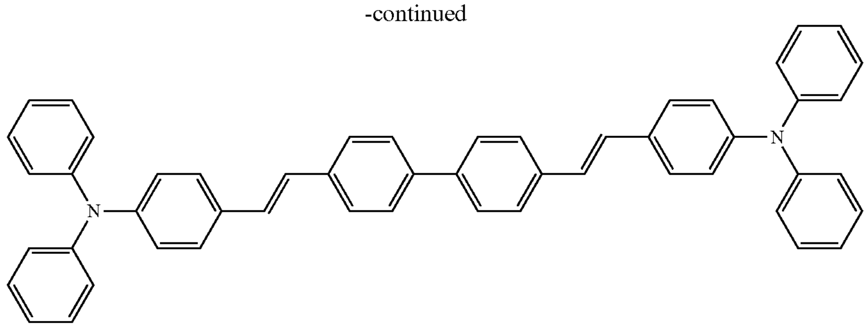

DPAVBi

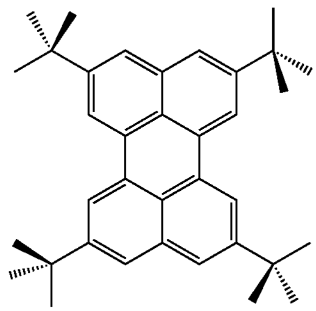

TBPe

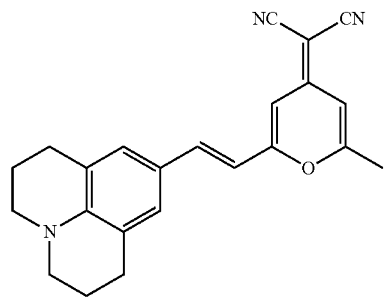

DCM

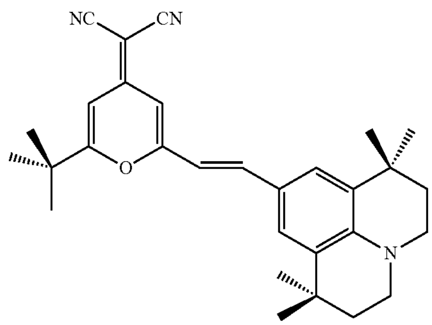

DCJTB

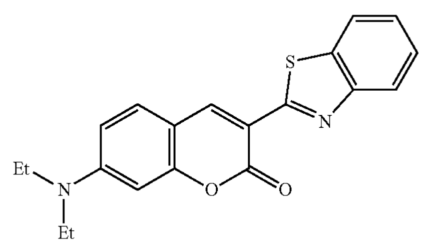

Coumarin 6

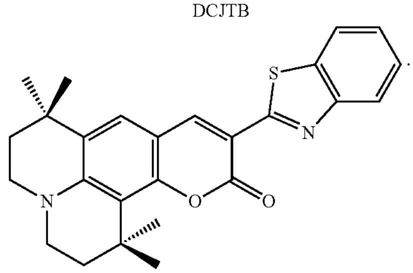

C545T

Quantum Dot

As used herein, the term "quantum dot" refers to a crystal of the semiconductor compound, and may cover all materials that emit emission wavelengths having different lengths according to the size of the crystal. Therefore, a type (or kind) of a compound constituting the quantum dot is not particularly limited. A diameter of the quantum dot is not particularly limited, but may be in a range of, for example, about 1 nm to about 10 nm.

The quantum dots arranged in the quantum-dot emission layer may be synthesized by a wet chemical process, an organometallic chemical vapor deposition process, a molecular beam epitaxy process, or a similar process.

The wet chemical process is a method in which a precursor material is added to an organic solvent to grow grain crystals. When the crystal grows, because the organic solvent naturally acts as a dispersant coordinated to the surface of the quantum dot crystal and controls the growth of the crystal, it is possible to control the growth of inorganic nanoparticles through a process that is easier and less expensive than a vapor deposition method such as metal organic chemical vapor deposition (MOCVD) or molecular beam epitaxy (MBE).

In an embodiment, the quantum dot may include a semiconductor material selected from group III-VI semiconductor compounds, group II-VI semiconductor compounds, group III-V semiconductor compounds, group IV-VI semiconductor compounds, group IV elements or compounds, and a combination thereof.

For example, the group III-VI semiconductor compounds may be selected from: a 2-element compound such as $In_2S_3$; and a 3-element compound selected from AgInS, $AgInS_2$, CuInS, $CuInS_2$, and a mixture thereof, but embodiments of the present disclosure are not limited thereto.

For example, the group II-VI semiconductor compounds may be selected from: a 2-element compound selected from CdSe, CdTe, ZnS, ZnSe, ZnTe, ZnO, HgS, HgSe, HgTe, MgSe, MgS, and a mixture thereof; a 3-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a 4-element compound selected from CdZnSeS, CdZnSeTe, CdZnSTe, CdHgSeS, CdHgSeTe, CdHgSTe, HgZnSeS, HgZnSeTe, HgZnSTe, and a mixture thereof, but embodiments of the present disclosure are not limited thereto.

For example, the group III-V semiconductor compounds may be selected from: a 2-element compound selected from GaN, GaP, GaAs, GaSb, AlN, AlP, AlAs, AlSb, InN, InP, InAs, InSb, and a mixture thereof; a 3-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a 4-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but embodiments of the present disclosure are not limited thereto.

For example, the group IV-VI semiconductor compounds may be selected from: a 2-element compound selected from SnS, SnSe, SnTe, PbS, PbSe, PbTe, and a mixture thereof; a 3-element compound selected from SnSeS, SnSeTe, SnSTe, PbSeS, PbSeTe, PbSTe, SnPbS, SnPbSe, SnPbTe, and a mixture thereof; and a 4-element compound selected from SnPbSSe, SnPbSeTe, SnPbSTe, and a mixture thereof, but embodiments of the present disclosure are not limited thereto.

For example, the group IV elements or compounds may be selected from: a single element compound selected from Si, Ge, and a mixture thereof; and a 2-element compound selected from SiC, SiGe, and a mixture thereof, but embodiments of the present disclosure are not limited thereto.

Here, such a 2-element compound, a 3-element compound, or a 4-element compound may be present in particles at a constant concentration, or may be present in the same particles by dividing the concentration distribution into partially different states.

On the other hand, the quantum dot may have a uniform (e.g., substantially uniform) single structure or a core-shell double structure. For example, the core and the shell may include different materials. For example, materials constituting the core and the shell may include different semiconductor compounds.

The shell of the quantum dot may serve as a protective layer for preventing or reducing chemical denaturation of the core to maintain semiconductor characteristics, and/or a charging layer for imparting electrophoretic characteristics to the quantum dots. The shell may have a single-layered structure or a multi-layered structure. An interface between the core and the shell may have a concentration gradient in which the concentration of the element present in the shell is lowered or decreased along a direction toward the center of the core.

Examples of the shell of the quantum dot include a metal or non-metal oxide, a semiconductor compound, or a mixture thereof. For example, the metal or non-metal oxide may include a 2-element compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or 3-element compound, such as $MgAl_2O_4$, $CoFe_2O_4$, $NiFe_2O_4$, and $CoMn_2O_4$, but embodiments of the present disclosure are not limited thereto. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but embodiments of the present disclosure are not limited thereto.

The quantum dot may have a full width of half maximum (FWHM) of about 45 nm or less, for example, about 40 nm or less, and for example, about 30 nm or less, in an emission wavelength spectrum, and in this range, the quantum dot may improve color purity or color reproducibility. In addition, light emitted from the quantum dot is emitted in all (or substantially all) directions, resulting in improved wide viewing angles.

In addition, a shape of the quantum dot may be, for example, that of nanoparticles, nanotubes, nanowires, nanofibers, nanoflakes, or the like in the form of spherical, pyramidal, multi-arm, or cubic, but embodiments of the present disclosure are not limited thereto.

Because an energy band gap can be controlled by adjusting the size of the quantum dot, light of various suitable wavelength ranges can be obtained in the quantum-dot emission layer. Therefore, a display that emits light of various suitable wavelengths can be realized by using quantum dots of different sizes. For example, the size of the quantum dot can be selected to emit red, green and/or blue light so as to implement a color display. In addition, the size of the quantum dot can be configured to emit white light by combining light of various suitable colors.

Electron Transport Region in Intermediate Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region (for example, a buffer layer, a hole blocking layer, an electron control layer, or an electron transport layer in the electron transport region) may include a metal-free compound containing at least one π electron-depleted nitrogen-containing ring.

The term "π electron-depleted nitrogen-containing ring," as used herein, indicates a $C_1$-$C_{60}$ heterocyclic group having at least one *—N═*' moiety as a ring-forming moiety.

For example, the "$\pi$ electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other (e.g., combined together), or iii) a heteropolycyclic group in which at least one selected from 5-membered to 7-membered heteromonocyclic groups, each having at least one *—N=*' moiety, is condensed with (e.g., combined with) at least one $C_5$-$C_{60}$ carbocyclic group.

Examples of the $\pi$ electron-depleted nitrogen-containing ring include an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazol group, an imidazopyridine group, an imidazopyrimidine group, and an azacarbazole group, but embodiments of the present disclosure are not limited thereto.

For example, the electron transport region may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the $\pi$ electron-depleted nitrogen-containing ring.

In one embodiment, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar_{601}$(s) may be linked via a single bond.

In one or more embodiments, $Ar_{601}$ in Formula 601 may be an anthracene group.

In one or more embodiments, a compound represented by Formula 601 may be represented by Formula 601-1 below:

Formula 601-1

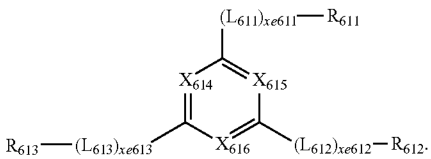

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —$S(=O)_2(Q_{601})$ and —$P(=O)(Q_{601})(Q_{602})$, and $Q_{601}$ and $Q_{602}$ may each independently be the same as described herein above.

The electron transport region may include at least one compound selected from Compounds ET1 to ET36, but embodiments of the present disclosure are not limited thereto:

ET1

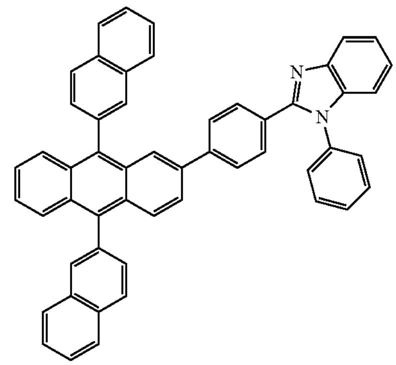

ET2

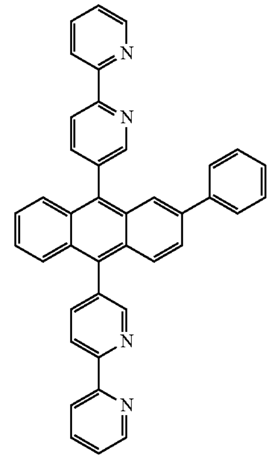

ET3

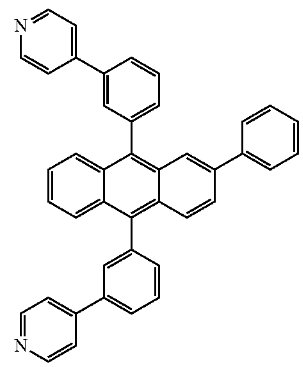

ET4

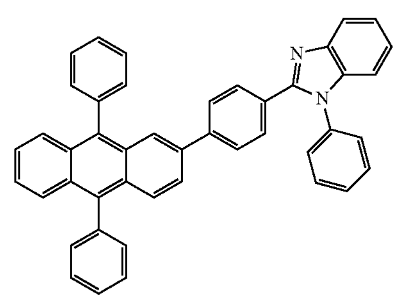

-continued
ET5
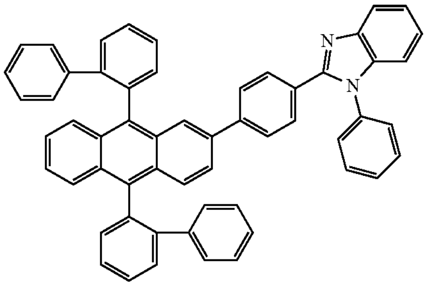
ET6
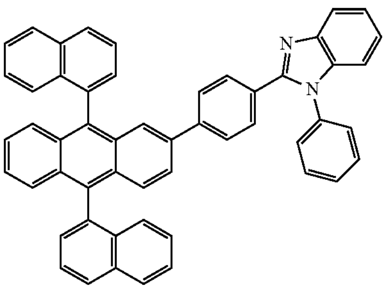
ET7
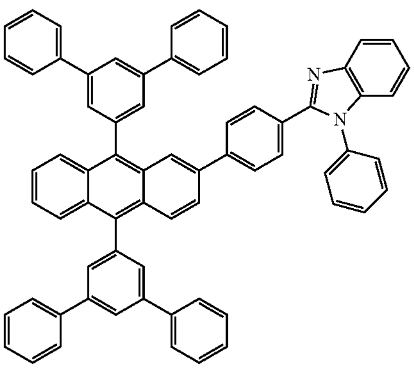
ET8
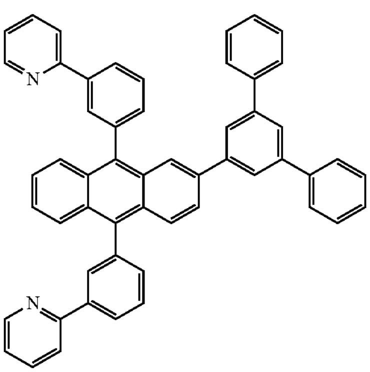
-continued
ET9
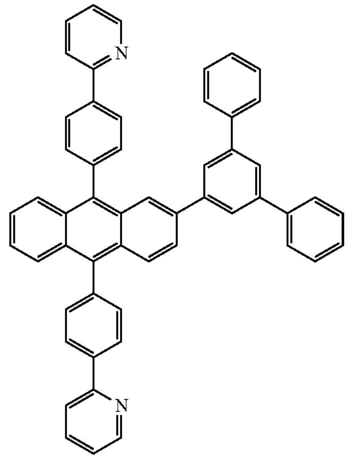
ET10
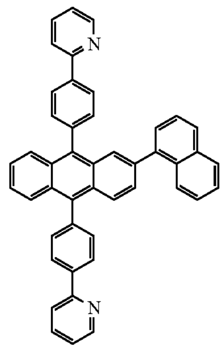
ET11
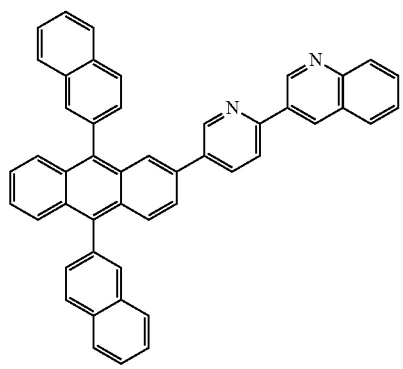
ET12
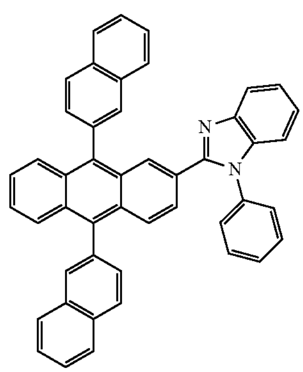

-continued
ET13
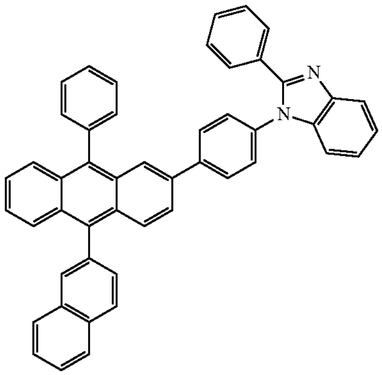
ET14
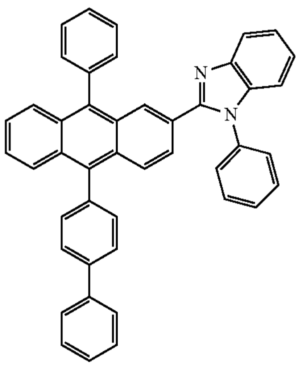
ET15
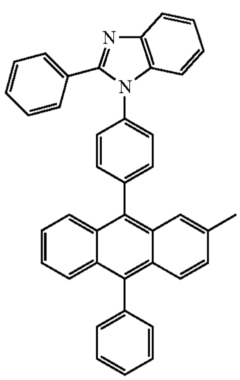
ET16
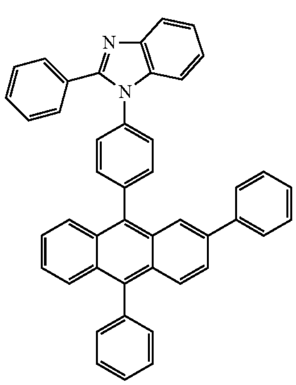
-continued
ET17
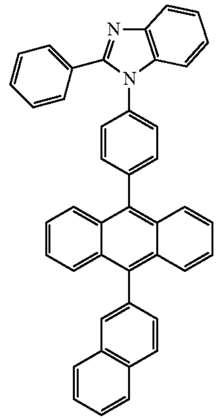
ET18
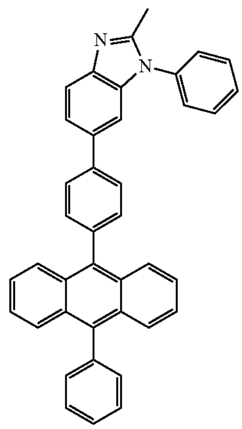
ET19
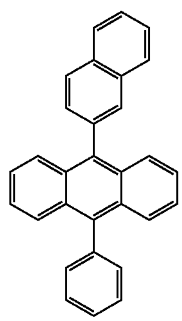
ET20
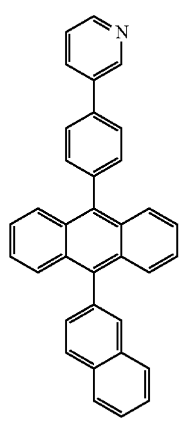

-continued
ET21
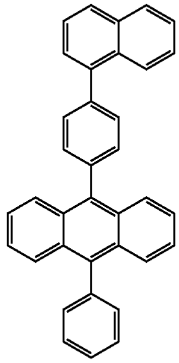
ET22
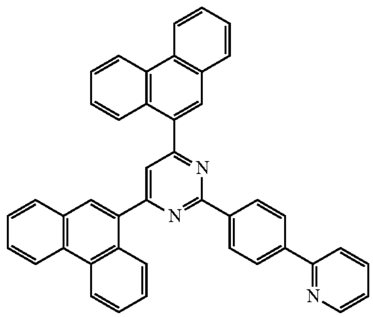
ET23
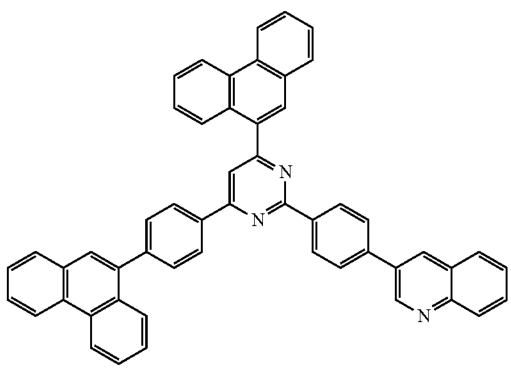
ET24
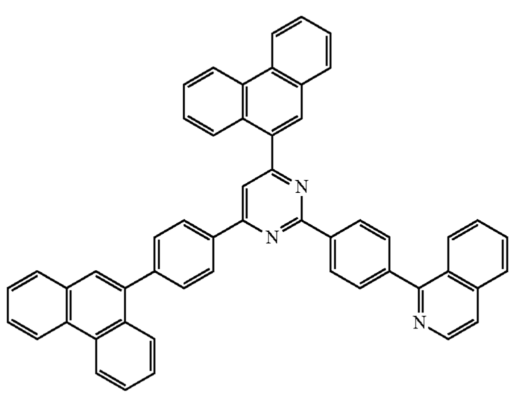
-continued
ET25
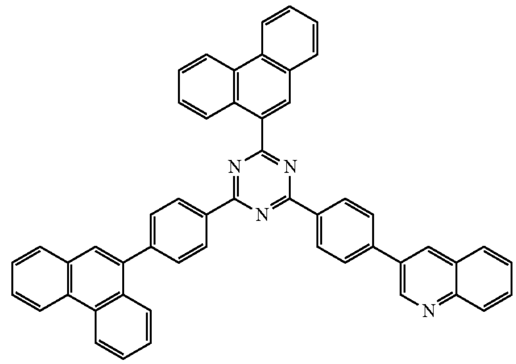
ET26
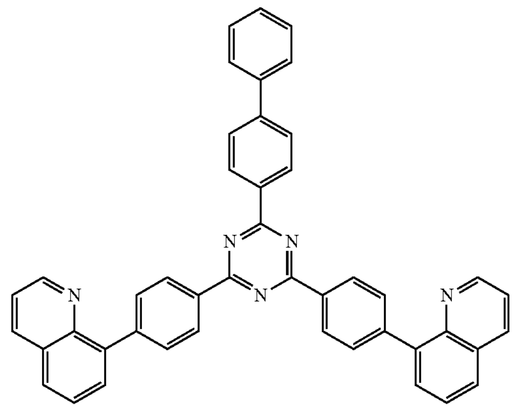
ET27
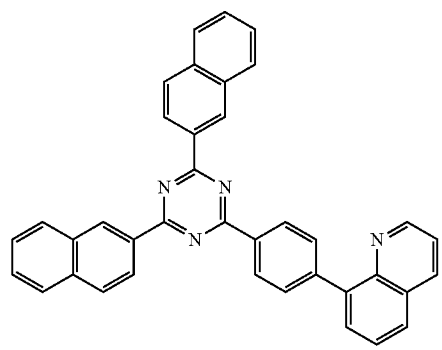
ET28
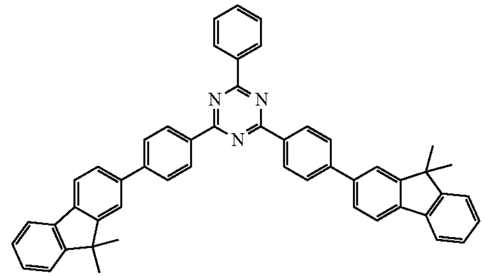

-continued
ET29
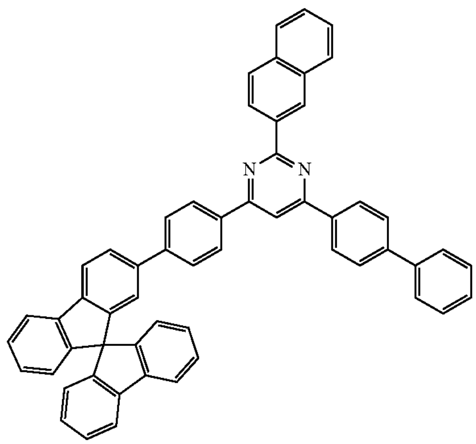
ET30
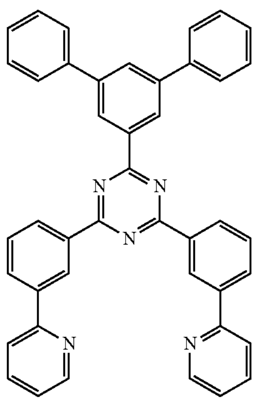
ET31
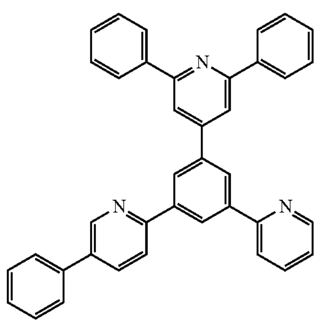
ET32
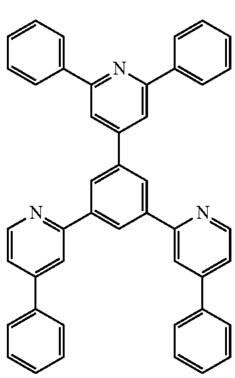
-continued
ET33
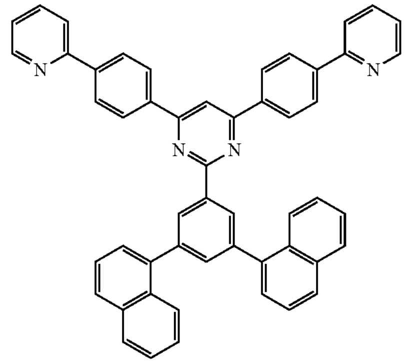
ET34
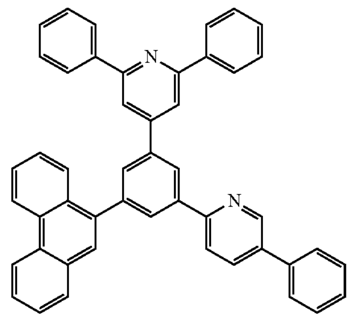
ET35
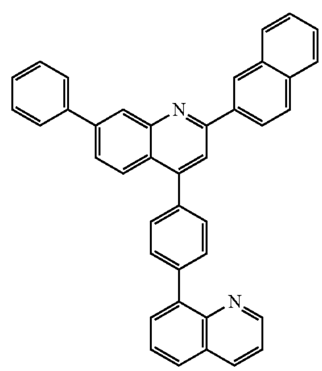
ET36
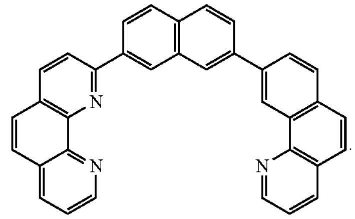
In one or more embodiments, the electron transport region may include at least one selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:

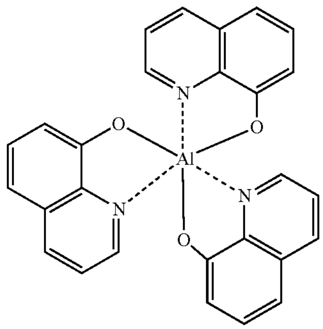

$Alq_3$

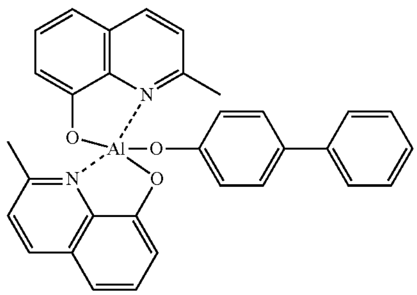

BAlq

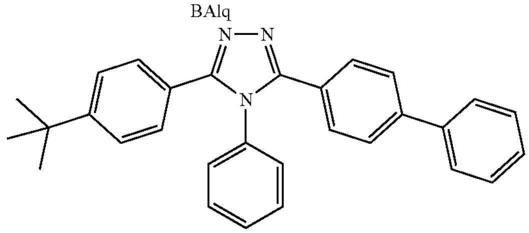

TAZ

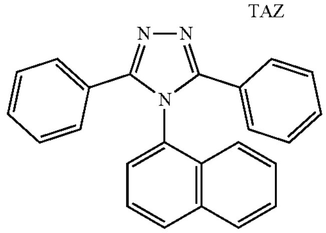

NTAZ

In one embodiment, the electron transport region may include a phosphine oxide-containing compound (for example, TSPO1 used in the following examples or the like), but embodiments of the present disclosure are not limited thereto. In one embodiment, the phosphine oxide-containing compound may be used in a hole blocking layer in the electron transport region, but embodiments of the present disclosure are not limited thereto.

Thicknesses of the buffer layer, the hole blocking layer, and the electron control layer may each be in a range of about 20 Å to about 1,000 Å, for example, about 30 Å to about 300 Å. When the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the range described herein above, the electron transport layer may have suitable or satisfactory electron transport characteristics without a substantial increase in driving voltage.

The electron transport region (for example, the electron transport layer in the electron transport region) may further include, in addition to the materials described herein above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2.

ET-D1

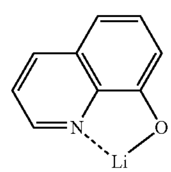

ET-D2

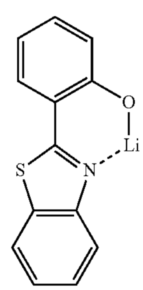

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In one embodiment, the alkali metal compound may be selected from LiF, $Li_2O$, NaF, LiI, NaI, CsI, KI, and RbI, but embodiments of the present disclosure are not limited thereto.

The alkaline earth-metal compound may be selected from alkaline earth-metal oxides, such as BaO, SrO, CaO, $Ba_xSr_{1-x}O$ ($0<x<1$), or $Ba_xCa_{1-x}O$ ($0<x<1$). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described herein above, and a ligand coordinated with a metal ion of the alkali metal complex, the alkaline earth-metal complex, or the rare earth metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described herein above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described herein above, the electron injection layer may have suitable or satisfactory electron injection characteristics without a substantial increase in driving voltage.

Second Electrode 190

The second electrode 190 may be on the intermediate layer 150 having such a structure. The second electrode 190 may be a cathode which is an electron injection electrode, and in this regard, a material for forming the second electrode 190 may be selected from metal, an alloy, an electrically conductive compound, and a combination thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed, and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed, and the structure of a layer to be formed.

Figure 2:
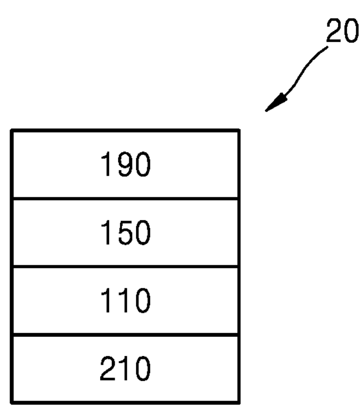
FIG. 2 is a schematic view of a light-emitting device according to another embodiment.
Figure 3:
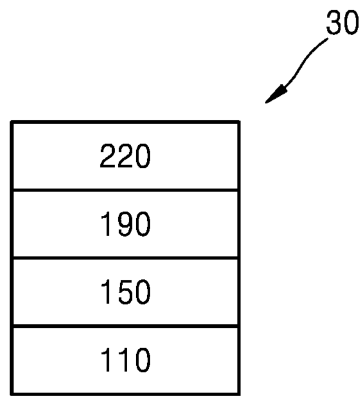
FIG. 3 is a schematic view of a light-emitting device according to another embodiment.
Figure 4:
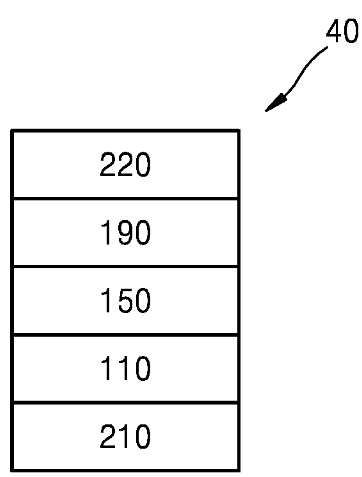
FIG. 4 is a schematic view of a light-emitting device according to another embodiment.

Description of FIGS. 2-4

A light-emitting device 20 of FIG. 2 includes a first capping layer 210, a first electrode 110, an intermediate layer 150, and a second electrode 190 which are sequentially stacked in this stated order, and a light-emitting device 30 of FIG. 3 includes a first electrode 110, an intermediate layer 150, a second electrode 190, and a second capping layer 220 which are sequentially stacked in this stated order, and a light-emitting device 40 of FIG. 4 includes a first capping layer 210, a first electrode 110, an intermediate layer 150, a second electrode 190, and a second electrode 220 which are sequentially stacked in this stated order.

Regarding FIGS. 2-4, the first electrode 110, the intermediate layer 150, and the second electrode 190 may be understood by referring to the description presented in connection with FIG. 1.

In the intermediate layer 150 of each of the light-emitting devices 20 and 40, light generated in an emission layer may pass through the first electrode 110, which is a semi-transmissive electrode or a transmissive electrode, and the first capping layer 210 toward the outside, and in the intermediate layer 150 of each of the light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescence efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrine derivatives, phthalocyanine derivatives, naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In one embodiment, at least one selected from the first capping layer 210 and the second capping layer 220 may each independently include an amine-based compound.

In one or more embodiments, at least one selected from the first capping layer 210 and the second capping layer 220 may each independently include a compound represented by Formula 201 or a compound represented by Formula 202.

In one or more embodiments, at least one selected from the first capping layer 210 and the second capping layer 220 may each independently include a compound selected from Compounds HT28 to HT33 and Compounds CP1 to CP5, but embodiments of the present disclosure are not limited thereto.

CP1

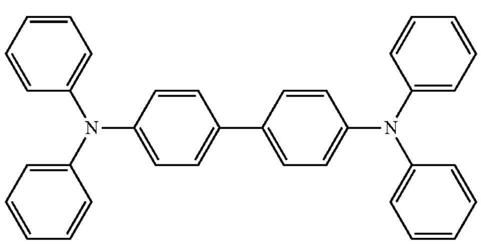

CP2

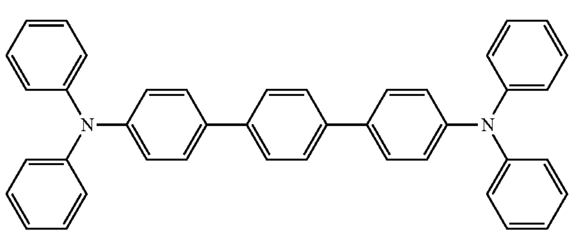

-continued

CP3

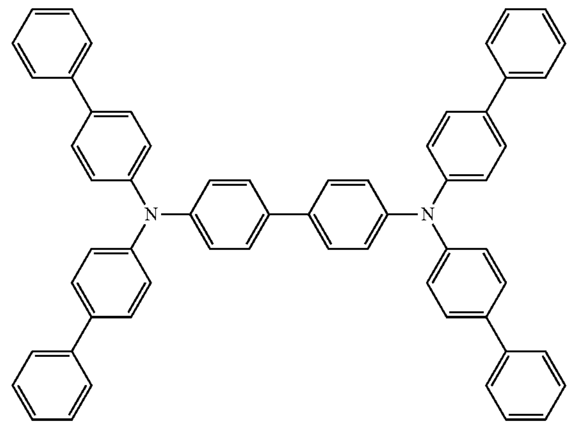

CP4

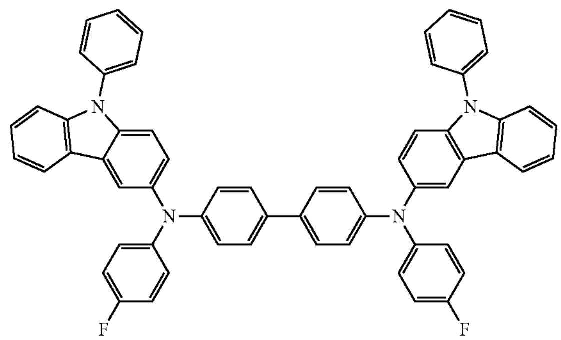

CP5

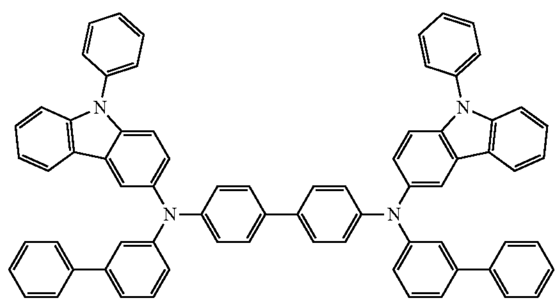

Hereinbefore, the light-emitting device according to an embodiment has been described in connection with FIGS. 1-4. However, embodiments of the present disclosure are not limited thereto.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging (LITI).

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed, and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed, and the structure of a layer to be formed.

Apparatus

The light-emitting device may be included in various suitable apparatuses. For example, a light-emitting apparatus, an authentication apparatus, or an electronic apparatus, which includes the light-emitting device, may be provided.

Hereinafter, the structure of a light-emitting apparatus 500 according to an embodiment will be described in connection with FIG. 5.

Figure 5:
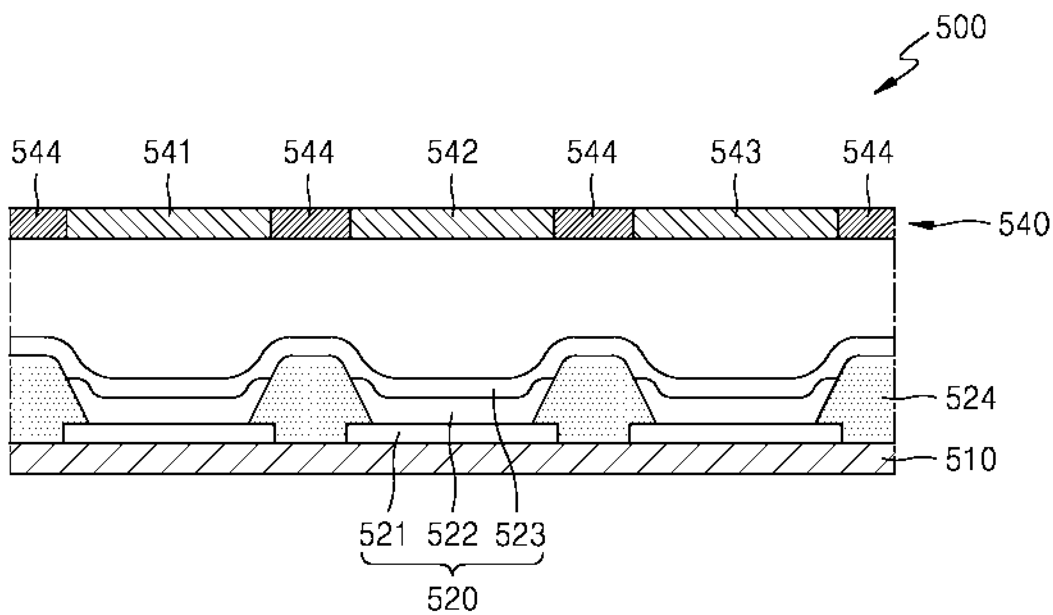
FIG. 5 is a schematic view of a light-emitting apparatus according to another embodiment.

Referring to FIG. 5, a color filter 540 may be positioned on at least one traveling direction of light emitted from a light-emitting device 520. For example, light emitted from the light-emitting device 520 may be blue light, but embodiments of the present disclosure are not limited thereto. The light-emitting device 520 is described in more detail herein above. In more detail, the light-emitting device 520 may be a blue organic light-emitting device.

A first substrate 510 may include a plurality of sub-pixel regions, and the color filter 540 may include a plurality of color filter regions corresponding to the plurality of sub-pixel regions, respectively.

A pixel define layer 524 may be formed between the plurality of sub-pixel regions to define sub-pixel regions, respectively.

The color filter 540 may be formed with a light-shielding pattern 544 between a plurality of color filter regions.

Each of the plurality of first to third color filter regions 541, 542, and 543 may include: a first color filter region 541 emitting a first color light; a second color filter region 542 emitting a second color light; and a third color filter region 543 emitting a third color light, wherein the first color light, the second color light, and the third color light may have different maximum emission wavelengths from each other. For example, the first color light may be red light, the second color light may be green light, and the third color light may be blue light, but embodiments of the present disclosure are not limited thereto. For example, the plurality of first to third color filter regions 541, 542, and 543 may each include a quantum dot, but embodiments of the present disclosure are not limited thereto. In more detail, the first color filter region 541 may include a red quantum dot, the second color filter region 542 may include a green quantum dot, and the third color filter region 543 may not include a quantum dot. The quantum dot may be the same as described herein above. The first color filter region 541, the second color filter region 542, and the third color filter region 543 may each further include a scatterer, but embodiments of the present disclosure are not limited thereto.

In one embodiment, when the light-emitting device 520 emits first light, the first color filter region 541 may absorb the first light to emit 1-1 color light, the second color filter region 542 may absorb the first light to emit 2-1 color light, and the third color filter region 543 may absorb the first light to emit 3-1 color light. Here, the 1-1 color light, the 2-1 color light, and the 3-1 color light may have different maximum emission wavelengths from each other. In more detail, the first light may be blue light, the 1-1 color light may be red light, the 2-1 color light may be green light, and the 3-1 color light may be blue light. However, embodiments of the present disclosure are not limited thereto The light-emitting apparatus may further include, in addition to the light-emitting device, a thin film transistor, and the thin film transistor may include a source electrode, a drain electrode, and an activation layer. Any one selected from the source electrode and the drain electrode of the thin film transistor may be electrically coupled to any one selected from the first electrode and the second electrode of the light-emitting device. The light-emitting apparatus may be used as various suitable displays, light sources, and the like.

The thin film transistor may further include a gate electrode or a gate insulating layer.

The activation layer may include crystalline silicon, amorphous silicon, an organic semiconductor, an oxide semiconductor, and the like, but embodiments of the present disclosure are not limited thereto.

In some embodiments, the light-emitting apparatus may further include a sealing member for sealing a light-emitting device. The sealing member may be between the color filter 540 and the light-emitting device. The sealing member enables an image from the light-emitting device to be realized, and also blocks (or substantially blocks) the entry of outside air and moisture into the light-emitting apparatus. The sealing member may be a sealing substrate including transparent glass or a plastic substrate. The sealing membrane may include a thin-film encapsulating layer including a plurality of organic layers and/or a plurality of inorganic layers. When the sealing membrane is a thin-film encapsulating layer, a flat display apparatus may be entirely flexible.

The authentication apparatus may be, for example, a biometric authentication apparatus for authenticating an individual by using biometric information of a biometric body (for example, a finger tip, a pupil, or the like).

The authentication apparatus may further include, in addition to the light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various suitable measuring instruments, meters (for example, meters for a vehicle, an aircraft, and a vessel), projectors, and the like, but embodiments of the present disclosure are not limited thereto.

General Definition of Some of the Substituents

The term "$C_1$-$C_{60}$ alkyl group," as used herein, refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a hydrocarbon group having at least one double bond at a main chain (e.g., in the middle) or at a terminal end (e.g., the terminus) of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group having at least one triple bond at a main chain (e.g., in the middle) or at a terminal end (e.g., the terminus) of the $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," used herein, refers to a monovalent monocyclic group that has 3 to 10 carbon atoms and at least one double bond in the ring thereof and no aromaticity (e.g., the group is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined together).

The term "$C_1$-$C_{60}$ heteroaryl group," as used herein, refers to a monovalent group having a carbocyclic aromatic system that has at least one heteroatom selected from N, O, Si, P, and S as a ring-forming atom, in addition to 1 to 60 carbon atoms. The term "$C_1$-$C_{60}$ heteroarylene group," as used herein, refers to a divalent group having a carbocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be condensed with each other (e.g., combined together).

The term "$C_6$-$C_{60}$ aryloxy group," as used herein, refers to —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group," as used herein, refers to a monovalent group (for example, having 8 to 60 carbon atoms) having two or more rings condensed with each other (e.g., combined together), only carbon atoms as ring-forming atoms, and no aromaticity in its entire molecular structure (e.g., the entire group and/or molecule is not aromatic). An example of the monovalent non-aromatic condensed polycyclic group is a fluorenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure (e.g., the entire group and/or molecule is not aromatic). An example of the monovalent non-aromatic condensed heteropolycyclic group is a carbazolyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms in which a ring-forming atom is a carbon atom only. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents coupled to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having substantially the same structure as the $C_4$-$C_{60}$ carbocyclic group, except that as a ring-forming atom, at least one heteroatom selected from N, O, Si, P, and S is used in addition to carbon (the number of carbon atoms may be in a range of 1 to 60).

In the present application, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, the substituted monovalent non-aromatic condensed heteropolycyclic group, the substituted $C_1$-$C_{20}$ alkylene group, the substituted $C_2$-$C_{20}$ alkenylene group, and the substituted $C_2$-$C_{20}$ alkynylene group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{11}$ to $Q_{13}$, $Q_{21}$ to $Q_{23}$, $Q_{31}$ to $Q_{33}$, and $Q_{41}$ to $Q_{42}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph," as used herein, refers to a phenyl group, the term "Me," as used herein, refers to a methyl group, the term "Et," as used herein, refers to an ethyl group, the term "ter-Bu" or "$Bu^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples indicates that an identical (or substantially identical) molar equivalent of B was used in place of A.

EXAMPLES

Synthesis Example 1: Synthesis of Compound 1

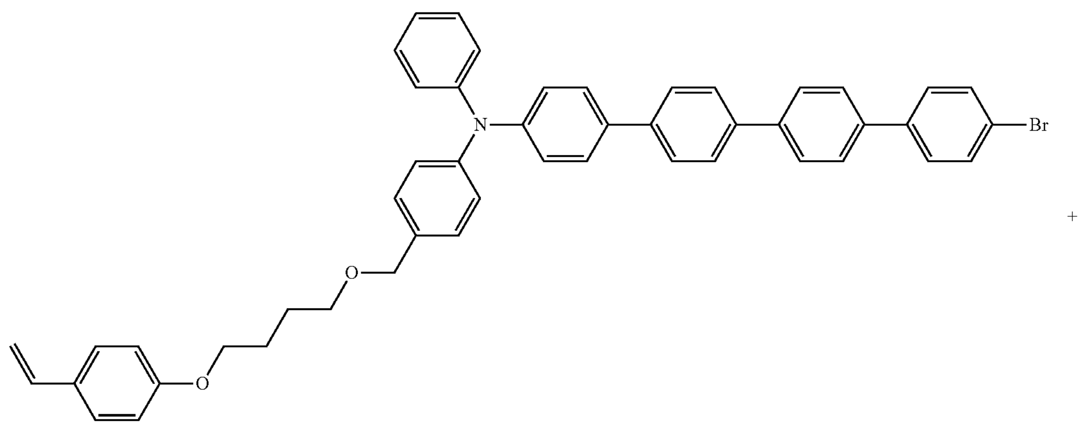

Compound A

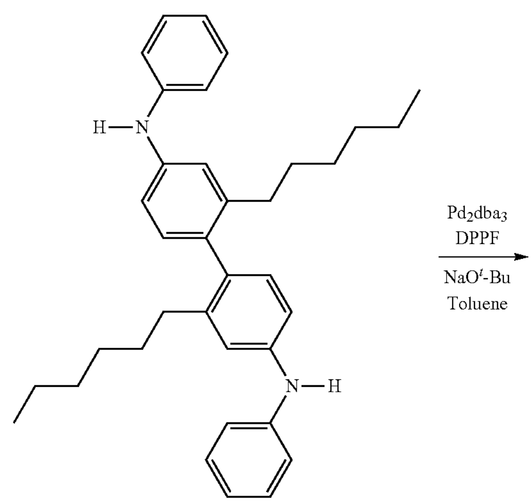

Compound B

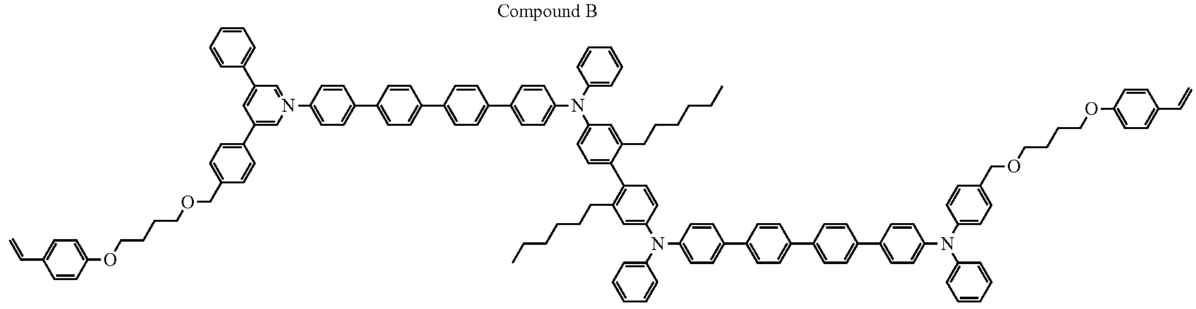

Compound 1

6.0 g (8 mmol) of Compound A, 2.0 g (4 mmol) of Compound B, 183 mg (0.05 eq.) of tris(dibenzylideneacetone) dipalladium(0), 55.4 mg (0.1 eq.) of 1,1'-bis (diphenylphosphino) ferrocene, and 1.2 g (12 mmol) of sodium t-butoxide were added to 80 mL of toluene in a nitrogen atmosphere and refluxed for 24 hours. After the reaction was completed, the mixture passed through a silica gel pad and washed with toluene. A solvent was evaporated and removed from a solution obtained therefrom, recrystallized, and separated by silica gel chromatography to obtain 1.8 g (yield of 25%) of Compound 1.

MS (MALDI-TOF) m/z: 1855 [M]+.

Synthesis Example 2: Synthesis of Compound 4
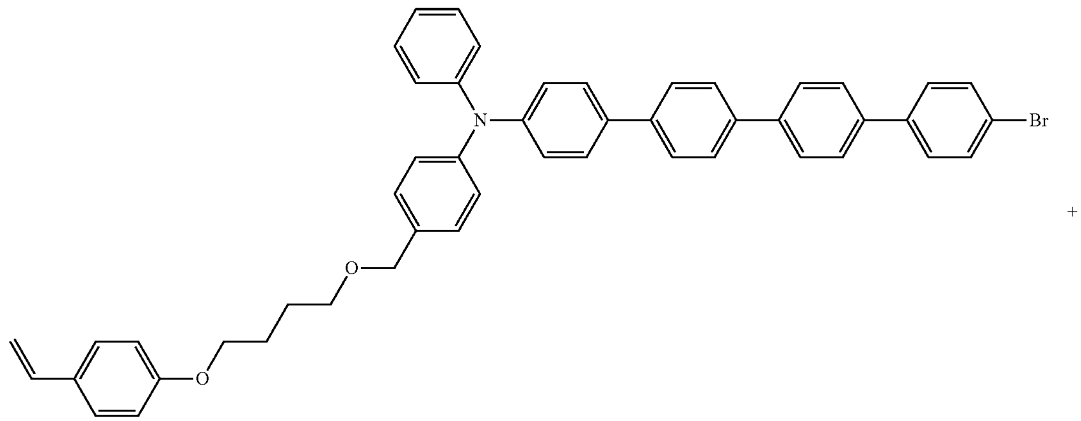
Compound A
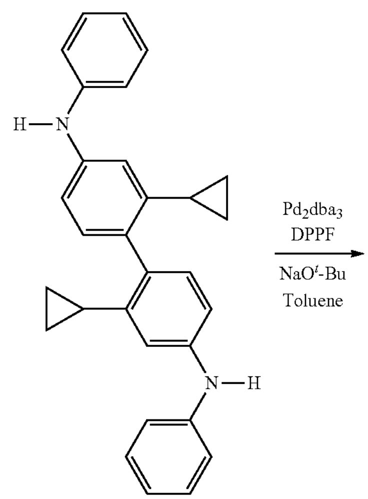
Compound C
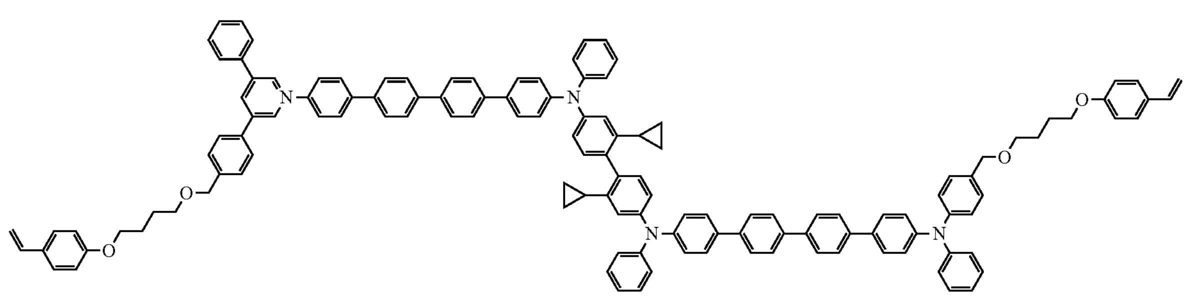
Compound 4
1.4 g (yield of 20%) of Compound 4 was synthesized in substantially the same manner as in Synthesis of Compound 1, except that Compound C was instead of Compound B.
MS (MALDI-TOF) m/z: 1766 [M]+.
Synthesis Example 3: Synthesis of Compound 7

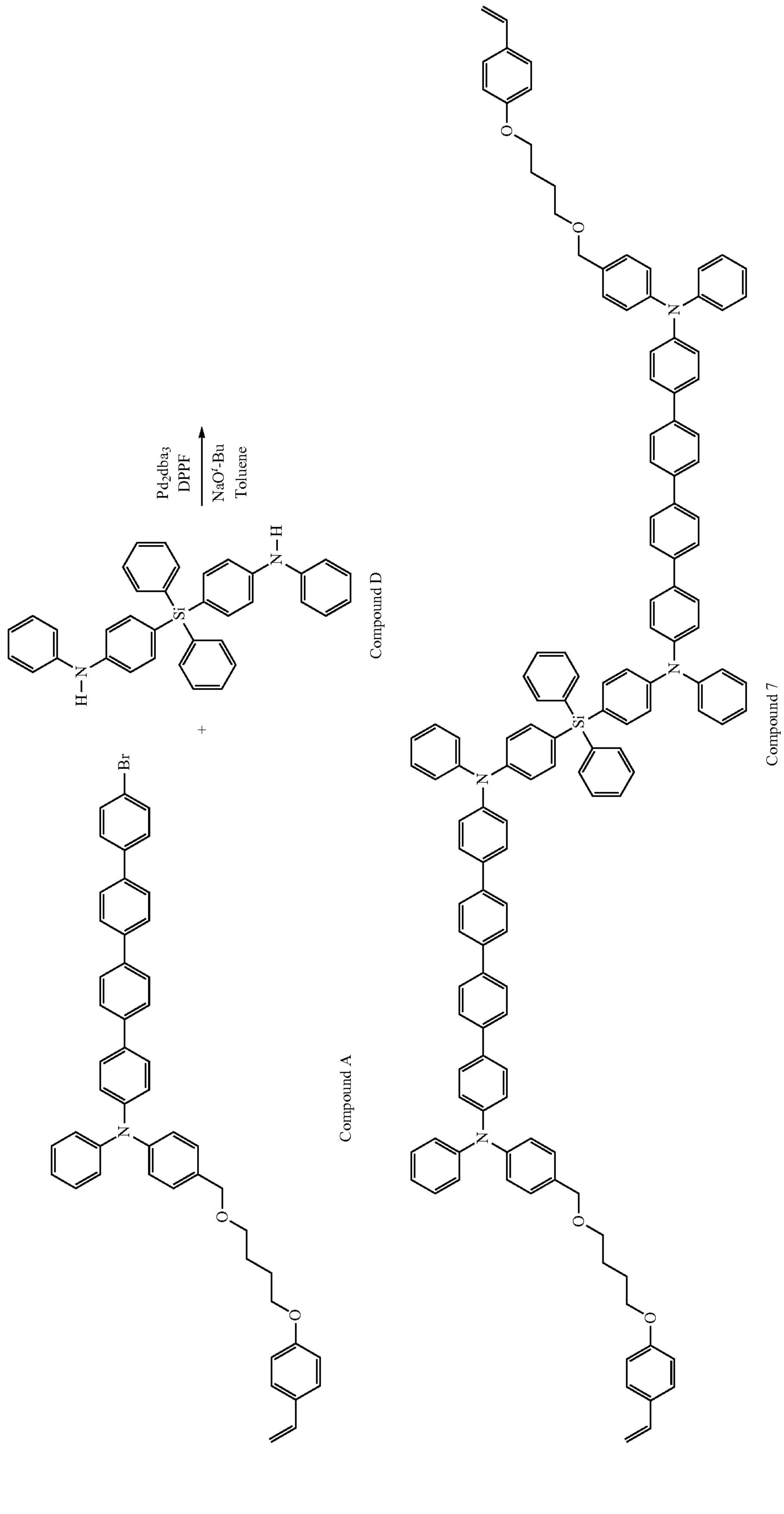
Br
H—N
Si
N—H
+
Pd2dba3
DPPF
NaOt-Bu
Toluene
Compound A
Compound D
O
N
Si
Compound 7

2.0 g (yield of 27%) of Compound 7 was synthesized in substantially the same manner as in Synthesis of Compound 1, except that Compound D was instead of Compound B.

MS (MALDI-TOF) m/z: 1868 [M]+.

Synthesis Example 4: Synthesis of Compound 16

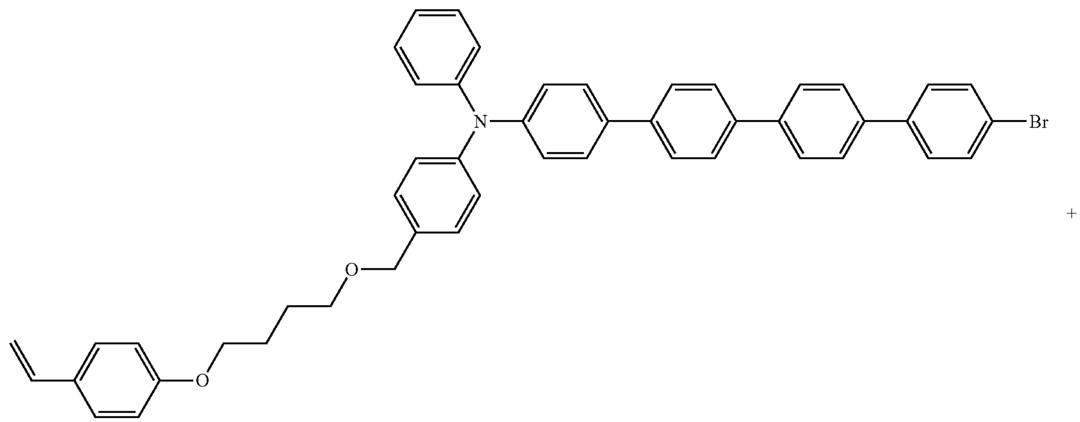

Compound A

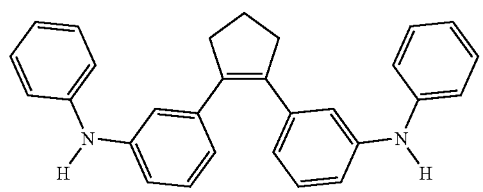

Compound E

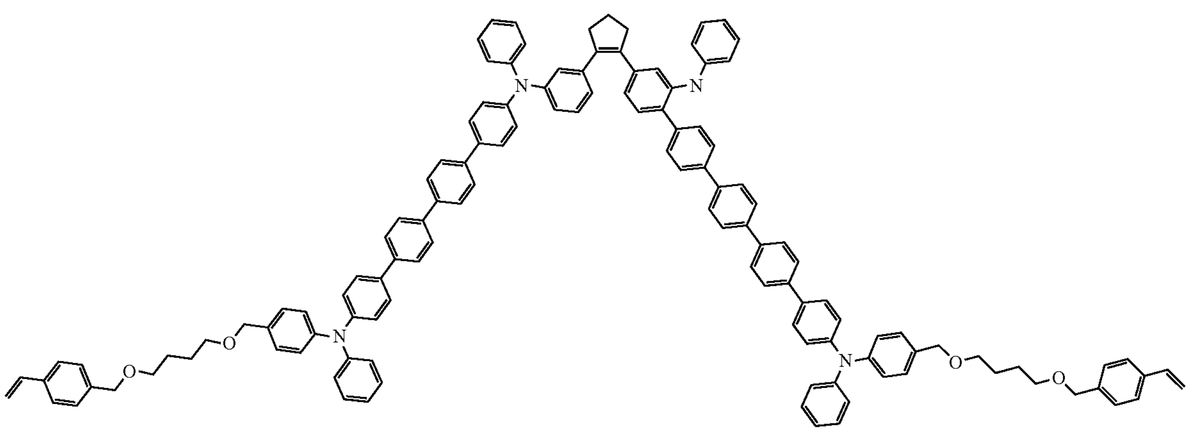

Compound 16

1.5 g (yield of 21%) of Compound 16 was synthesized in substantially the same manner as in Synthesis of Compound 1, except that Compound E was instead of Compound B.

MS (MALDI-TOF) m/z: 1780 [M]+.

Synthesis Example 5: Synthesis of Compound 30

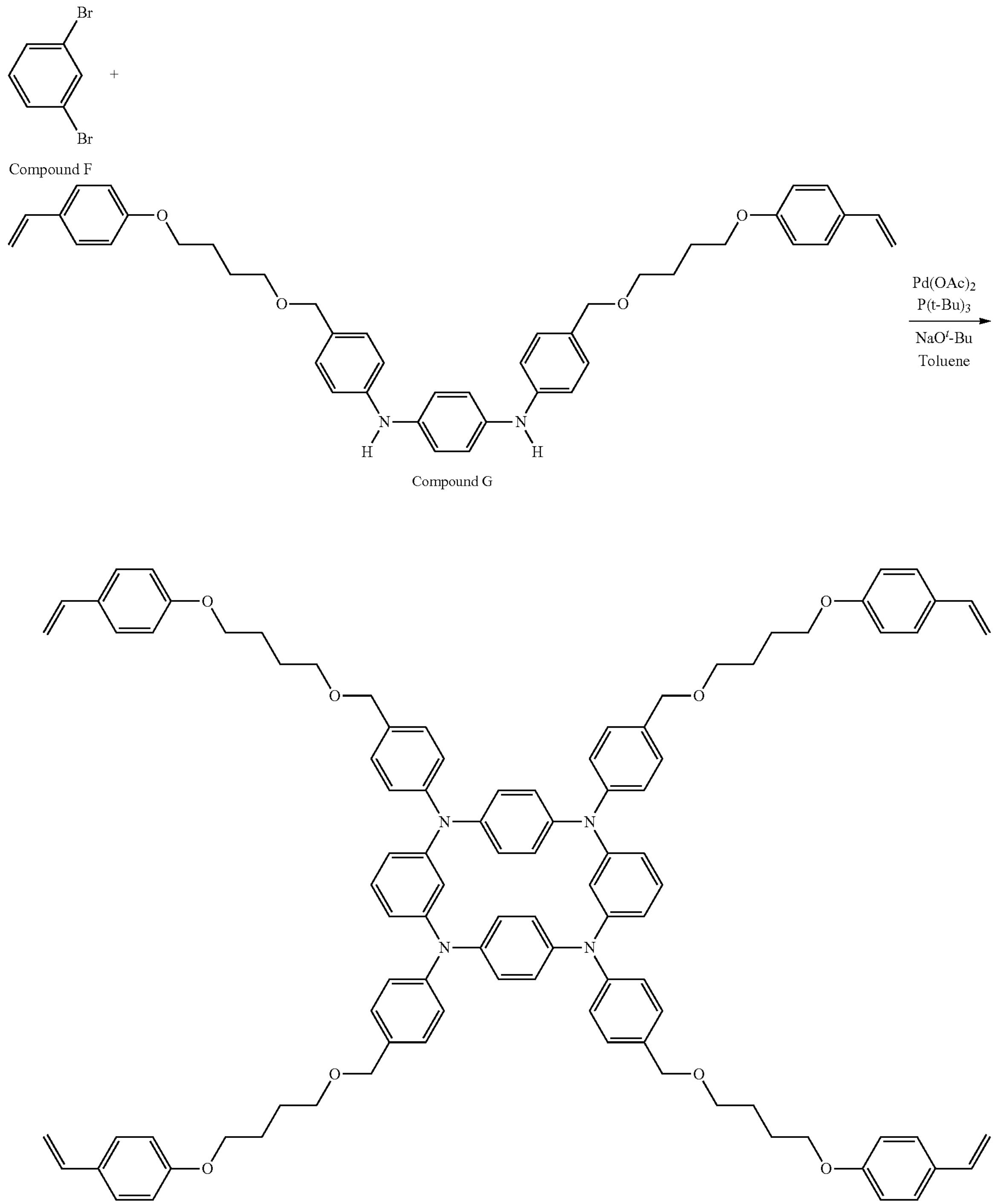

Compound 30

0.93 g (4 mmol) of Compound F, 2.6 g (4 mmol) of Compound G, 90 mg (0.10 eq.) of palladiumacetate, 240 mg (0.30 eq.) of tri-t-butyl phosphine, and 1.2 g (12 mmol) of sodium t-butoxide were added to 40 mL of toluene in a nitrogen atmosphere and refluxed at a temperature of 120° C. for 24 hours. After the reaction was completed, the mixture passed through a silica gel pad and washed with toluene. A solvent was evaporated and removed from a solution obtained therefrom, recrystallized, and separated by silica gel chromatography to obtain 0.29 g (yield of 5%) of Compound 30.

MS (MALDI-TOF) m/z: 1484 [M]+.

Synthesis Example 6: Synthesis of Compound 36
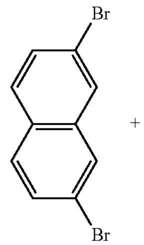
Compound H
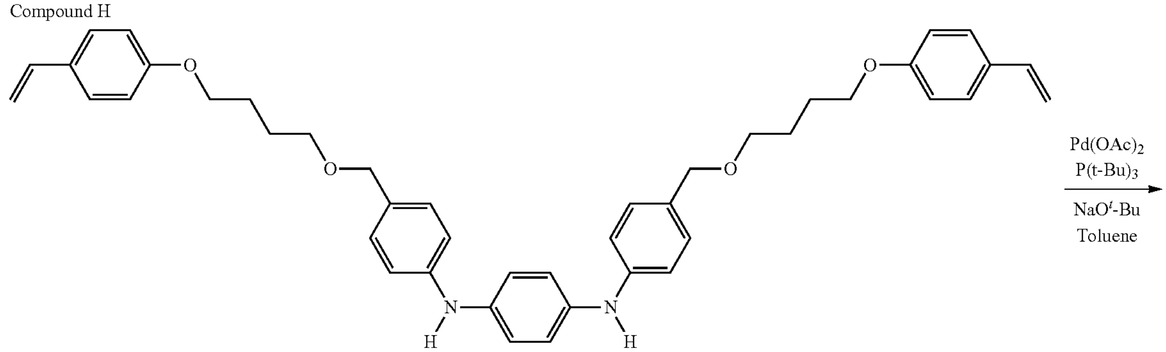
Compound G
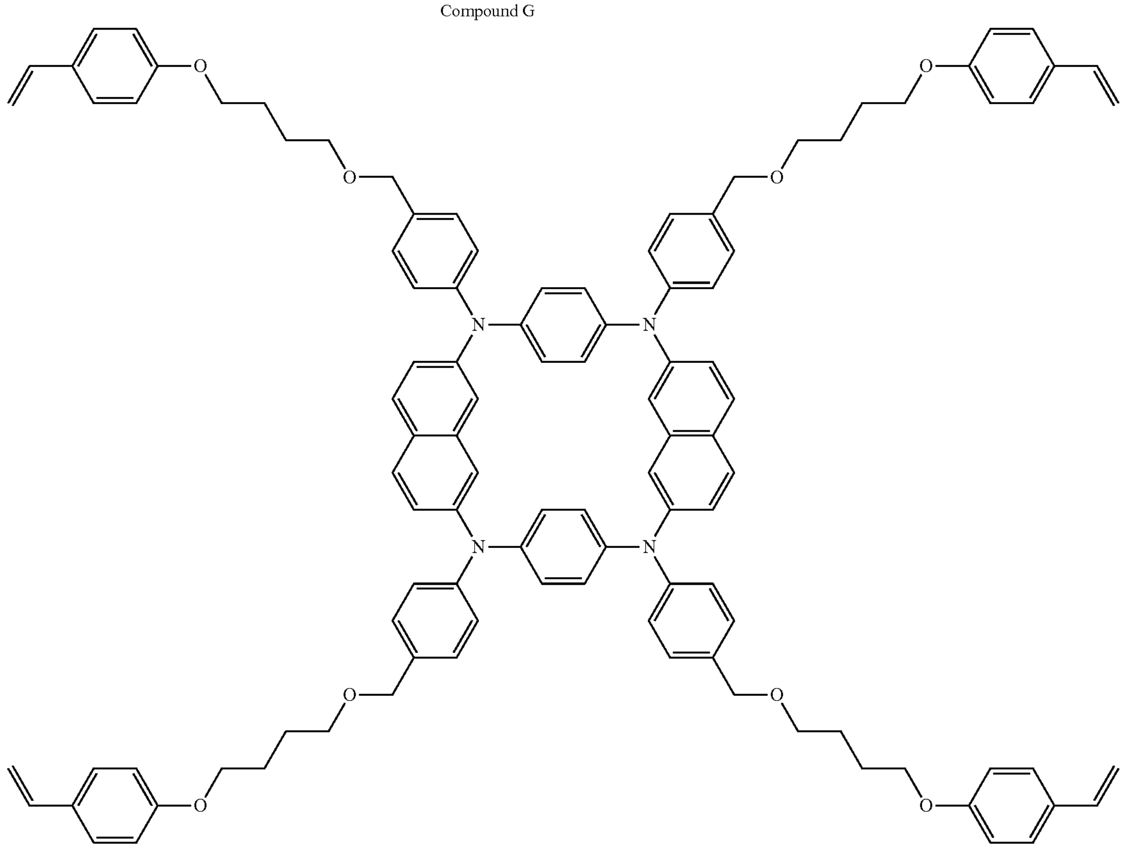
Compound 36
0.310 g (yield of 10%) of Compound 36 was synthesized in substantially the same manner as in Synthesis of Compound 30, except that Compound H was instead of Compound F.
MS (MALDI-TOF) m/z: 1584 [M]+.

Synthesis Example 7: Synthesis of Compound 40

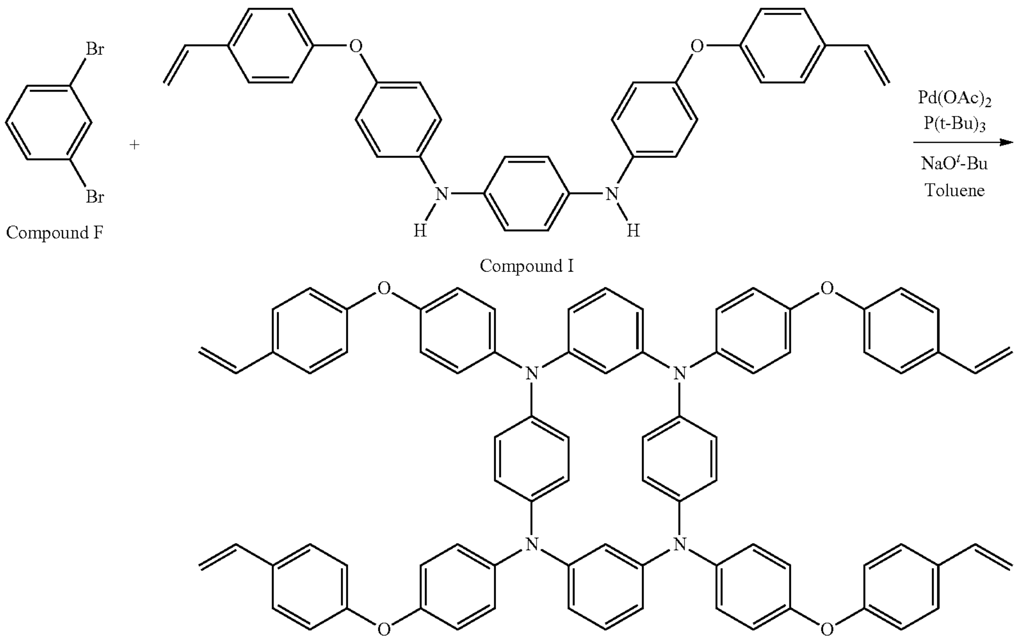

Compound 40

0.205 g (yield of 9%) of Compound 40 was synthesized in substantially the same manner as in Synthesis of Compound 30, except that Compound I was instead of Compound G.

MS (MALDI-TOF) m/z: 1140 [M]+.

Synthesis methods of compounds other than the above Compounds may also be readily recognized by those of ordinary skill in the art by referring to the synthesis mechanisms and source materials described herein above.

Example 1

As an anode, a Corning 15 Ω/cm$^2$ (120 nm) ITO glass substrate was cut to a size of 50 mm×50 mm×0.7 mm, sonicated with isopropyl alcohol and pure water each for 5 minutes, and then cleaned by exposure to ultraviolet rays and ozone for 30 minutes.

PEDOT-PSS (Al4083) manufactured by Bayer was coated on the glass substrate and thermally treated at a temperature of 150° C. for 30 minutes to form a hole injection layer having a thickness of 1,000 Å. A mixture including 2 g of xylene solution and 0.1 g of Compound 1 was spin-coated on the hole injection layer, dried at a temperature of 100° C. for 10 minutes, and thermally cross-linked at a temperature of 200° C. for 30 minutes to form a hole transport layer having a thickness of 200 Å.

A solution in which Compound H-1 (host) and Compound D-1 (dopant) (a host ratio of 5%) were dissolved in xylene solution was spin-coated on the hole transport layer and dried at a temperature of 100° C. for 10 minutes to form an emission layer having a thickness of 350 Å.

Compound E-1 and 8-hydroxyquinolinolato-lithium (LiQ) were vacuum-deposited on the emission layer at a ratio of 5:5 to form an electron transport layer having a thickness of 200 Å. LiQ (electron injection layer) having a thickness of 10 Å and Al (cathode) having a thickness of 2,000 Å were sequentially vacuum-deposited on the electron transport layer, thereby completing the manufacture of an organic light-emitting device.

Compound H-1

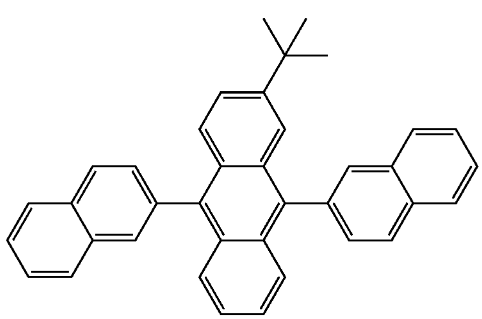

-continued

Compound D-1

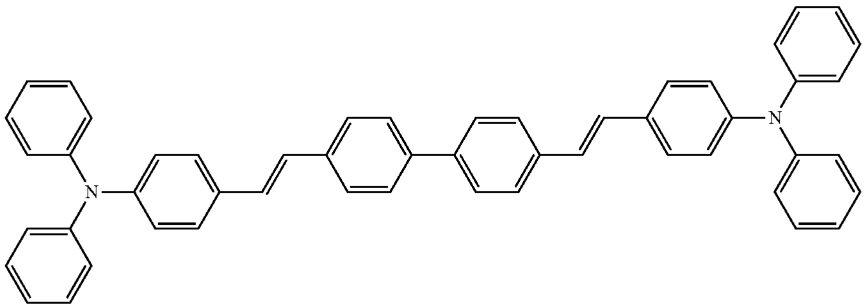

Compound E-1

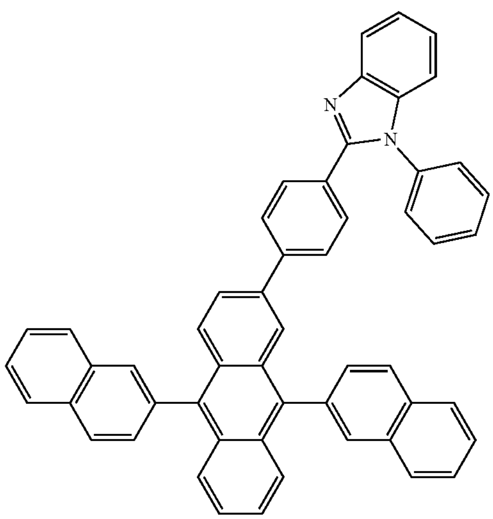

Examples 2 to 7 and Comparative Examples 1 to 5

Organic light-emitting devices were manufactured in substantially the same manner as in Example 1, except that Compounds shown in Table 1 were each used instead of Compound 1 in forming a hole transport layer.

TABLE 1

| | Hole transport layer | Driving voltage (@700 nit) | Current efficiency (cd/A) | Lifespan (T90) |
|---|---|---|---|---|
| Example 1 | 1 | 7.1 | 5.1 | 50 |
| Example 2 | 4 | 7.3 | 5.2 | 35 |
| Example 3 | 7 | 7.2 | 5.4 | 40 |
| Example 4 | 16 | 6.8 | 5.9 | 51 |
| Example 5 | 30 | 6.9 | 5.8 | 54 |
| Example 6 | 36 | 7.0 | 6.1 | 70 |
| Example 7 | 40 | 6.8 | 5.8 | 60 |
| Comparative Example 1 | A-1 | 9.5 | 4.0 | 5 |
| Comparative Example 2 | A-2 | 9.7 | 4.1 | 10 |
| Comparative Example 3 | A-3 | 10.1 | 3.1 | 1 |
| Comparative Example 4 | A-4 | 9.2 | 4.2 | 10 |
| Comparative Example 5 | A-5 | 9.8 | 3.2 | 2 |

Compound A-1
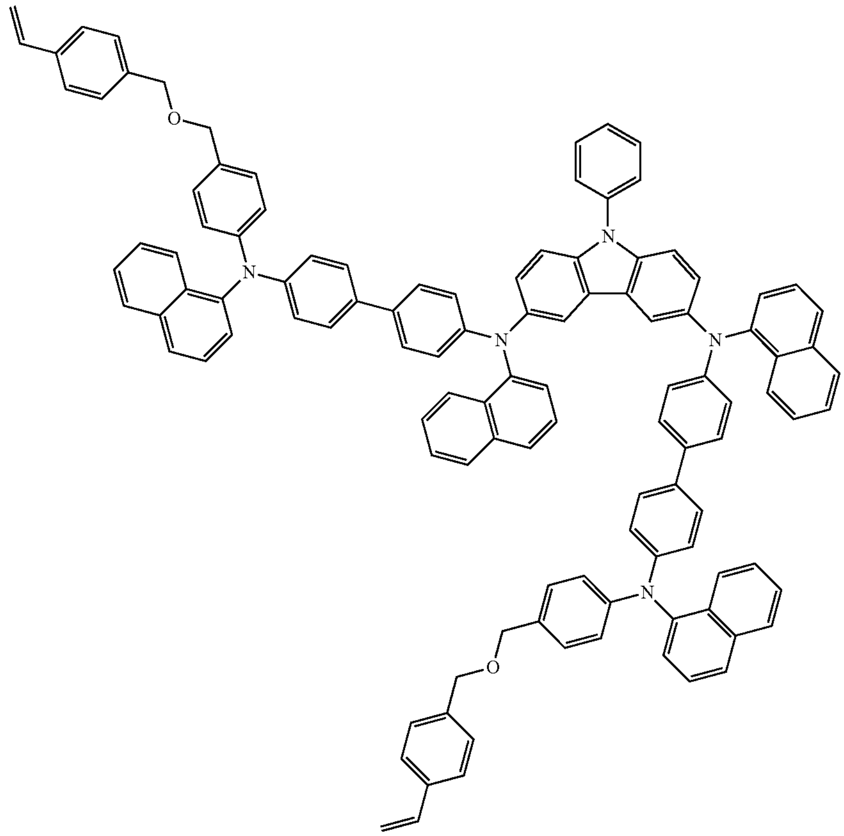
Compound A-2
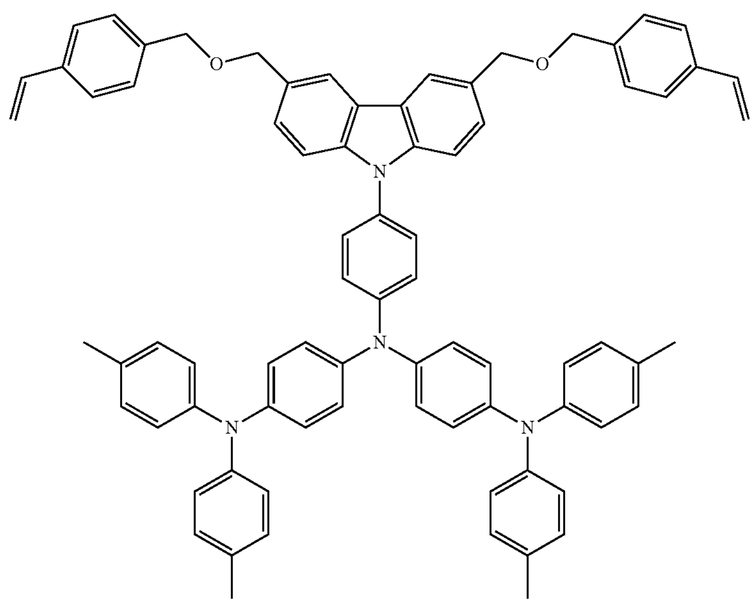

-continued
Compound A-3
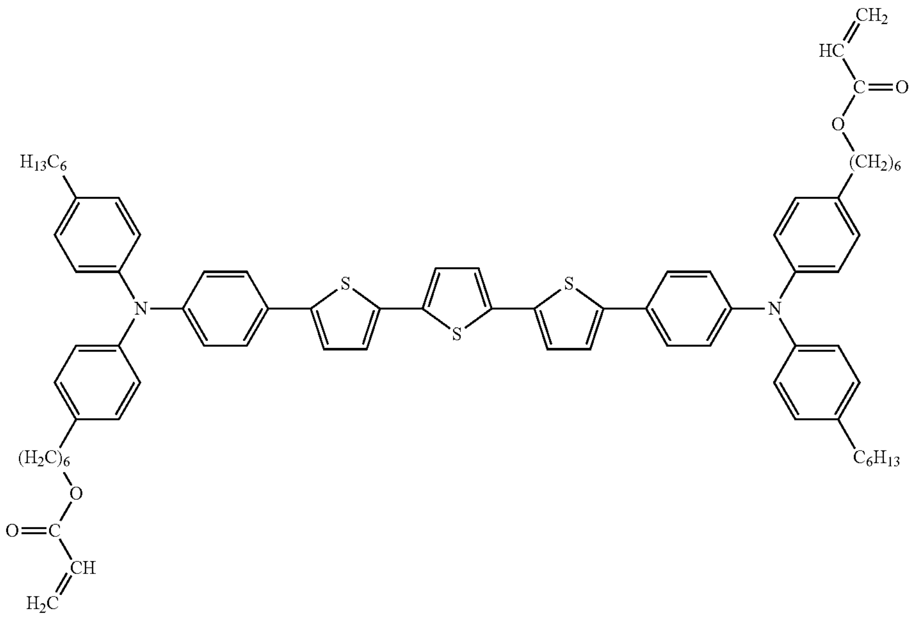
Compound A-4
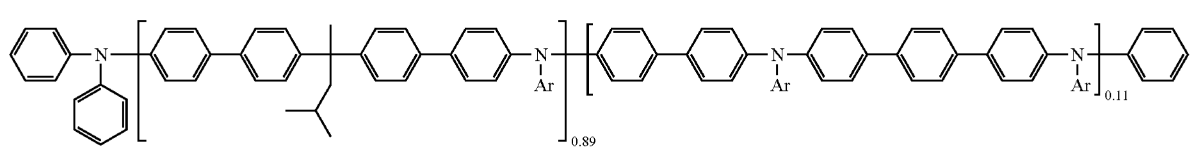

-continued

Compound A-5

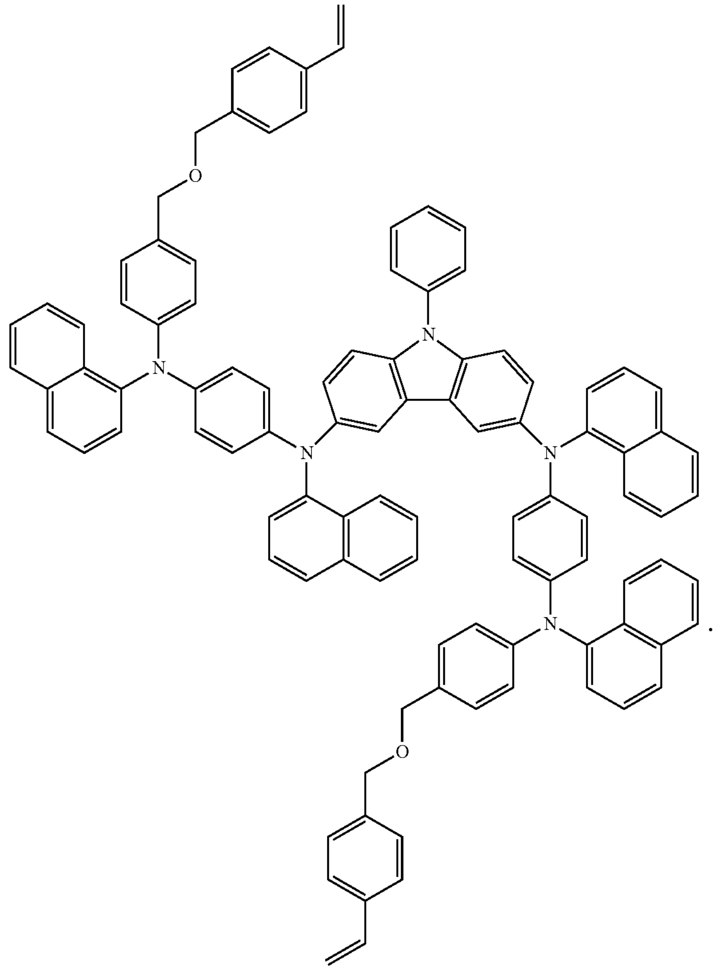

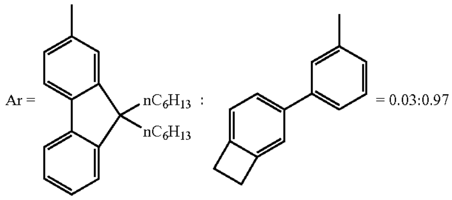

Referring to Table 1, it can be seen that the organic light-emitting devices of Examples 1 to 7 have a low driving voltage, high efficiency, and excellent lifespan characteristics, as compared with those of the organic light-emitting devices of Comparative Examples 1 to 5.

The light-emitting device may have improved device characteristics, such as a low driving voltage, high efficiency, and a long lifespan.

It should be understood that embodiments described herein should be considered in a descriptive sense only and not for purposes of limitation. Descriptions of features or aspects within each embodiment should typically be considered as available for other similar features or aspects in other embodiments.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as “beneath,” “below,” “lower,” “under,” “above,” “upper,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A light-emitting device comprising:

a first electrode;

a second electrode facing the first electrode; and an intermediate layer between the first electrode and the second electrode and comprising an emission layer, wherein the intermediate layer further comprises at least one of an arylamine-based polymer formed by cross-linking a cross-linkable arylamine-based compound represented by Formula 1a or 1b:

<Formula 1a>

$$A_1—(B)_p—A_2$$

<Formula 1-1>

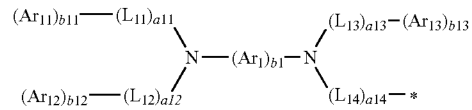

<Formula 1b>

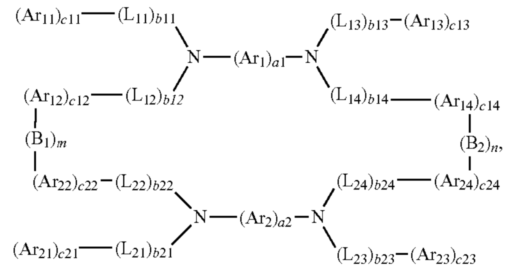

wherein, in Formula 1a, $A_1$ and $A_2$ are each a group represented by Formula 1-1, and $A_1$ and $A_2$ are identical to or different from each other, in Formula 1a, B is selected from a substituted or unsubstituted $C_5$-$C_{60}$ carbocyclic group, a substituted or unsubstituted $C_1$-$C_{60}$ heterocyclic group, and *'—Si$(Q_{41})(Q_{42})$*", p is an integer of 1 to 10 in Formula 1-1, * indicates a binding site to $(B)_p$ in Formula 1a, in Formula 1-1, $Ar_1$ is selected from a substituted or unsubstituted $C_5$-$C_{60}$ carbocyclic group and a substituted or unsubstituted $C_1$-$C_{60}$ heterocyclic group, in Formula 1-1, b1 is an integer of four or more, and four or more $Ar_1$(s) are identical to or different from each other, in Formula 1-1, $L_{11}$ to $L_{14}$ are each independently a substituted or unsubstituted $C_5$-$C_{60}$ carbocyclic group or a substituted or unsubstituted $C_1$-$C_{60}$ heterocyclic group, in Formula 1-1, a11 to a14 are each independently 0, 1, 2, 3, or 4, in Formula 1-1, when a11 is 0, *'-$(L_{11})_{a11}$-*" is a single bond, when a12 is 0, *'-$(L_{12})_{a12}$-*" is a single bond, when a13 is 0, *'-$(L_{13})_{a13}$-*" is a single bond, when a14 is 0, *'-$(L_{14})_{a14}$-*" is a single bond, when a11 is two or more, two or more $L_{11}$(s) are identical to or different from each other, when a12 is two or more, two or more $L_{12}$(s) are identical to or different from each other, when a13 is two or more, two or more $L_{13}$(s) are identical to or different from each other, and when a14 is two or more, two or more $L_{14}$(s) are identical to or different from each other, in Formula 1-1, $Ar_{11}$ to $Ar_{13}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $Ar_{11}$ to $Ar_{13}$ is substituted with a cross-linkable group, in Formula 1-1, b11 to b13 are each independently 1, 2, 3, 4, or 5, wherein, when b11 is two or more, two or more $Ar_{11}$(s) are identical to or different from each other, when b12 is two or more, two or more $Ar_{12}$(s) are identical to or different from each other, and when b13 is two or more, two or more $Ar_{13}$(s) are identical to or different from each other, in Formula 1b, $Ar_1$ and $Ar_2$ are each independently a substituted or unsubstituted $C_5$-$C_{60}$ carbocyclic group or a substituted or unsubstituted $C_1$-$C_{60}$ heterocyclic group, wherein $Ar_1$ and $Ar_2$ are identical to or different from each other, in Formula 1b, a1 and a2 are each independently an integer of 1 to 5, wherein, when a1 is two or more, two or more $Ar_1$(s) are identical to or different from each other, and when a2 is two or more, two or more $Ar_2$(s) are identical to or different from each other, in Formula 1b, $L_{11}$ to $L_{14}$ and $L_{21}$ to $L_{24}$ are each independently a substituted or unsubstituted $C_5$-$C_{60}$ carbocyclic group or a substituted or unsubstituted $C_1$-$C_{60}$ heterocyclic group, in Formula 1b, b11 to b14 and b21 to b24 are each independently an integer of 0 to 3, wherein, when b11 is 0, $*\text{-}(L_{11})_{b11}\text{-}*'$ is a single bond, when b12 is 0, $*\text{-}(L_{12})_{b12}*'$ is a single bond, when b13 is 0, $*\text{-}(L_{13})_{b13}\text{-}*'$ is a single bond, when b14 is 0, $*\text{-}(L_{14})_{b14}*'$ is a single bond, when b21 is 0, $*\text{-}(L_{21})_{b21}\text{-}*'$ is a single bond, when b22 is 0, $*\text{-}(L_{22})_{b22}*'$ is a single bond, when b23 is 0, $*\text{-}(L_{23})_{b23}\text{-}*'$ is a single bond, when b24 is 0, $*\text{-}(L_{24})_{b24}*'$ is a single bond, when b11 is two or more, two or more $L_{11}$(s) are identical to or different from each other, when b12 is two or more, two or more $L_{12}$(s) are identical to or different from each other, when b13 is two or more, two or more $L_{13}$(s) are identical to or different from each other, when b14 is two or more, two or more $L_{14}$(s) are identical to or different from each other, when b21 is two or more, two or more $L_{21}$(s) are identical to or different from each other, when b22 is two or more, two or more $L_{22}$(s) are identical to or different from each other, when b23 is two or more, two or more $L_{23}$(s) are identical to or different from each other, and when b24 is two or more, two or more $L_{24}$(s) are identical to or different from each other, in Formula 1b, $B_1$ and $B_2$ are each independently selected from a single bond, a substituted or unsubstituted $C_1$-$C_{20}$ alkylene group, a substituted or unsubstituted $C_2$-$C_{20}$ alkenylene group, and a substituted or unsubstituted $C_2$-$C_{20}$ alkynylene group, in Formula 1b, m and n are each independently an integer of 1 to 3, wherein, when m is two or more, two or more $B_1$(s) are identical to or different from each other, and when n is two or more, two or more $B_2$(s) are identical to or different from each other, in Formula 1b, $Ar_{11}$, $Ar_{13}$, $Ar_{21}$, and $Ar_{23}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, in Formula 1b, $Ar_{12}$, $Ar_{14}$, $Ar_{22}$, and $Ar_{24}$ are each independently selected from a single bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, in Formula 1b, c11 to c14 and c21 to c24 are each independently an integer of 1 to 5, wherein, when c11 is two or more, two or more $Ar_{11}$(s) are identical to or different from each other, when c12 is two or more, two or more $Ar_{12}$(s) are identical to or different from each other, when c13 is two or more, two or more $Ar_{13}$(s) are identical to or different from each other, when c14 is two or more, two or more $Ar_{14}$(s) are identical to or different from each other, when c21 is two or more, two or more $Ar_{21}$(s) are identical to or different from each other, when c22 is two or more, two or more $Ar_{22}$(s) are identical to or different from each other, when c23 is two or more, two or more $Ar_{23}$(s) are identical to or different from each other, and when c24 is two or more, two or more $Ar_{24}$(s) are identical to or different from each other, in Formula 1b, when $Ar_1$ and $Ar_2$ are each a biphenyl group or a terphenyl group, the group represented by $\text{-}(L_{12})_{b12}\text{-}(Ar_{12})_{c12}\text{—}(B_1)_m\text{—}(Ar_{22})_{c22}\text{-}(L_{22})_{b22}\text{-}$ and/or the group represented by $\text{-}(L_{14})_{b14}\text{-}(Ar_{14})_{c14}\text{—}(B_2)_n\text{—}(Ar_{24})_{c24}\text{-}(L_{24})_{b24}\text{-}$ is not a phenyl group and a naphthyl group, and when the group represented by $\text{-}(L_{12})_{b12}\text{-}(Ar_{12})_{c12}\text{—}(B_1)_m\text{—}(Ar_{22})_{c22}\text{-}(L_{22})_{b22}\text{-}$ and the group represented by $\text{-}(L_{14})_{b14}\text{-}(Ar_{14})_{c14}\text{—}(B_2)_n\text{—}(Ar_{24})_{c24}\text{-}(L_{24})_{b24}\text{-}$ are each a biphenyl group or a terphenyl group, $Ar_1$ and/or $Ar_2$ is not a phenyl group and a naphthyl group, in Formula 1b, at least one group selected from $Ar_1$, $Ar_2$, $Ar_{11}$ to $Ar_{14}$, and $Ar_{21}$ to $Ar_{24}$ is substituted with a cross-linkable group, in Formula 1b, at least one selected from $Ar_1$, $Ar_2$, the group represented by $\text{-}(L_{12})_{b12}\text{-}(Ar_{12})_{c12}\text{—}(B_1)_m\text{—}(Ar_{22})_{c22}\text{-}(L_{22})_{b22}\text{-}$, and the group represented by $\text{-}(L_{14})_{b14}\text{-}(Ar_{14})_{c14}\text{—}(B_2)_n\text{—}(Ar_{24})_{c24}\text{-}(L_{24})_{b24}\text{-}$ is not a phenyl group,

*' and *" each indicate a binding site to a neighboring atom, and $Q_{41}$ and $Q_{42}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

2. The light-emitting device of claim 1, wherein:

the emission layer comprises at least one selected from an organic compound and a semiconductor compound, wherein the organic compound comprises a host and a dopant, and the semiconductor compound comprises a quantum dot.

3. The light-emitting device of claim 1, wherein:

the first electrode is an anode, the second electrode is a cathode, and the intermediate layer further comprises i) a hole transport region between the first electrode and the emission layer and comprising a hole injection layer, a hole transport layer, a buffer layer, an electron blocking layer, or any combination thereof and ii) an electron transport region between the emission layer and the second electrode and comprising a hole blocking layer, an electron transport layer, an electron injection layer, or any combination thereof.

4. The light-emitting device of claim 3, wherein:

the hole transport region comprises at least one of the arylamine-based polymer.

5. The light-emitting device of claim 3, wherein:

the hole transport region comprises a hole injection layer and a hole transport layer, and the hole transport layer comprises at least one of the arylamine-based polymer.

6. The light-emitting device of claim 2, wherein:

the hole transport region is formed by using one selected from vacuum deposition, spin coating, casting, Langmuir-Blodgett (LB) deposition, ink-jet printing, laser-printing, and laser-induced thermal imaging.

7. An electronic apparatus comprising:

a thin film transistor; and the light-emitting device of claim 1, wherein the thin film transistor comprises a source electrode, a drain electrode, an active layer, and a gate electrode, and the first electrode of the light-emitting device is electrically coupled to one selected from the source electrode and the drain electrode of the thin film transistor.

8. A cross-linkable arylamine-based compound represented by Formula 1a or 1b:

<Formula 1a>

$$A_1—(B)_p—A_2$$

<Formula 1-1>

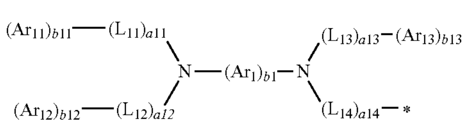

<Formula 1b>

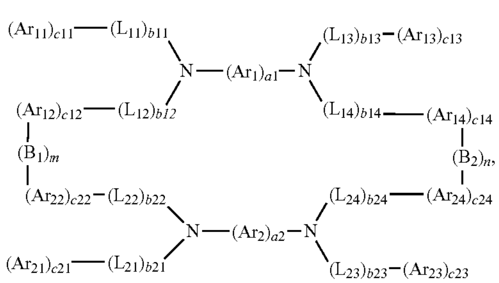

wherein, in Formula 1a, $A_1$ and $A_2$ are each a group represented by Formula 1-1, and $A_1$ and $A_2$ are identical to or different from each other, in Formula 1a, B is selected from a substituted or unsubstituted $C_5$-$C_{60}$ carbocyclic group, a substituted or unsubstituted $C_1$-$C_{60}$ heterocyclic group, and *'-Si$(Q_{41})(Q_{42})$-*", p is an integer of 1 to 10, in Formula 1-1, * indicates a binding site to $(B)_p$ in Formula 1a, in Formula 1-1, $Ar_1$ is selected from a substituted or unsubstituted $C_5$-$C_{60}$ carbocyclic group and a substituted or unsubstituted $C_1$-$C_{60}$ heterocyclic group, in Formula 1-1, b1 is an integer of four or more, and four or more $Ar_1$(s) are identical to or different from each other, in Formula 1-1, $L_{11}$ to $L_{14}$ are each independently a substituted or unsubstituted $C_5$-$C_{60}$ carbocyclic group or a substituted or unsubstituted $C_1$-$C_{60}$ heterocyclic group, in Formula 1-1, a11 to a14 are each independently 0, 1, 2, 3, or 4, in Formula 1-1, when a11 is 0, *'-$(L_{11})_{a11}$-*" is a single bond, when a12 is 0, *'-$(L_{12})_{a12}$-*" is a single bond, when a13 is 0, *'-$(L_{13})_{a13}$-*" is a single bond, when a14 is 0, *'-$(L_{14})_{a14}$-*" is a single bond, when a11 is two or more, two or more $L_{11}$(s) are identical to or different from each other, when a12 is two or more, two or more $L_{12}$(s) are identical to or different from each other, when a13 is two or more, two or more $L_{13}$(s) are identical to or different from each other, and when a14 is two or more, two or more $L_{14}$(s) are identical to or different from each other, in Formula 1-1, $Ar_{11}$ to $Ar_{13}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $Ar_{11}$ to $Ar_{13}$ is substituted with a cross-linkable group, in Formula 1-1, b11 to b13 are each independently 1, 2, 3, 4, or 5, wherein, when b11 is two or more, two or more $Ar_{11}$(s) are identical to or different from each other, when b12 is two or more, two or more $Ar_{12}$(s) are identical to or different from each other, and when b13 is two or more, two or more $Ar_{13}$(s) are identical to or different from each other, in Formula 1b, $Ar_1$ and $Ar_2$ are each independently a substituted or unsubstituted $C_5$-$C_{60}$ carbocyclic group or a substituted or unsubstituted $C_1$-$C_{60}$ heterocyclic group, wherein Ar and $Ar_2$ are identical to or different from each other, in Formula 1b, a1 and a2 are each independently an integer of 1 to 5, wherein, when a1 is two or more, two or more $Ar_1$(s) are identical to or different from each other, and when a2 is two or more, two or more $Ar_2$(s) are identical to or different from each other, in Formula 1b, $L_{11}$ to $L_{14}$ and $L_{21}$ to $L_{24}$ are each independently a substituted or unsubstituted $C_5$-$C_{60}$ carbocyclic group or a substituted or unsubstituted $C_1$-$C_{60}$ heterocyclic group, in Formula 1b, b11 to b14 and b21 to b24 are each independently an integer of 0 to 3, wherein, when b11 is 0, $*\text{-}(L_{11})_{b11}\text{-}*'$ is a single bond, when b12 is 0, $*\text{-}(L_{12})_{b12}\text{-}*'$ is a single bond, when b13 is 0, $*\text{-}(L_{13})_{b13}\text{-}*'$ is a single bond, when b14 is 0, $*\text{-}(L_{14})_{b14}*'$ is a single bond, when b21 is 0, $*\text{-}(L_{21})_{b21}\text{-}*'$ is a single bond, when b22 is 0, $*\text{-}(L_{22})_{b22}*'$ is a single bond, when b23 is 0, $*\text{-}(L_{23})_{b23}\text{-}*'$ is a single bond, when b24 is 0, $*\text{-}(L_{24})_{b24}*'$ is a single bond, when b11 is two or more, two or more $L_{11}$(s) are identical to or different from each other, when b12 is two or more, two or more $L_{12}$(s) are identical to or different from each other, when b13 is two or more, two or more $L_{13}$(s) are identical to or different from each other, when b14 is two or more, two or more $L_{14}$(s) are identical to or different from each other, when b21 is two or more, two or more $L_{21}$(s) are identical to or different from each other, when b22 is two or more, two or more $L_{22}$(s) are identical to or different from each other, when b23 is two or more, two or more $L_{23}$(s) are identical to or different from each other, and when b24 is two or more, two or more $L_{24}$(s) are identical to or different from each other, in Formula 1b, $B_1$ and $B_2$ are each independently selected from a single bond, a substituted or unsubstituted $C_1$-$C_{20}$ alkylene group, a substituted or unsubstituted $C_2$-$C_{20}$ alkenylene group, and a substituted or unsubstituted $C_2$-$C_{20}$ alkynylene group, in Formula 1b, m and n are each independently an integer of 1 to 3, wherein, when m is two or more, two or more $B_1$(s) are identical to or different from each other, and when n is two or more, two or more $B_2$(s) are identical to or different from each other, in Formula 1b, $Ar_{11}$, $Ar_{13}$, $Ar_{21}$, and $Ar_{23}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, in Formula 1b, $Ar_{12}$, $Ar_{14}$, $Ar_{22}$, and $Ar_{24}$ are each independently selected from a single bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, in Formula 1b, c11 to c14 and c21 to c24 are each independently an integer of 1 to 5, wherein, when c11 is two or more, two or more $Ar_{11}$(s) are identical to or different from each other, when c12 is two or more, two or more $Ar_{12}$(s) are identical to or different from each other, when c13 is two or more, two or more $Ar_{13}$(s) are identical to or different from each other, when c14 is two or more, two or more $Ar_{14}$(s) are identical to or different from each other, when c21 is two or more, two or more $Ar_{21}$(s) are identical to or different from each other, when c22 is two or more, two or more $Ar_{22}$(s) are identical to or different from each other, when c23 is two or more, two or more $Ar_{23}$(s) are identical to or different from each other, and when c24 is two or more, two or more $Ar_{24}$(s) are identical to or different from each other, in Formula 1b, when $Ar_1$ and $Ar_2$ are each a biphenyl group or a terphenyl group, the group represented by $\text{-}(L_{12})_{b12}\text{-}(Ar_{12})_{c12}—(B_1)_m—(Ar_{22})_{c22}\text{-}(L_{22})_{b22}\text{-}$ and/or the group represented by $\text{-}(L_{14})_{b14}\text{-}(Ar_{14})_{c14}—(B_2)_n—(Ar_{24})_{c24}\text{-}(L_{24})_{b24}\text{-}$ is not a phenyl group and a naphthyl group, and when the group represented by $\text{-}(L_{12})_{b12}\text{-}(Ar_{12})_{c12}—(B_1)_m—(Ar_{22})_{c22}\text{-}(L_{22})_{b22}\text{-}$ and the group represented by $\text{-}(L_{14})_{b14}\text{-}(Ar_{14})_{c14}—(B_2)_n—(Ar_{24})_{c24}\text{-}(L_{24})_{b24}\text{-}$ are each a biphenyl group or a terphenyl group, $Ar_1$ and/or $Ar_2$ is not a phenyl group and a naphthyl group, in Formula 1b, at least one group selected from $Ar_1$, $Ar_2$, $Ar_{11}$ to $Ar_{14}$, and $Ar_{21}$ to $Ar_{24}$ is substituted with a cross-linkable group, in Formula 1b, at least one selected from $Ar_1$, $Ar_2$, the group represented by $\text{-}(L_{12})_{b12}\text{-}(Ar_{12})_{c12}—(B_1)_m—(Ar_{22})_{c22}\text{-}(L_{22})_{b22}\text{-}$, and the group represented by $\text{-}(L_{14})_{b14}\text{-}(Ar_{14})_{c14}—(B_2)_n—(Ar_{24})_{c24}\text{-}(L_{24})_{b24}\text{-}$ is not a phenyl group,

*' and *" each indicate a binding site to a neighboring atom, and $Q_{41}$ and $Q_{42}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

9. The cross-linkable arylamine-based compound of claim 8, wherein, in Formula 1a, $A_1$ and $A_2$ are identical to each other.

10. The cross-linkable arylamine-based compound of claim 8, wherein:

the arylamine-based compound represented by Formula 1a is symmetrical with respect to $*'—(B)_p—*''$.

11. The cross-linkable arylamine-based compound of claim 8, wherein:

in Formula 1-1, $Ar_1$ is selected from a benzene group, a pyridine group, a pyrimidine group, a pyrazine group, a triazine group, a furan group, a thiophene group, an imidazole group, a thiazole group, an isoxazole group, and an oxazole group, in Formula 1b, $Ar_1$ and $Ar_2$ are each independently selected from:

a $C_6$-$C_{60}$ arylene group and a $C_1$-$C_{60}$ heteroarylene group; and a $C_6$-$C_{60}$ arylene group and a $C_1$-$C_{60}$ heteroarylene group, each substituted with at least one selected from deuterium, —F, —Cl, —Br, —I, a hydroxyl group, a cyano group, a nitro group, an amidino group, a hydrazino group, a hydrazono group, a $C_1$-$C_6$ alkyl group, a $C_1$-$C_{60}$ alkoxy group, —N($Q_{31}$)($Q_{32}$), and a cross-linkable group.

12. The cross-linkable arylamine-based compound of claim 8, wherein:

in Formula 1-1, $Ar_1$ is a benzene group, and b1 is 4 or 5, and in Formula 1b, $Ar_1$ and $Ar_2$ are each independently selected from:

a phenylene group and a naphthylene group; and a phenylene group and a naphthylene group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_1$-$C_{60}$ alkoxy group, —N($Q_{31}$)($Q_{32}$), and a cross-linkable group.

13. The cross-linkable arylamine-based compound of claim 8, wherein:

in Formula 1-1, the four or more $Ar_1$(s) are identical to each other, and in Formula 1b, when a1 is two or more, two or more $Ar_1$(s) are identical to each other, and when a2 is two or more, two or more $Ar_2$(s) are identical to each other.

14. The cross-linkable arylamine-based compound of claim 8, wherein:

in Formula 1b, *—$(Ar_1)_{a1}$—*' and *—$(Ar_2)_{a2}$—*' are identical to each other.

15. The cross-linkable arylamine-based compound of claim 8, wherein:

$L_{11}$ to $L_{14}$ in Formula 1-1 and $L_{11}$ to $L_{14}$ and $L_{21}$ to $L_{24}$ in Formula 1b are each independently selected from groups represented by Formulae 2-1 to 2-37:

2-1

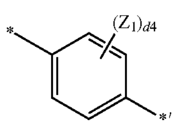

2-2

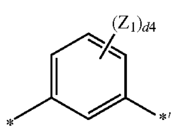

2-3

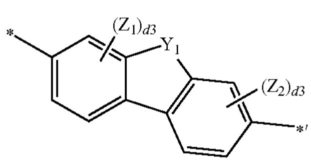

2-4

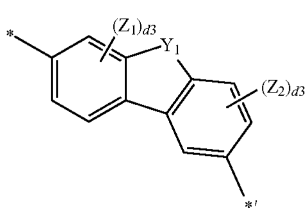

2-5

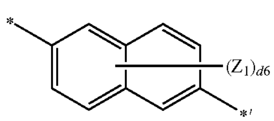

-continued 2-6

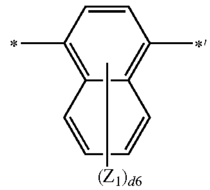

2-7

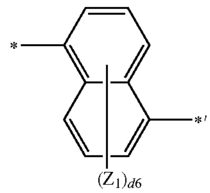

2-8

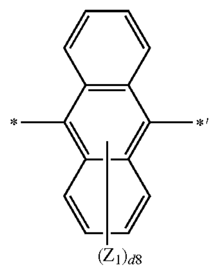

2-9

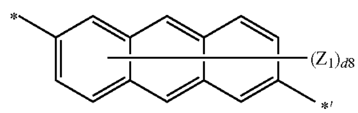

2-10

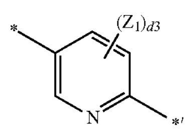

2-11

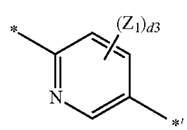

2-12

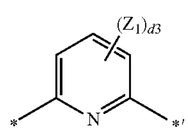

2-13

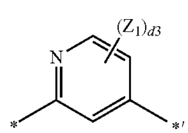

2-14

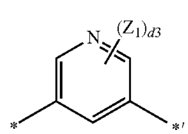

-continued
2-15
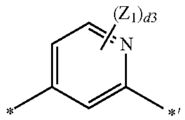
2-16
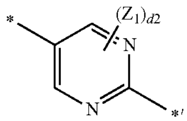
2-17
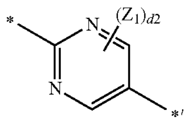
2-18
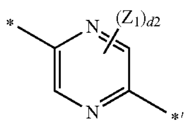
2-19
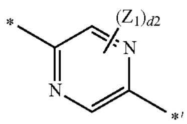
2-20
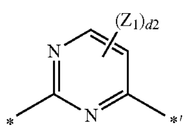
2-21
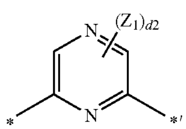
2-22
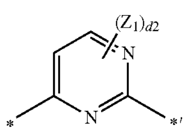
2-23
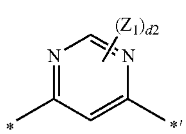
2-24
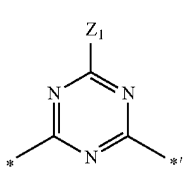
-continued
2-25
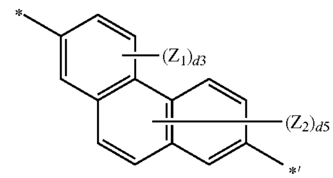
2-26
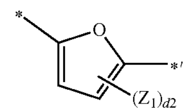
2-27
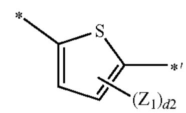
2-28
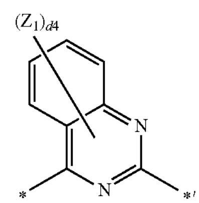
2-29
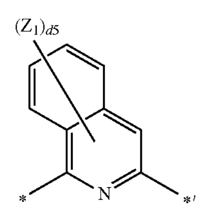
2-30
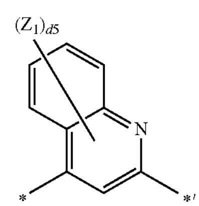
2-31
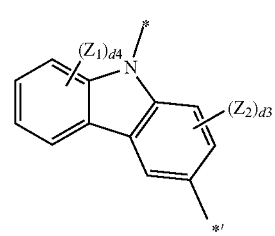
2-32
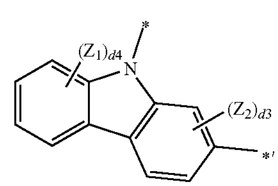

-continued

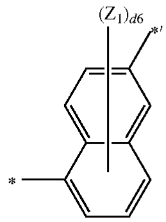

2-33

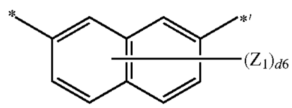

2-34

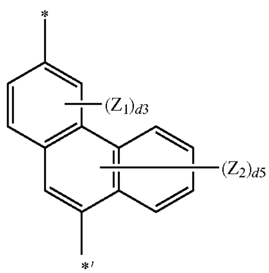

2-35

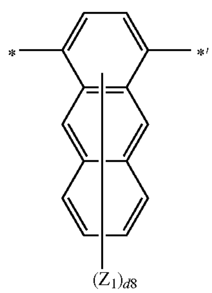

2-36

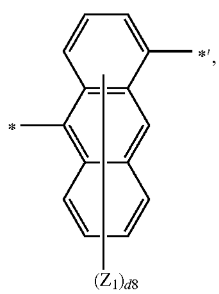

2-37 wherein, in Formulae 2-1 to 2-37,

Y1 is O, S, $C(Z_3)(Z_4)$, $N(Z_5)$, or $Si(Z_6)(Z_7)$, $Z_1$ to $Z_7$ are each independently selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, d2 is an integer of 0 to 2, d3 is an integer of 0 to 3, d4 is an integer of 0 to 4, d5 is an integer of 0 to 5, d6 is an integer of 0 to 6, d8 is an integer of 0 to 8, and

* and *' each indicate a binding site to a neighboring atom.

16. The cross-linkable arylamine-based compound of claim 8, wherein:

in Formula 1a, *—$(B)_p$—*' is selected from groups represented by Formulae 3-1 to 3-19:

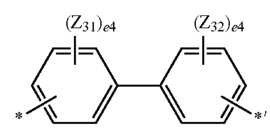

3-1

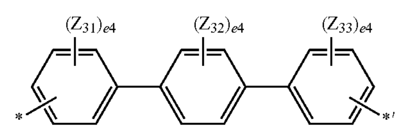

3-2

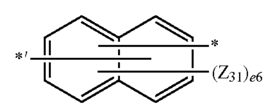

3-3

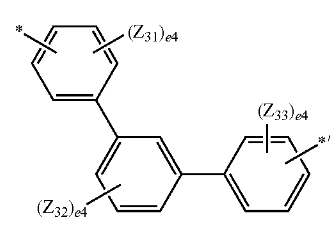

3-4

3-5
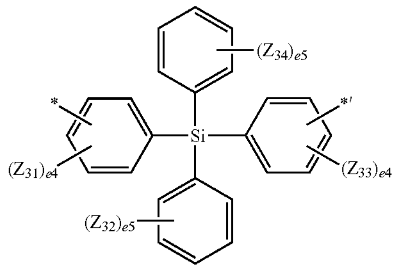
3-6
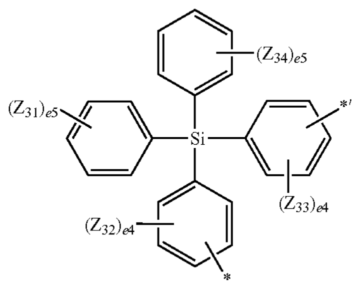
3-7
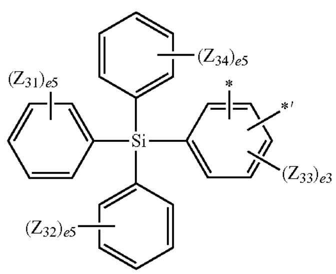
3-8
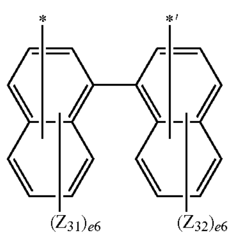
3-9
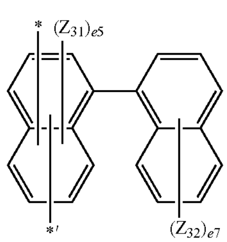
3-10
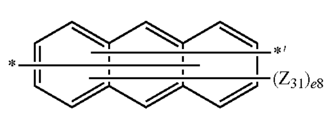
3-11
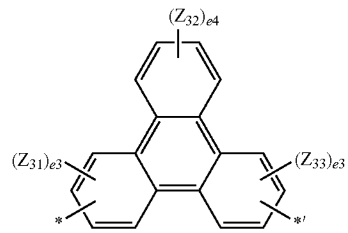
3-12
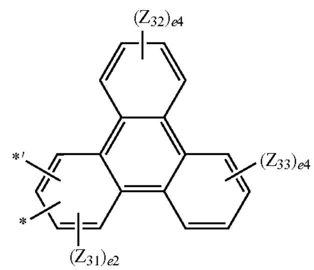
3-13
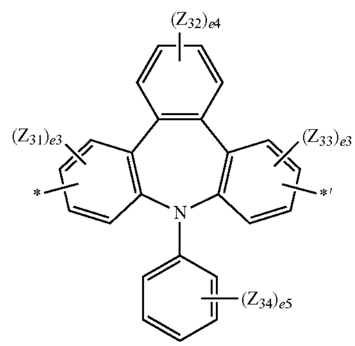
3-14
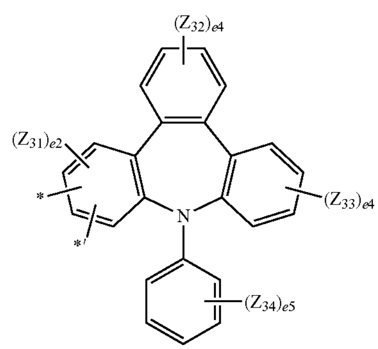
3-15
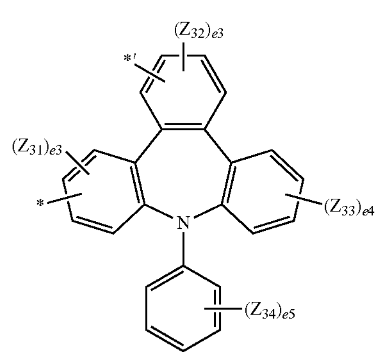

-continued 3-16

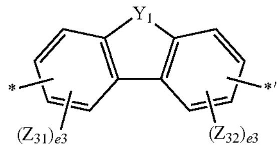

3-17

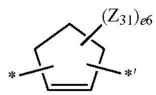

3-18

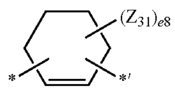

3-19

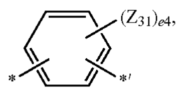

wherein, in Formulae 3-1 to 3-19,

Y1 is O, S, $C(Z_{35})(Z_{36})$, $N(Z_{35})$, or $Si(Z_{35})(Z_{36})$, $Z_{31}$ to $Z_{36}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopropenyl group, a cyclobutenyl group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a carbazolyl group, a dibenzofuranyl group, a dibenzothiophenyl group, a dibenzosilolyl group, a benzocarbazolyl group, a naphtho benzofuranyl group, a naphtho benzothiophenyl group, a naphthobenzosilolyl group, a dibenzocarbazolyl group, a dinaphthofuranyl group, a dinaphtho thiophenyl group, a dinaphtho silolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indeno pyrrolyl group, an indolopyrrolyl group, an indeno carbazolyl group, an indolocarbazolyl group, $—Si(Q_{31})(Q_{32})(Q_{33})$, and $—N(Q_{31})(Q_{32})$, $Q_{31}$ to $Q_{33}$ are each independently selected from:

a $C_1$-$C_{10}$ alkyl group, a $C_1$-$C_{10}$ alkoxy group, a phenyl group, a biphenyl group, a terphenyl group, and a naphthyl group; and a phenyl group, a biphenyl group, a terphenyl group, and a naphthyl group, each substituted with at least one selected from a $C_1$-$C_{10}$ alkyl group, a $C_1$-$C_{10}$ alkoxy group, and a phenyl group, e2 is an integer of 0 to 2, e3 is an integer of 0 to 3, e4 is an integer of 0 to 4, e5 is an integer of 0 to 5, e6 is an integer of 0 to 6, e7 is an integer of 0 to 7, and e8 is an integer of 0 to 8, and

* and *' each indicate a binding site to a neighboring atom.

17. The cross-linkable arylamine-based compound of claim 8, wherein:

in Formula 1-1, $Ar_{11}$ to $Ar_{13}$ are each independently selected from:

a $C_6$-$C_{60}$ aryl group; and a $C_6$-$C_{60}$ aryl group substituted with at least one selected from deuterium, —F, —Cl, —Br, —I, a hydroxyl group, a cyano group, a nitro group, an amidino group, a hydrazino group, a hydrazono group, a $C_2$-$C_{60}$ alkenyl group, a $C_2$-$C_{60}$ alkynyl group, and a $C_1$-$C_{60}$ alkoxy group, and in Formula 1b, $Ar_{11}$, $Ar_{13}$, $Ar_{21}$, and $Ar_{23}$ are each independently selected from:

a phenyl group, a biphenyl group, a terphenyl group, and a naphthyl group; and a phenyl group, a biphenyl group, a terphenyl group, and a naphthyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cross-linkable group, and $—N(Q_{31})(Q_{32})$.

18. The cross-linkable arylamine-based compound of claim 8, wherein:

in Formula 1b, $Ar_{12}$, $Ar_{14}$, $Ar_{22}$, and $Ar_{24}$ are each independently selected from:

a single bond;

a phenylene group and a naphthylene group; and a phenylene group and a naphthylene group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_1$-$C_{60}$ alkoxy group, $—N(Q_{31})(Q_{32})$, and a cross-linkable group.

19. The cross-linkable arylamine-based compound of claim 8, wherein:

in Formula 1b, $Ar_{11}$ and $Ar_{13}$ are identical to each other, $Ar_{21}$ and $Ar_{23}$ are identical to each other, $Ar_{12}$ and $Ar_{14}$ are identical to each other, and $Ar_{22}$ and $Ar_{24}$ are identical to each other.

20. The cross-linkable arylamine-based compound of claim 8, wherein:

in Formula 1b, substituents of $Ar_{11}$, $Ar_{13}$, $Ar_{21}$, and $Ar_{23}$ comprise a cross-linkable group.

21. The cross-linkable arylamine-based compound of claim 8, wherein:

in Formula 1b, substituents of at least two groups selected from $Ar_1$, $Ar_2$, $Ar_{12}$, $Ar_{14}$, $Ar_{22}$, and $Ar_{24}$ comprise a cross-linkable group, and $B_1$ and $B_2$ are each a single bond.

22. The cross-linkable arylamine-based compound of claim 8, wherein:

the cross-linkable group comprises at least one selected from a vinylene moiety, a styrene moiety, a cyclobutane moiety, and an epoxy moiety.

23. The cross-linkable arylamine-based compound of claim 8, wherein:

the cross-linkable group is selected from groups represented by Formulae 4-1 to 4-14:

4-1

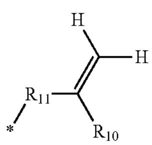

4-2

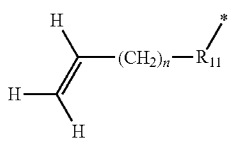

4-3

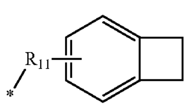

4-4

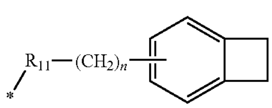

4-5

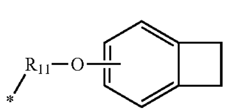

4-6

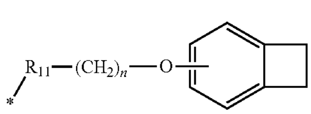

4-7

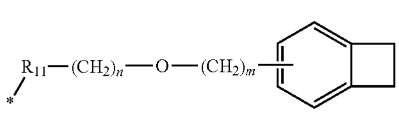

-continued 4-8

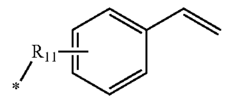

4-9

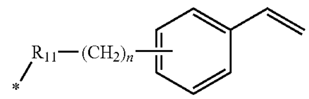

4-10

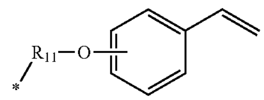

4-11

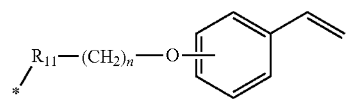

4-12

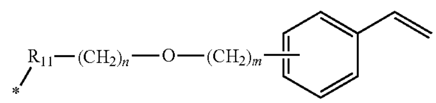

4-13

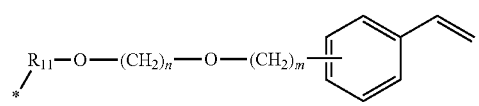

4-14

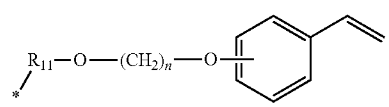

, wherein, in Formulae 4-1 to 4-14, $R_{10}$ is a hydrogen atom or a substituted or unsubstituted $C_1$-$C_{20}$ alkyl group, $R_{11}$ is selected from a single bond, a substituted or unsubstituted $C_1$-$C_{20}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, m and n are each independently an integer of 1 to 10, and

* indicates a binding site to a neighboring atom.

24. The cross-linkable arylamine-based compound of claim 8, wherein:

the cross-linkable arylamine-based compound is selected from Compounds 1 to 24, 29, and 38:

1
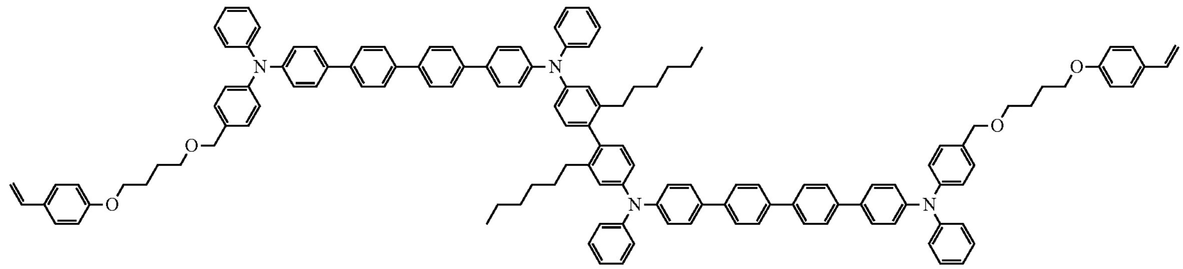
2
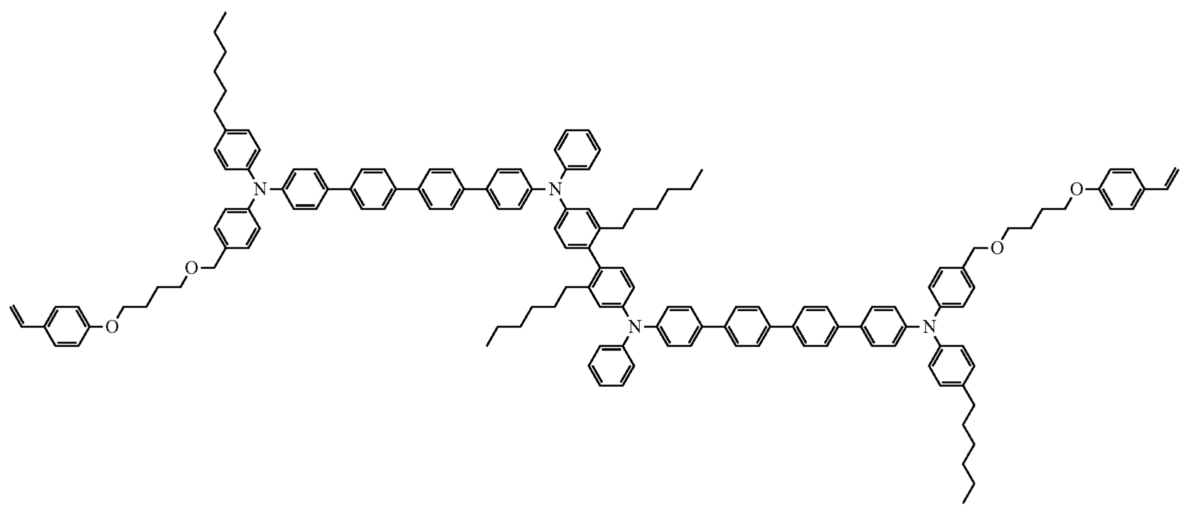
3
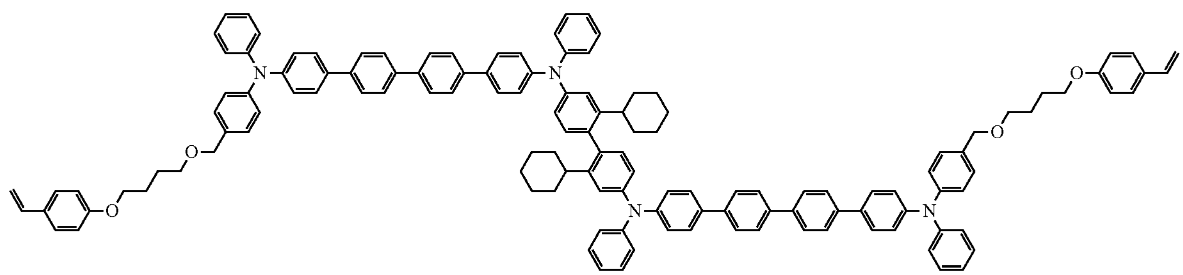
4
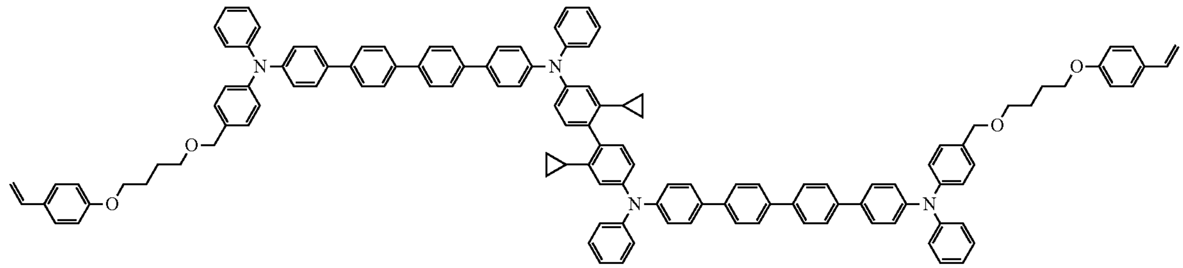

-continued
5
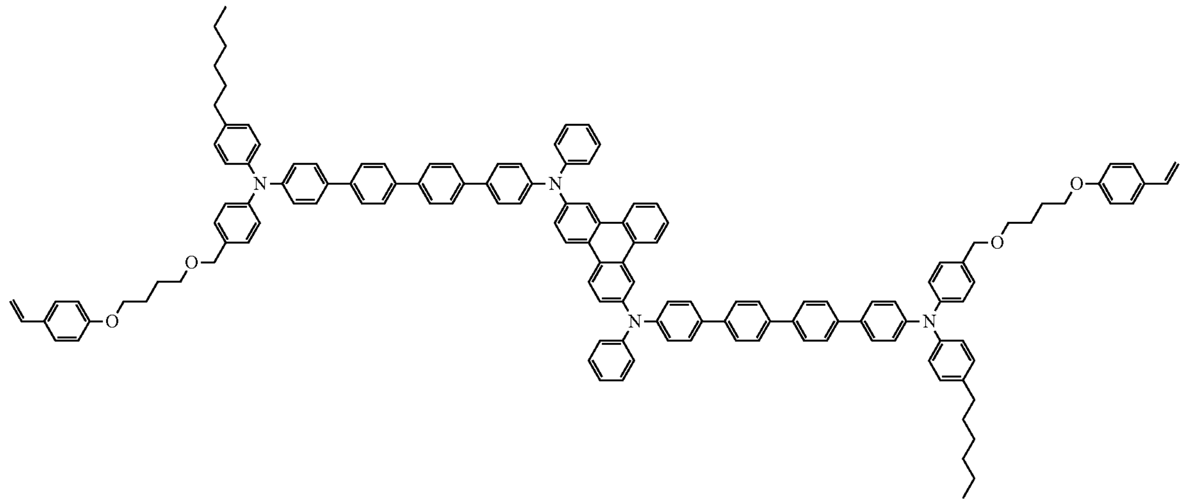
6
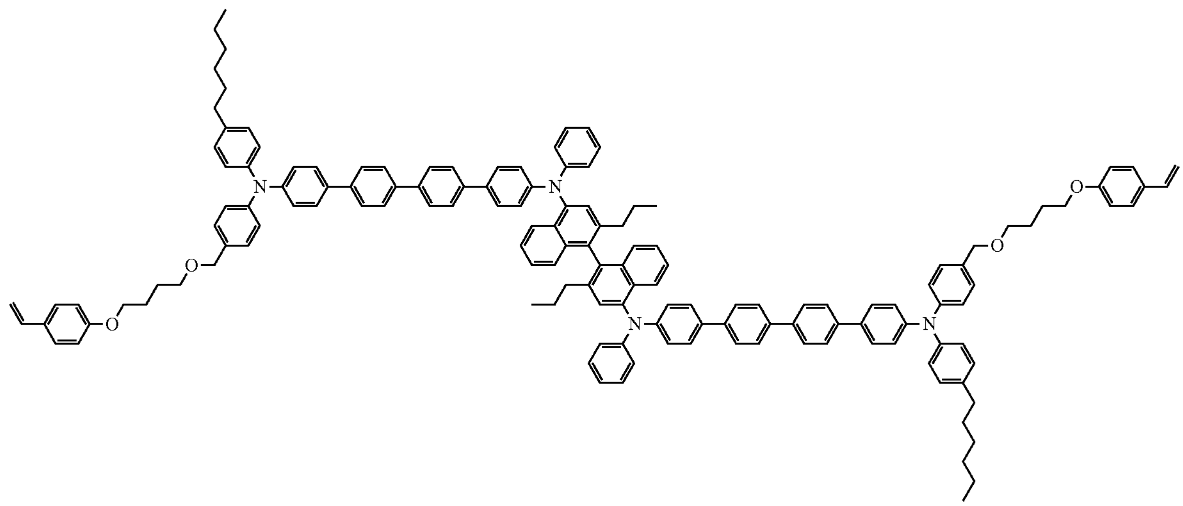
7
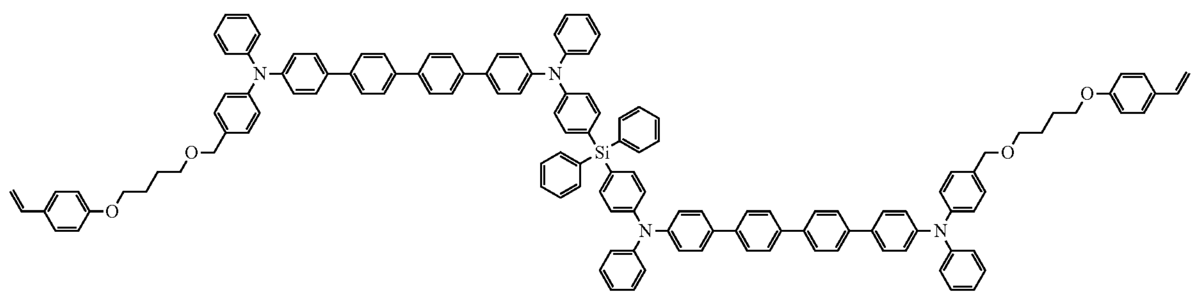
8
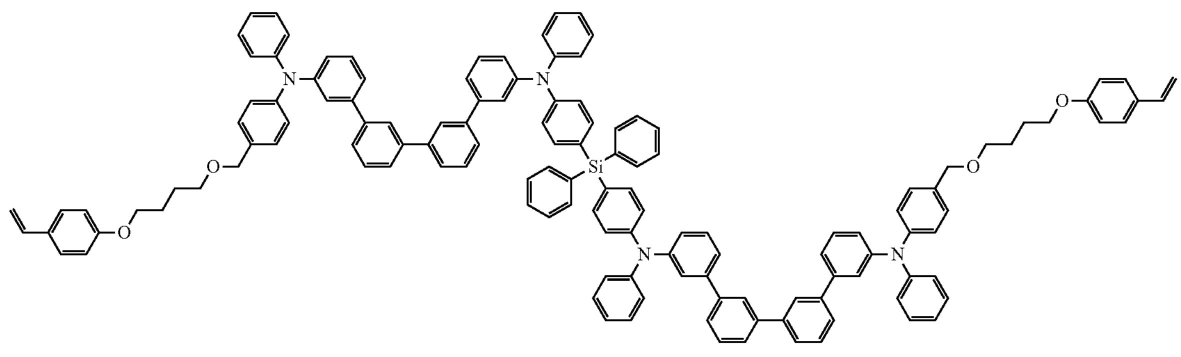

-continued
9
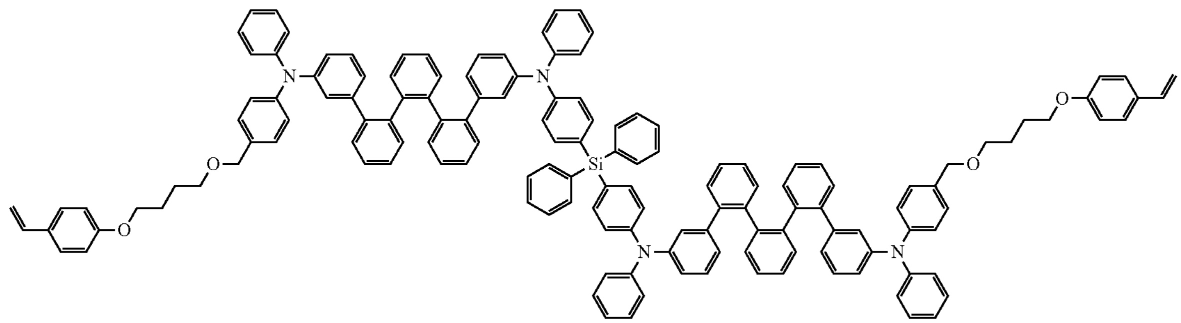
10
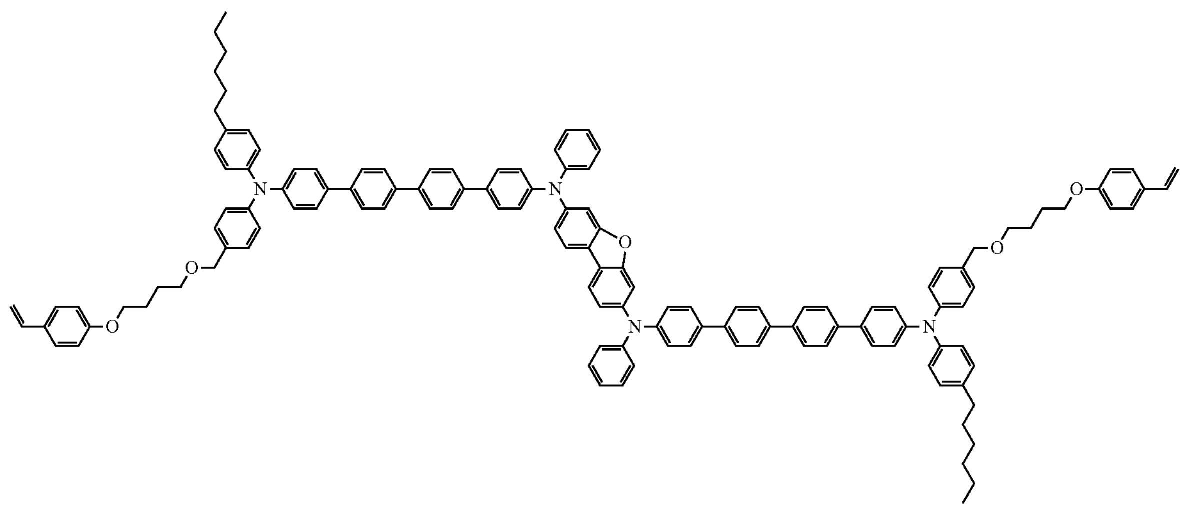
11
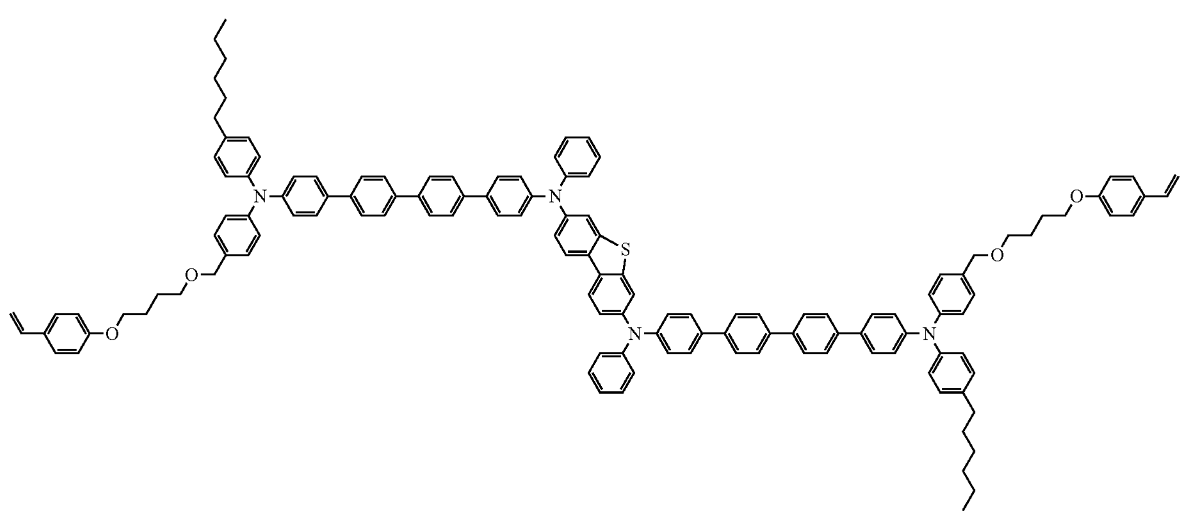

-continued
12
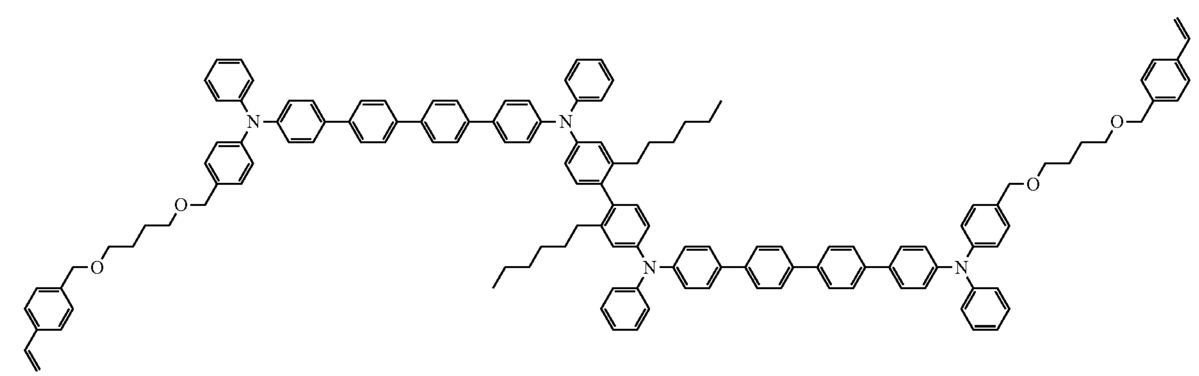
13
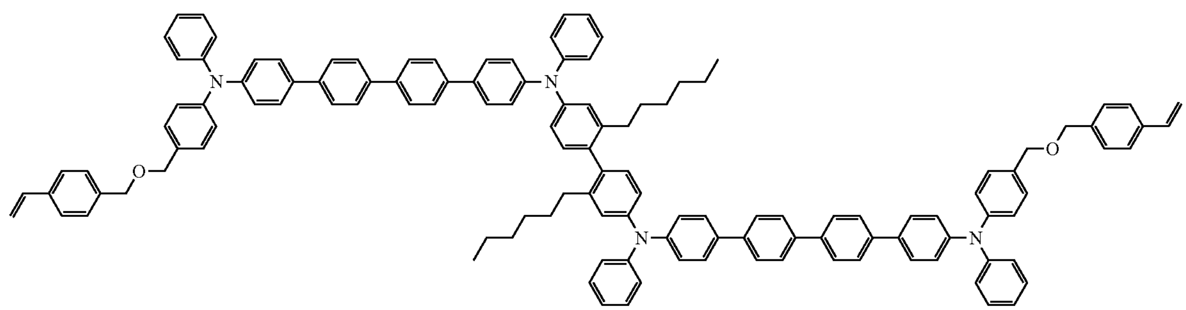
14
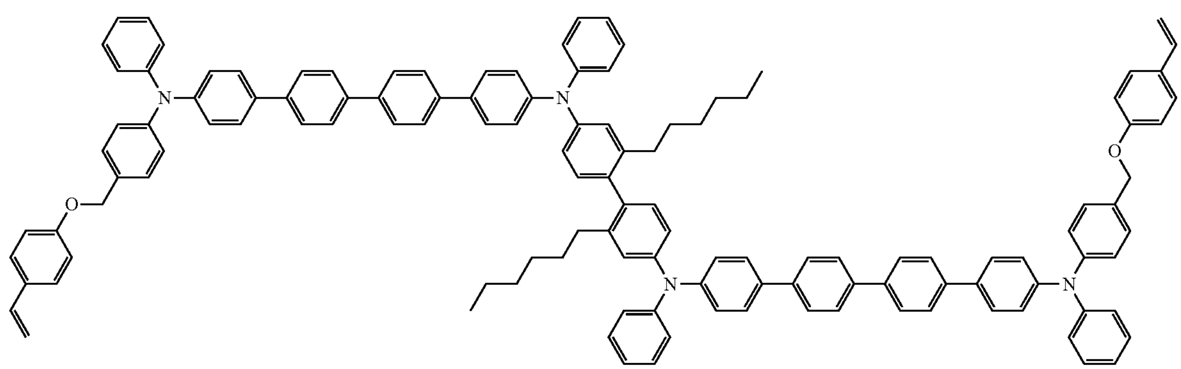
15
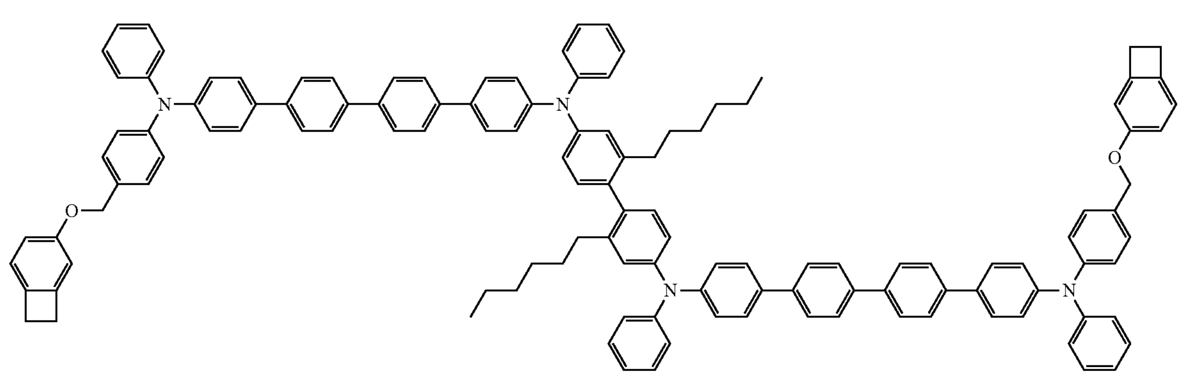

-continued
16
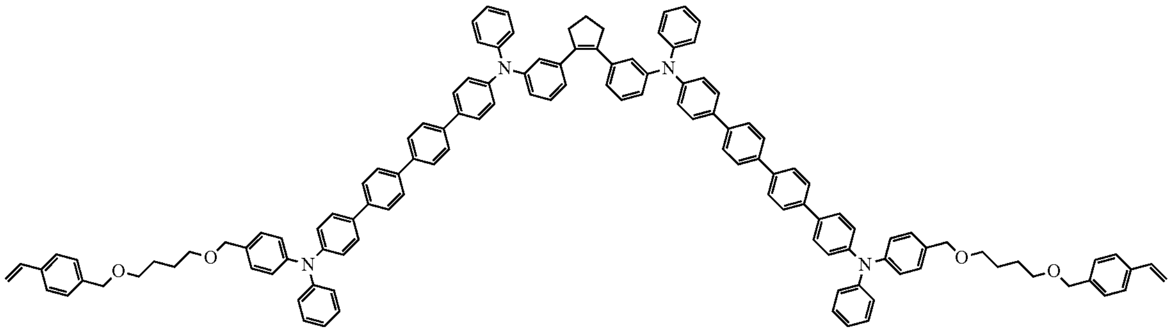
17
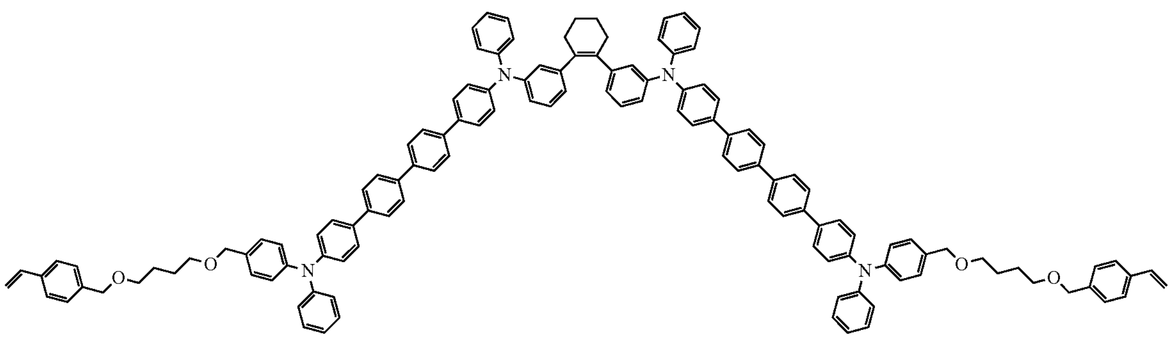
18
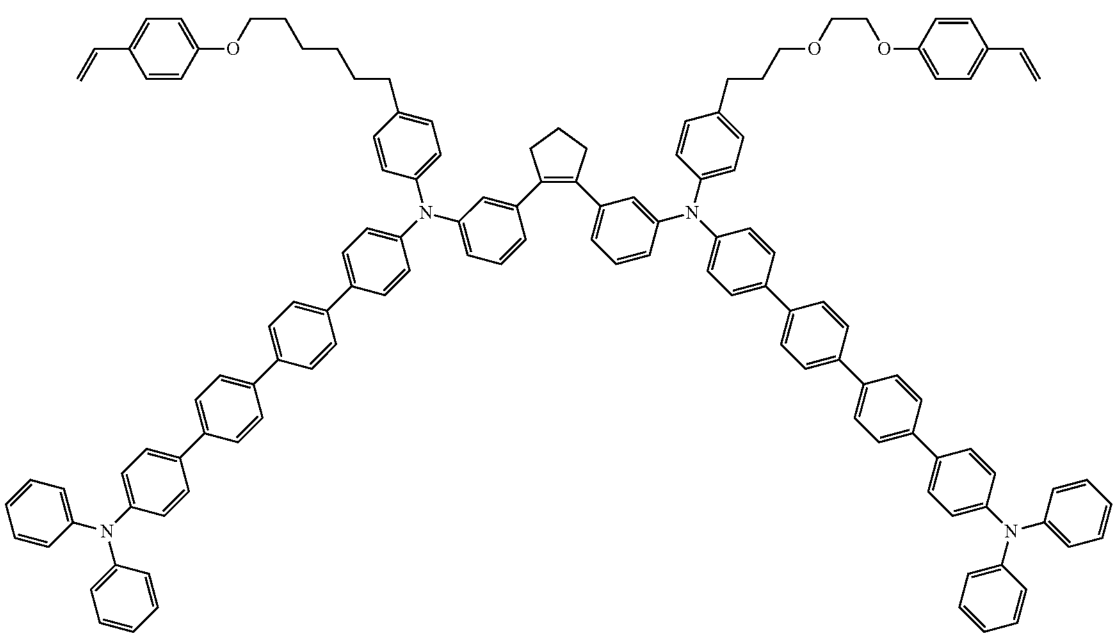

-continued
19
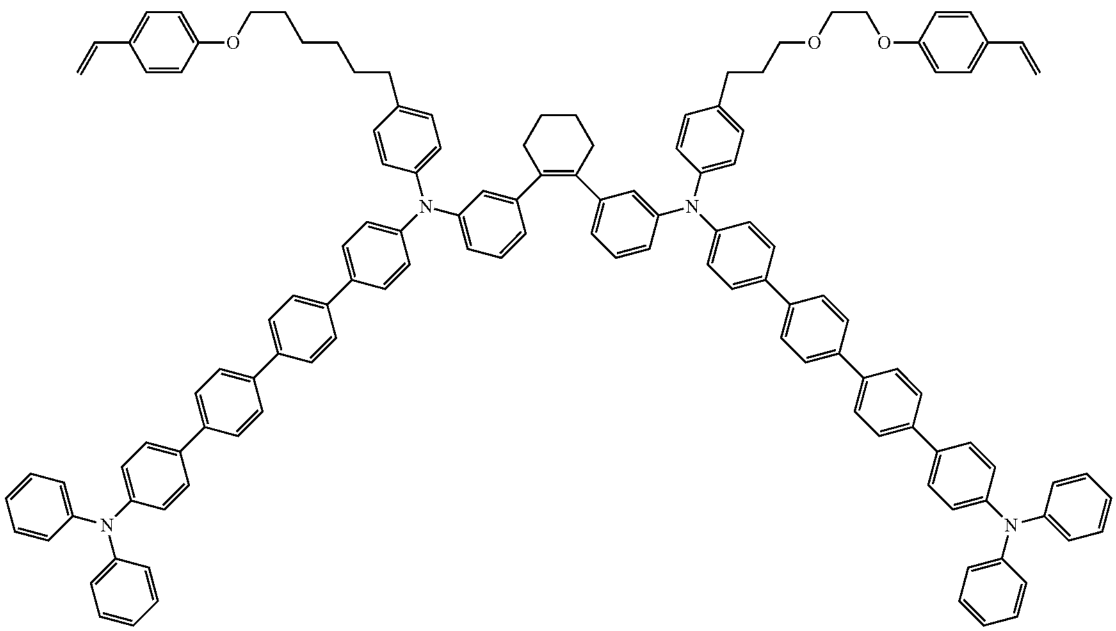
20
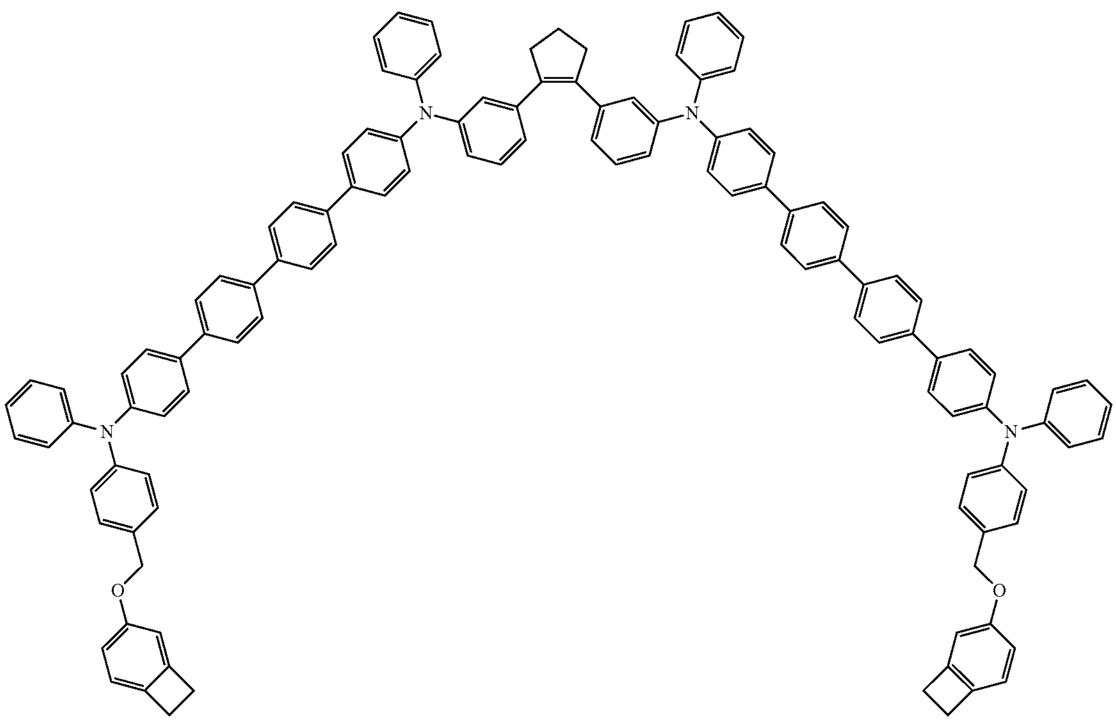

-continued
21
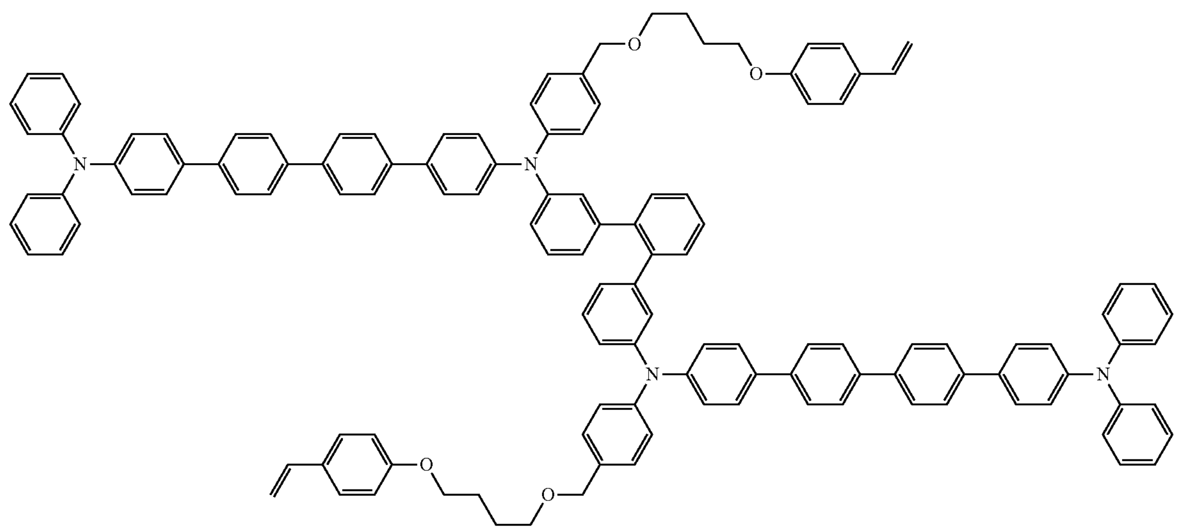
22
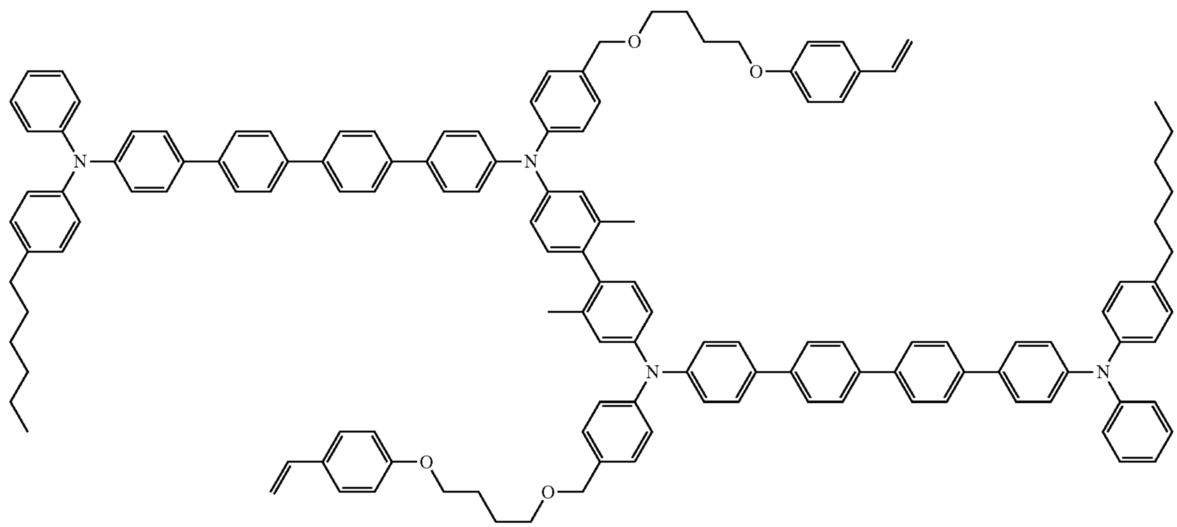
23
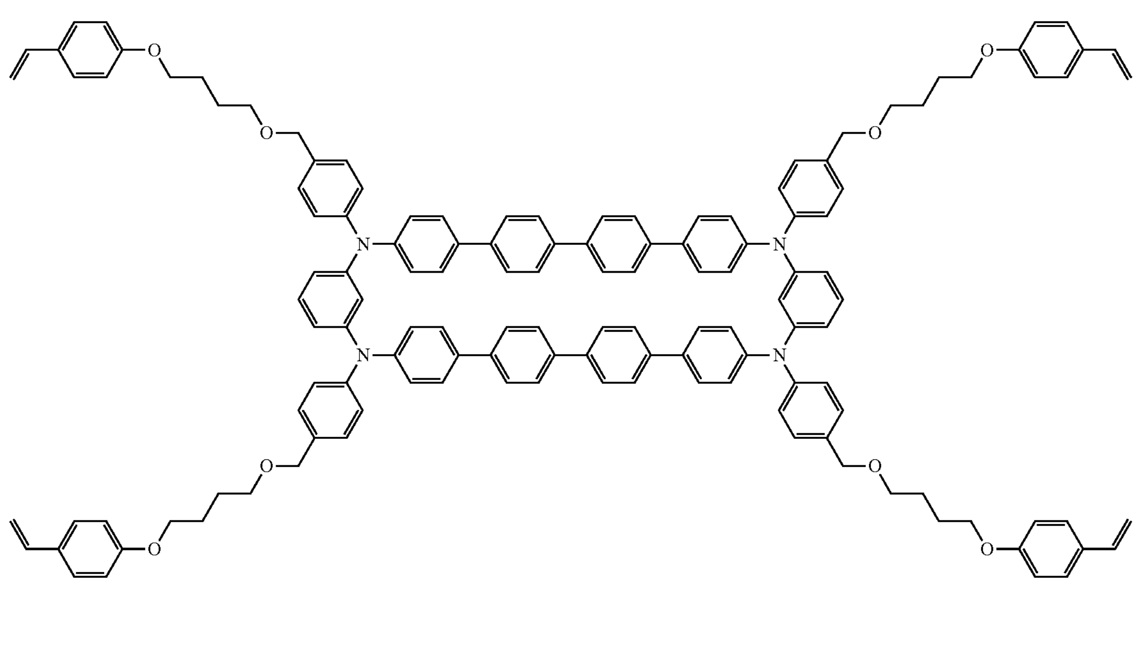

-continued
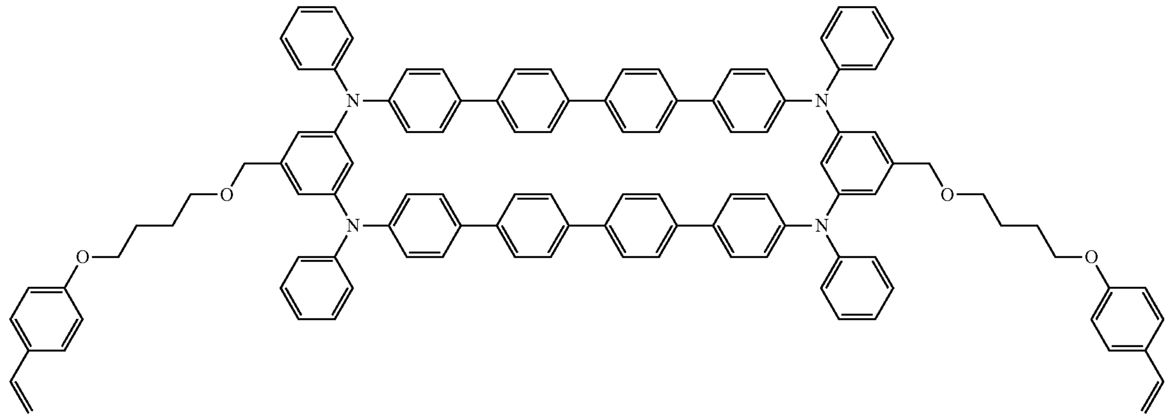
24
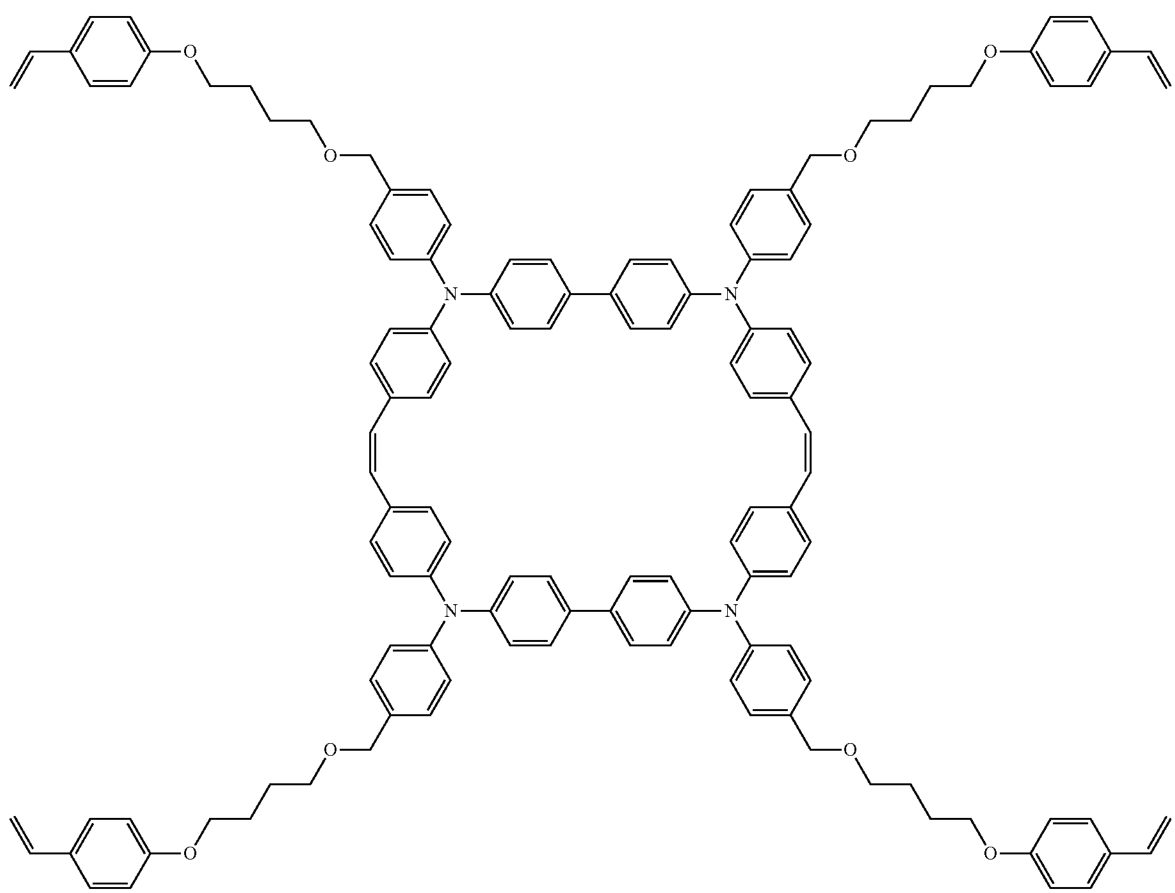
29

-continued

38

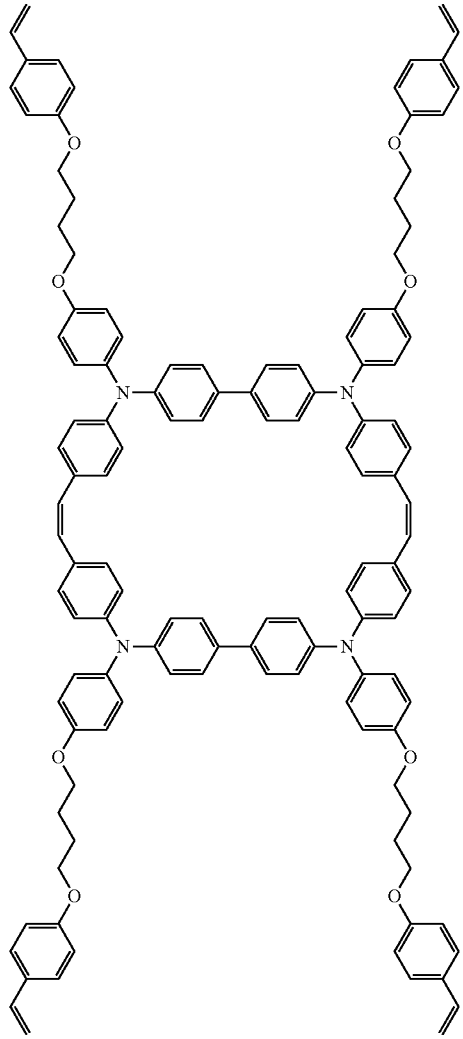

.

25. An arylamine-based polymer comprising a repeating unit represented by Formula 11 or formed by cross-linking a cross-linkable arylamine-based compound represented by Formula 1b:

<Formula 11>

$$*'-\!\!\left[A_{11}-(B)_p-A_{12}\right]\!\!-*''$$

<Formula 11-1>

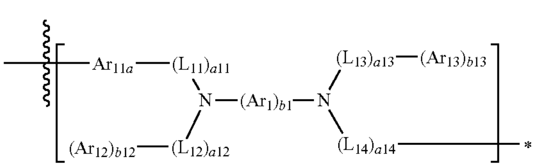

<Formula 11-2>

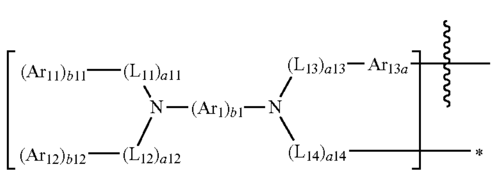

-continued

<Formula 1b>

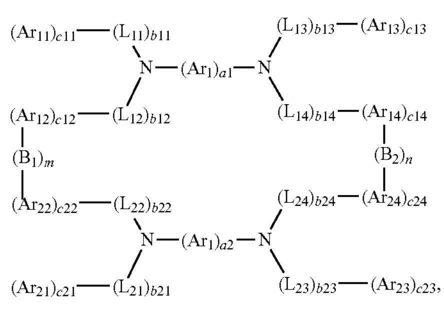

wherein, in Formula 11, $A_{11}$ and $A_{12}$ are each independently selected from groups represented by Formulae 11-1 and 11-2, wherein $A_{11}$ and $A_{12}$ are identical to or different from each other, in Formula 11-1 and 11-2, * indicates a binding site to $(B)_p$ in Formula 11, in Formulae 11, 11-1, and 11-2, *', *", and

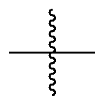

each indicate a binding site to a neighboring repeating unit, in Formulae 11-1 and 11-2, $Ar_{11a}$ and $Ar_{13a}$ are each a residue after cross-linking, and the repeating units are linked by a divalent cyclobutane group, in Formula 11, B is selected from a substituted or unsubstituted $C_5$-$C_{60}$ carbocyclic group, a substituted or unsubstituted $C_1$-$C_{60}$ heterocyclic group, and *'—Si($Q_{41}$)($Q_{42}$)-*", p is an integer of 1 to 10, in Formulae 11-1 and 11-2, $Ar_1$ is selected from a substituted or unsubstituted $C_5$-$C_{60}$ carbocyclic group and a substituted or unsubstituted $C_1$-$C_{60}$ heterocyclic group, b1 is an integer of four or more, and four or more $Ar_1$(s) are identical to or different from each other, in Formulae 11-1 and 11-2, $L_{11}$ to $L_{14}$ are each independently a substituted or unsubstituted $C_5$-$C_{60}$ carbocyclic group or a substituted or unsubstituted $C_1$-$C_{60}$ heterocyclic group, in Formulae 11-1 and 11-2, a11 to a14 are each independently 0, 1, 2, 3, or 4, wherein, when a11 is 0, *'-$(L_{11})_{a11}$-*" is a single bond, when a12 is 0, *'-$(L_{12})_{a12}$-*" is a single bond, when a13 is 0, *'-$(L_{13})_{a13}$-*" is a single bond, when a14 is 0, *'-$(L_{14})_{a14}$-*" is a single bond, when a11 is two or more, two or more $L_{11}$(s) are identical to or different from each other, when a12 is two or more, two or more $L_{12}$(s) are identical to or different from each other, when a13 is two or more, two or more $L_{13}$(s) are identical to or different from each other, and when a14 is two or more, two or more $L_{14}$(s) are identical to or different from each other, in Formulae 11-1 and 11-2, $Ar_{11}$ to $Ar_{13}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, in Formulae 11-1 and 11-2, b11 to b13 are each independently 1, 2, 3, 4, or 5, wherein, when b11 is two or more, two or more $Ar_{11}$(s) are identical to or different from each other, when b12 is two or more, two or more $Ar_{12}$(s) are identical to or different from each other, and when b13 is two or more, two or more $Ar_{13}$(s) are identical to or different from each other, in Formula 1b, $Ar_1$ and $Ar_2$ are each independently a substituted or unsubstituted $C_5$-$C_{60}$ carbocyclic group or a substituted or unsubstituted $C_1$-$C_{60}$ heterocyclic group, wherein $Ar_1$ and $Ar_2$ are identical to or different from each other, in Formula 1b, a1 and a2 are each independently an integer of 1 to 5, wherein, when a1 is two or more, two or more $Ar_1$(s) are identical to or different from each other, and when a2 is two or more, two or more $Ar_2$(s) are identical to or different from each other, in Formula 1b, $L_{11}$ to $L_{14}$ and $L_{21}$ to $L_{24}$ are each independently a substituted or unsubstituted $C_5$-$C_{60}$ carbocyclic group or a substituted or unsubstituted $C_1$-$C_{60}$ heterocyclic group, in Formula 1b, b11 to b14 and b21 to b24 are each independently an integer of 0 to 3, wherein, when b11 is 0, *-$(L_{11})_{b11}$-*' is a single bond, when b12 is 0, *-$(L_{12})_{b12}$*' is a single bond, when b13 is 0, *-$(L_{13})_{b13}$-*' is a single bond, when b14 is 0, *-$(L_{14})_{b14}$*' is a single bond, when b21 is 0, *-$(L_{21})_{b21}$-*' is a single bond, when b22 is 0, *-$(L_{22})_{b22}$*' is a single bond, when b23 is 0, *-$(L_{23})_{b23}$-*' is a single bond, when b24 is 0, *-$(L_{24})_{b24}$*' is a single bond, when b11 is two or more, two or more $L_{11}$(s) are identical to or different from each other, when b12 is two or more, two or more $L_{12}$(s) are identical to or different from each other, when b13 is two or more, two or more $L_{13}$(s) are identical to or different from each other, when b14 is two or more, two or more $L_{14}$(s) are identical to or different from each other, when b21 is two or more, two or more $L_{21}$(s) are identical to or different from each other, when b22 is two or more, two or more $L_{22}$(s) are identical to or different from each other, when b23 is two or more, two or more $L_{23}$(s) are identical to or different from each other, and when b24 is two or more, two or more $L_{24}$(s) are identical to or different from each other, in Formula 1b, $B_1$ and $B_2$ are each independently selected from a single bond, a substituted or unsubstituted $C_1$-$C_{20}$ alkylene group, a substituted or unsubstituted $C_2$-$C_{20}$ alkenylene group, and a substituted or unsubstituted $C_2$-$C_{20}$ alkynylene group, in Formula 1b, m and n are each independently an integer of 1 to 3, wherein, when m is two or more, two or more $B_1$(s) are identical to or different from each other, and when n is two or more, two or more $B_2$(s) are identical to or different from each other, in Formula 1b, $Ar_{11}$, $Ar_{13}$, $Ar_{21}$, and $Ar_{23}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, in Formula 1b, $Ar_{12}$, $Ar_{14}$, $Ar_{22}$, and $Ar_{24}$ are each independently selected from a single bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, in Formula 1b, c11 to c14 and c21 to c24 are each independently an integer of 1 to 5, wherein, when c11 is two or more, two or more $Ar_{11}$(s) are identical to or different from each other, when c12 is two or more, two or more $Ar_{12}$(s) are identical to or different from each other, when c13 is two or more, two or more $Ar_{13}$(s) are identical to or different from each other, when c14 is two or more, two or more $Ar_{14}$(s) are identical to or different from each other, when c21 is two or more, two or more $Ar_{21}$(s) are identical to or different from each other, when c22 is two or more, two or more $Ar_{22}$(s) are identical to or different from each other, when c23 is two or more, two or more $Ar_{23}$(s) are identical to or different from each other, and when c24 is two or more, two or more $Ar_{24}$(s) are identical to or different from each other, in Formula 1b, when $Ar_1$ and $Ar_2$ are each a biphenyl group or a terphenyl group, the group represented by $-(L_{12})_{b12}-(Ar_{12})_{c12}-(B_1)_m-(Ar_{22})_{c22}-(L_{22})_{b22}-$ and/or the group represented by $-(L_{14})_{b14}-(Ar_{14})_{c14}-(B_2)_n-(Ar_{24})_{c24}-(L_{24})_{b24}-$ is not a phenyl group and a naphthyl group, and when the group represented by $-(L_{12})_{b12}-(Ar_{12})_{c12}-(B_1)_m-(Ar_{22})_{c22}-(L_{22})_{b22}-$ and the group represented by $-(L_{14})_{b14}-(Ar_{14})_{c14}-(B_2)_n-(Ar_{24})_{c24}-(L_{24})_{b24}-$ are each a biphenyl group or a terphenyl group, $Ar_1$ and/or $Ar_2$ is not a phenyl group and a naphthyl group, in Formula 1b, at least one group selected from $Ar_1$, $Ar_2$, $Ar_{11}$ to $Ar_{14}$, and $Ar_{21}$ to $Ar_{24}$ is substituted with a cross-linkable group, and in Formula 1b, at least one selected from $Ar_1$, $Ar_2$, the group represented by $-(L_{12})_{b12}-(Ar_{12})_{c12}-(B_1)_m-(Ar_{22})_{c22}-(L_{22})_{b22}-$, and the group represented by $-(L_{14})_{b14}-(Ar_{14})_{c14}-(B_2)_n-(Ar_{24})_{c24}-(L_{24})_{b24}-$ is not a phenyl group.

26. The arylamine-based polymer of claim 25, wherein:

in Formulae 11-1 and 11-2, $Ar_{11a}$ and $Ar_{13a}$ are each independently selected from groups represented by Formulae 5-1 to 5-8:

5-1

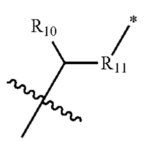

5-2

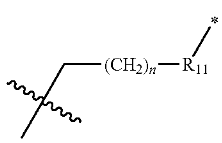

5-3

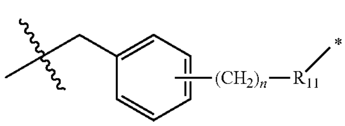

-continued 5-4

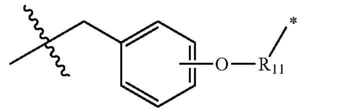

5-5

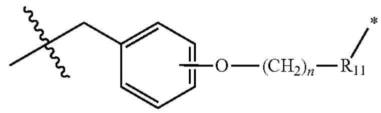

5-6

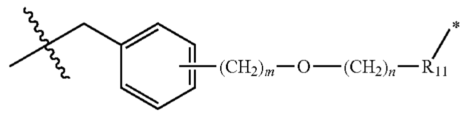

5-7

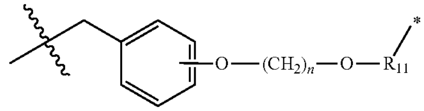

5-8

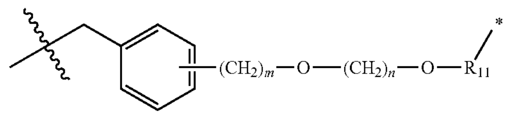

wherein, in Formulae 5-1 to 5-8, $R_{10}$ is a hydrogen atom or a substituted or unsubstituted $C_1$-$C_{20}$ alkyl group, $R_{11}$ is selected from a single bond, a substituted or unsubstituted $C_1$-$C_{20}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, m and n are each independently an integer of 1 to 10,

* indicates a binding site to a neighboring atom, and

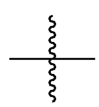

indicates a binding site to a neighboring repeating unit.

27. The arylamine-based polymer of claim 25, wherein:

in Formulae 11-1 and 11-2, $Ar_1$ is a benzene group, and b1 is 4 or 5.

* * * * *